(12) United States Patent
Miyazawa

(10) Patent No.: US 11,991,468 B2
(45) Date of Patent: May 21, 2024

(54) SOLID-STATE IMAGING APPARATUS, MANUFACTURING METHOD OF THE SAME, AND ELECTRONIC DEVICE

(71) Applicant: Sony Group Corporation, Tokyo (JP)

(72) Inventor: Shinji Miyazawa, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/861,048

(22) Filed: Jul. 8, 2022

(65) Prior Publication Data

US 2022/0345653 A1 Oct. 27, 2022

Related U.S. Application Data

(63) Continuation of application No. 16/383,277, filed on Apr. 12, 2019, now Pat. No. 11,438,540, which is a
(Continued)

(30) Foreign Application Priority Data

May 15, 2015 (JP) .................................. 2015-099719

(51) Int. Cl.
*H04N 25/767* (2023.01)
*H01L 21/3205* (2006.01)
(Continued)

(52) U.S. Cl.
CPC ....... *H04N 25/767* (2023.01); *H01L 21/3205* (2013.01); *H01L 21/768* (2013.01);
(Continued)

(58) Field of Classification Search
CPC .... H04N 5/2253; H04N 5/2257; H04N 5/341; H04N 5/374; H04N 5/3742;
(Continued)

(56) References Cited

U.S. PATENT DOCUMENTS 9,881,958 B2 1/2018 Endo et al.
10,026,771 B1 * 7/2018 Lee .................. H01L 27/14636
(Continued)

FOREIGN PATENT DOCUMENTS

CN 101937894 1/2011
CN 202307898 7/2012
(Continued)

OTHER PUBLICATIONS

Decision to Grant (with English translation) for Japan Patent Application No. 2021-000356, dated Jul. 12, 2022, 6 pages.
(Continued)

*Primary Examiner* — Chiawei Chen
(74) *Attorney, Agent, or Firm* — Sheridan Ross PC

(57) ABSTRACT

The present disclosure relates to a solid-state imaging apparatus, a manufacturing method of the same and an electronic device which can make an apparatus size further smaller. A solid-state imaging apparatus includes: a laminate of a first structure in which a pixel array unit in which pixels that perform photoelectric conversion are two-dimensionally arranged is formed and a second structure in which an output circuit unit configured to output pixel signals output from the pixels to an outside of an apparatus is formed. The output circuit unit, a first through hole via which penetrates through a semiconductor substrate constituting part of the second structure, and an external terminal for signal output connected to the outside of the apparatus are disposed below the pixel array unit of the first structure. The present disclosure can be applied, for example, to a solid-state imaging apparatus or the like.

20 Claims, 51 Drawing Sheets

Related U.S. Application Data continuation of application No. 15/572,573, filed as application No. PCT/JP2016/063534 on May 2, 2016, now Pat. No. 10,321,079.

(51) Int. Cl.

| | | |
|---|---|---|
| *H01L 21/768* | (2006.01) | |
| *H01L 23/48* | (2006.01) | |
| *H01L 27/092* | (2006.01) | |
| *H01L 27/146* | (2006.01) | |
| *H04N 23/54* | (2023.01) | |
| *H04N 23/57* | (2023.01) | |
| *H04N 25/40* | (2023.01) | |
| *H04N 25/76* | (2023.01) | |

(52) U.S. Cl.
CPC ...... *H01L 21/76898* (2013.01); *H01L 23/481* (2013.01); *H01L 27/0928* (2013.01); *H01L 27/14621* (2013.01); *H01L 27/14634* (2013.01); *H01L 27/14636* (2013.01); *H01L 27/1469* (2013.01); *H04N 23/54* (2023.01); *H04N 23/57* (2023.01); *H04N 25/40* (2023.01); *H04N 25/76* (2023.01); *H01L 27/14618* (2013.01); *H01L 27/1464* (2013.01); *H01L 27/14641* (2013.01); *H01L 27/14645* (2013.01); *H01L 2224/48463* (2013.01); *H01L 2224/73257* (2013.01)

(58) Field of Classification Search
CPC ...... H04N 25/767; H04N 23/54; H04N 23/57; H04N 25/40; H04N 25/76; H01L 21/3205; H01L 21/768; H01L 21/76898; H01L 2224/48463; H01L 2224/73257; H01L 23/481; H01L 27/0928; H01L 27/14618; H01L 27/14634; H01L 27/14636; H01L 27/1464; H01L 27/14641; H01L 27/14645; H01L 27/1469; H01L 27/14621; H01L 27/14605; H01L 27/14612; H01L 27/14627; H01L 27/1463; H01L 23/522; H01L 25/065; H01L 25/07; H01L 25/18; H01L 27/146

See application file for complete search history.

(56) References Cited

U.S. PATENT DOCUMENTS

| | | | |
|---|---|---|---|
| 10,269,854 B2 | 4/2019 | Yamashita | |
| 10,321,079 B2 | 6/2019 | Miyazawa | |
| 11,289,525 B2* | 3/2022 | Yamagishi | H01L 27/14636 |
| 11,862,655 B2* | 1/2024 | Togashi | H04N 25/77 |
| 2002/0020801 A1* | 2/2002 | Wadsworth | H01L 27/14634 250/208.1 |
| 2008/0079102 A1 | 4/2008 | Chen et al. | |
| 2010/0140732 A1 | 6/2010 | Eminoglu et al. | |
| 2010/0244136 A1* | 9/2010 | Takafuji | H01L 27/1266 257/351 |
| 2010/0320514 A1* | 12/2010 | Tredwell | H01L 27/14692 257/443 |
| 2011/0024774 A1* | 2/2011 | Tredwell | H01L 31/1896 257/E33.044 |
| 2011/0101539 A1* | 5/2011 | Kato | H01L 23/481 257/E21.597 |
| 2011/0136342 A1* | 6/2011 | Harada | H01L 23/481 257/E21.585 |
| 2011/0186951 A1* | 8/2011 | Pyo | H01L 23/481 257/E31.127 |
| 2012/0086095 A1 | 4/2012 | Nishiyama et al. | |
| 2012/0194719 A1 | 8/2012 | Churchwell et al. | |
| 2012/0217602 A1 | 8/2012 | Enomoto | |
| 2012/0293698 A1* | 11/2012 | Sukegawa | H01L 27/14643 257/774 |
| 2013/0032950 A1* | 2/2013 | Ware | H01L 25/0657 257/774 |
| 2013/0050227 A1* | 2/2013 | Petersen | H01L 23/057 257/66 |
| 2013/0068929 A1* | 3/2013 | Solhusvik | H01L 27/14634 250/208.1 |
| 2013/0093911 A1* | 4/2013 | Sul | H04N 25/621 348/222.1 |
| 2013/0113065 A1* | 5/2013 | Qian | H01L 27/1464 257/E21.597 |
| 2013/0119233 A1* | 5/2013 | Guezzi | H01L 27/14634 250/208.1 |
| 2013/0168792 A1* | 7/2013 | Haddad | H01L 27/1467 257/432 |
| 2013/0228936 A1 | 9/2013 | Han et al. | |
| 2013/0277789 A1 | 10/2013 | Chen et al. | |
| 2013/0334638 A1* | 12/2013 | Chen | H01L 27/14634 257/E31.127 |
| 2014/0042298 A1 | 2/2014 | Wan et al. | |
| 2014/0042299 A1 | 2/2014 | Wan et al. | |
| 2014/0077057 A1* | 3/2014 | Chao | H01L 27/14641 257/E31.084 |
| 2014/0077063 A1 | 3/2014 | Cho | |
| 2014/0138521 A1* | 5/2014 | Liu | H04N 5/378 257/432 |
| 2014/0193940 A1* | 7/2014 | Chen | H01L 27/14627 438/65 |
| 2014/0240566 A1* | 8/2014 | Shizukuishi | H01L 27/14605 438/66 |
| 2014/0263959 A1* | 9/2014 | Hsu | H01L 27/1469 250/206 |
| 2014/0334601 A1* | 11/2014 | Shizukuishi | A61B 5/0062 378/62 |
| 2015/0008555 A1 | 1/2015 | Mizuta | |
| 2015/0041781 A1* | 2/2015 | Hatano | H10K 30/81 438/82 |
| 2015/0156437 A1* | 6/2015 | Sul | H04N 25/621 348/308 |
| 2015/0270307 A1 | 9/2015 | Umebayashi et al. | |
| 2016/0005780 A1 | 1/2016 | Wang et al. | |
| 2016/0035772 A1 | 2/2016 | Yamashita et al. | |
| 2016/0172271 A1* | 6/2016 | Ware | G06F 3/0604 711/147 |
| 2016/0172402 A1* | 6/2016 | Katkar | H01L 27/1464 257/292 |
| 2016/0269657 A1 | 9/2016 | Nishihara | |
| 2016/0316159 A1* | 10/2016 | Yoneda | H01L 27/14692 |
| 2017/0148839 A1 | 5/2017 | Umebayashi et al. | |
| 2017/0162625 A1* | 6/2017 | Takayanagi | H01L 27/1469 |
| 2017/0171484 A1 | 6/2017 | Takemoto et al. | |
| 2017/0230598 A1 | 8/2017 | Takayanagi et al. | |
| 2017/0236860 A1* | 8/2017 | Yamamoto | H01L 27/1464 257/432 |
| 2018/0026069 A1 | 1/2018 | Wang et al. | |
| 2018/0342544 A1* | 11/2018 | Lee | H01L 27/14634 |
| 2019/0238777 A1 | 8/2019 | Miyazawa | |

FOREIGN PATENT DOCUMENTS

| | | |
|---|---|---|
| EP | 3084831 | 10/2016 |
| JP | H05-75019 | 3/1993 |
| JP | 2005-019573 | 1/2005 |
| JP | 2005228932 A | 8/2005 |
| JP | 2008-048313 | 2/2008 |
| JP | 2008-227335 | 9/2008 |
| JP | 2010-040621 | 2/2010 |
| JP | 2010-050149 | 3/2010 |
| JP | 2010-273757 | 12/2010 |
| JP | 2011-159958 | 8/2011 |
| JP | 2012-244100 | 12/2012 |
| JP | 2013-051674 | 3/2013 |
| JP | 2013-080838 | 5/2013 |
| JP | 2013-162077 | 8/2013 |
| JP | 2013-183197 | 9/2013 |
| JP | 2013-214646 | 10/2013 |

(56) References Cited

FOREIGN PATENT DOCUMENTS

| | | |
|---|---|---|
| JP | 2014-030170 | 2/2014 |
| JP | 2014-072294 | 4/2014 |
| JP | 2014-099582 | 5/2014 |
| JP | 2014123740 A | 7/2014 |
| JP | 2014-220370 | 11/2014 |
| WO | WO 2014/184710 | 11/2014 |

OTHER PUBLICATIONS

International Search Report and Written Opinion for International (PCT) Patent Application No. PCT/JP2016/063534, dated Aug. 2, 2016, 6 pages.
Official Action (with English translation) for China Patent Application No. 201680023750.8, dated Apr. 6, 2021, 26 pages.
Article 94(3) Communication for Europe Patent Application No. 16796295.0, dated May 14, 2021, 13 pages.
Official Action (with English translation) for Japan Patent Application No. 2021-000356, dated Jan. 25, 2022, 18 pages.
Official Action for U.S. Appl. No. 15/572,573, dated Jun. 22, 2018, 21 pages.
Notice of Allowance for U.S. Appl. No. 15/572,573, dated Jan. 22, 2019, 9 pages.
Official Action for U.S. Appl. No. 16/383,277, dated Dec. 20, 2019, 20 pages.
Official Action for U.S. Appl. No. 16/383,277, dated May 26, 2020, 20 pages.
Official Action for U.S. Appl. No. 16/383,277, dated Sep. 16, 2020, 17 pages.
Official Action for U.S. Appl. No. 16/383,277, dated Mar. 31, 2021, 18 pages.
Official Action for U.S. Appl. No. 16/383,277, dated Aug. 23, 2021, 19 pages.
Official Action for U.S. Appl. No. 16/383,277, dated Dec. 20, 2021, 21 pages.
Notice of Allowance for U.S. Appl. No. 16/383,277, dated Apr. 1, 2022, 10 pages.
Corrected Notice of Allowance for U.S. Appl. No. 16/383,277, dated Apr. 14, 2022, 2 pages.

\* cited by examiner

SOLID-STATE IMAGING APPARATUS, MANUFACTURING METHOD OF THE SAME, AND ELECTRONIC DEVICE

CROSS REFERENCE TO RELATED APPLICATIONS

This application is a continuation of U.S. patent application Ser. No. 16/383,277, filed Apr. 12, 2019, which is a continuation of U.S. patent application Ser. No. 15/572,573, filed Nov. 8, 2017, now U.S. Pat. No. 10,321,079, which is a national stage application under 35 U.S.C. 371 and claims the benefit of PCT Application No. PCT/JP2016/063534 having an international filing date of 2 May 2016, which designated the United States, which PCT application claimed the benefit of Japanese Patent Application No. 2015-099719 filed 15 May 2015, the disclosures of which are incorporated herein by reference in their entirety.

TECHNICAL FIELD

The present disclosure relates to a solid-state imaging apparatus, a manufacturing method of the same, and an electronic device, and, more particularly, to a solid-state imaging apparatus, a manufacturing method of the same and an electronic device which can make an apparatus size further smaller.

BACKGROUND ART

The size of a solid-state imaging apparatus such as a complementary metal oxide semiconductor (CMOS) image sensor becomes further smaller by proposal of a configuration in which a plurality of semiconductor substrates are laminated (see, for example, Patent Literature 1).

CITATION LIST

Patent Literature

Patent Literature 1: JP 2014-72294A

DISCLOSURE OF INVENTION

Technical Problem

As a solid-state imaging apparatus becomes smaller, because an area of a terminal portion from which an output signal is extracted becomes larger with respect to a horizontal size of the apparatus, it is difficult to make the apparatus smaller.

The present disclosure has been made in view of such circumstances and is directed to making the apparatus size further smaller.

Solution to Problem

A solid-state imaging apparatus according to a first aspect of the present disclosure includes: a laminate of a first structure in which a pixel array unit in which pixels that perform photoelectric conversion are two-dimensionally arranged is formed, a glass substrate located above the first structure, and a second structure in which an input circuit unit configured to allow a predetermined signal to be input from an outside of an apparatus, an output circuit unit configured to output pixel signals output from the pixels to the outside of the apparatus, and a signal processing circuit are formed, the second structure being located below the first structure. An output unit and an input unit are disposed below the pixel array unit of the first structure, the output unit including the output circuit unit, a first through hole via which is connected to the output circuit unit and which penetrates through a semiconductor substrate constituting part of the second structure, and an external terminal for signal output which connects the output circuit unit to the outside of the apparatus via the first through hole via, the input unit including the input circuit unit, a second through hole via which is connected to the input circuit unit and which penetrates through the semiconductor substrate, and an external terminal for signal input which connects the input circuit unit to the outside of the apparatus via the second through hole via.

According to the first aspect of the present disclosure, a first structure in which a pixel array unit in which pixels that perform photoelectric conversion are two-dimensionally arranged is formed, a glass substrate located above the first structure, and a second structure in which an input circuit unit configured to allow a predetermined signal to be input from an outside of an apparatus, an output circuit unit configured to output pixel signals output from the pixels to the outside of the apparatus, and a signal processing circuit are formed are laminated and included, the second structure being located below the first structure. An output unit and an input unit are disposed below the pixel array unit of the first structure, the output unit including the output circuit unit, a first through hole via which is connected to the output circuit unit and which penetrates through a semiconductor substrate constituting part of the second structure, and an external terminal for signal output which connects the output circuit unit to the outside of the apparatus via the first through hole via, the input unit including the input circuit unit, a second through hole via which is connected to the input circuit unit and which penetrates through the semiconductor substrate, and an external terminal for signal input which connects the input circuit unit to the outside of the apparatus via the second through hole via.

A solid-state imaging apparatus according to a second aspect of the present disclosure includes: a laminate of a first structure in which a pixel array unit in which pixels that perform photoelectric conversion are two-dimensionally arranged is formed and a second structure in which an output circuit unit configured to output pixel signals output from the pixels to an outside of an apparatus is formed. The output circuit unit, a first through hole via which penetrates through a semiconductor substrate constituting part of the second structure, and an external terminal for signal output connected to the outside of the apparatus are disposed below the pixel array unit of the first structure. The output circuit unit is connected to the external terminal for signal output via the first through hole via.

A manufacturing method of a solid-state imaging apparatus according to a third aspect of the present disclosure includes: pasting a first structure in which a pixel array unit in which pixels that perform photoelectric conversion are two-dimensionally arranged is formed and a second structure in which an output circuit unit configured to output pixel signals output from the pixels to an outside of an apparatus is formed below the pixel array unit, so that wiring layers face each other; forming a through hole via which penetrates through a semiconductor substrate constituting part of the second structure; and forming an external terminal for signal output which is electrically connected to the output circuit unit via the through hole via and which is connected to the outside of the apparatus, at a position below the pixel array unit of the first structure.

According to the third aspect of the present disclosure, a first structure in which a pixel array unit in which pixels that perform photoelectric conversion are two-dimensionally arranged is formed and a second structure in which an output circuit unit configured to output pixel signals output from the pixels to an outside of an apparatus is formed below the pixel array unit are pasted, so that wiring layers face each other. A through hole via which penetrates through a semiconductor substrate constituting part of the second structure is formed. An external terminal for signal output which is electrically connected to the output circuit unit via the through hole via and which is connected to the outside of the apparatus is formed at a position below the pixel array unit of the first structure.

An electronic device according to a fourth aspect of the present disclosure includes: a solid-state imaging apparatus including a laminate of a first structure in which a pixel array unit in which pixels that perform photoelectric conversion are two-dimensionally arranged is formed, and a second structure in which an output circuit unit configured to output pixel signals output from the pixels to an outside of an apparatus is formed. The output circuit unit, a through hole via which penetrates through a semiconductor substrate constituting part of the second structure, and an external terminal for signal output connected to the outside of the apparatus are disposed below the pixel array unit of the first structure. The output circuit unit is connected to the external terminal for signal output via the through hole via.

According to the second and fourth aspects of the present disclosure, a first structure in which a pixel array unit in which pixels that perform photoelectric conversion are two-dimensionally arranged is formed, and a second structure in which an output circuit unit configured to output pixel signals output from the pixels to an outside of an apparatus is formed are laminated and included. The output circuit unit, a through hole via which penetrates through a semiconductor substrate constituting part of the second structure, and an external terminal for signal output connected to the outside of the apparatus are disposed below the pixel array unit of the first structure. The output circuit unit is connected to the external terminal for signal output via the through hole via.

The solid state imaging apparatus and the electronic device may be an independent apparatus or may be a module placed in another apparatus.

Advantageous Effects of Invention

According to first to fourth aspects of the present disclosure, it is possible to make an apparatus size further smaller.

The effects described here are not necessarily limited and also may be any effect described in the present disclosure.

MODES FOR CARRYING OUT THE INVENTION

Figure 1:
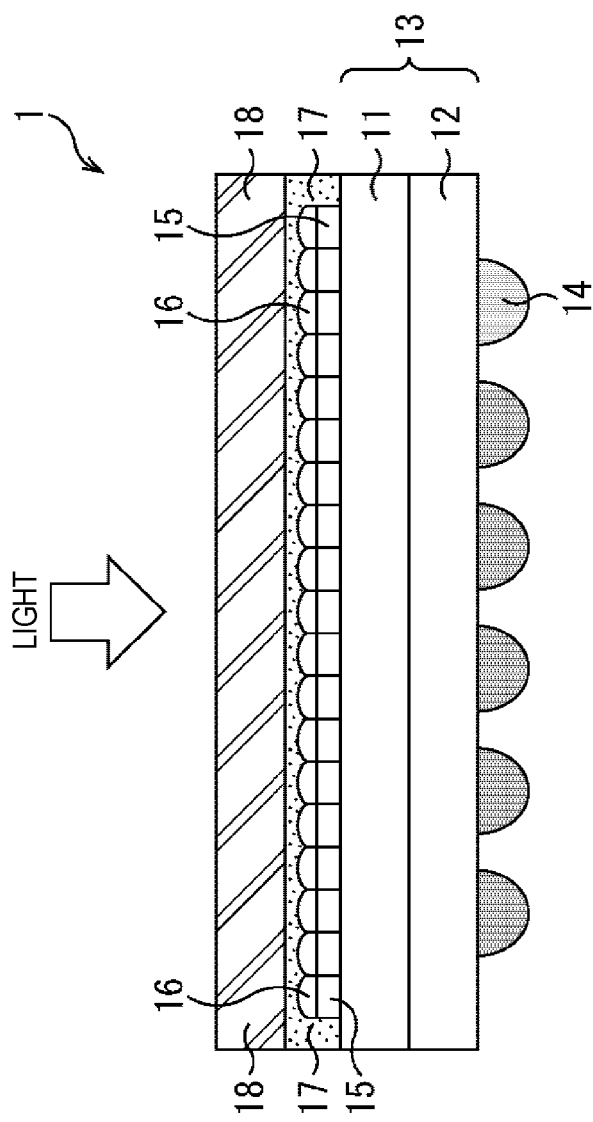
FIG. 1 is a diagram illustrating a schematic configuration of a solid-state imaging apparatus in which the present technology is employed.

Embodiments for implementing the present technology (hereinafter, referred to as embodiments) will be described below. Note that description will be provided in the following order.

1. Schematic structure of solid-state imaging apparatus
2. System configuration of solid-state imaging apparatus
3. Circuit arrangement configuration example of pixel
4. Configuration examples of input circuit unit and output circuit unit
5. Circuit arrangement configuration example of solid-state imaging apparatus
6. Cross-sectional structure of solid-state imaging apparatus
7. Circuit arrangement of solid-state imaging apparatus in the case where other upper and lower wiring connection structures are used
8. Example of comparison with other solid-state imaging apparatuses
9. Other circuit arrangement configuration examples of solid-state imaging apparatus
10. Detailed structure of solid-state imaging apparatus
11. Manufacturing method
12. Further modified examples
13. Example of three-layer laminate structure
14. Example of application to electronic device
15. Usage example of image sensor 1. Schematic Structure of Solid-State Imaging Apparatus FIG. 1 illustrates a schematic configuration of a solid-state imaging apparatus as a semiconductor apparatus in which the present technology is employed.

A solid-state imaging apparatus 1 illustrated in FIG. 1 converts light or an electromagnetic wave incident on the apparatus in the direction of an arrow in FIG. 1 into an electrical signal. In the following description, in the present disclosure, description will be provided using an example of an apparatus which converts light which is a target to be converted into an electrical signal, into an electrical signal for convenience sake.

The solid-state imaging apparatus 1 includes a laminate structure 13 in which a first structure 11 and a second structure 12 are laminated, an external terminal 14, and a protective substrate 18 formed on an upper side of the first structure 11. Note that, in the following description, for convenience sake, a side of an incidence plane of the apparatus on which light is incident will be referred to as the upper side, a side of the other plane of the apparatus which faces the incidence plane will be referred to as a lower side, the first structure 11 will be referred to as an upper structure 11, and the second structure 12 will be referred to as a lower structure 12.

As will be described later, the solid-state imaging apparatus 1 is formed by pasting a semiconductor substrate (wafer) constituting part of the upper structure 11, a semiconductor substrate (wafer) constituting part of the lower structure 12 and the protective substrate 18 at a wafer level, and, then, dividing this into individual pieces of solid-state imaging apparatuses 1.

The upper structure 11 before being divided into pieces is a structure in which a pixel for converting incident light into an electrical signal is formed on the semiconductor substrate (wafer). The pixel includes, for example, a photodiode (PD)

for photoelectric conversion, and a plurality of pixel transistors which control photoelectric conversion operation and operation of reading out an electrical signal subjected to photoelectric conversion. There is a case where the upper structure 11 included in the solid-state imaging apparatus 1 which is divided into pieces is referred to as an upper chip, an image sensor substrate or an image sensor chip.

A pixel transistor provided at the solid-state imaging apparatus 1 is preferably, for example, a MOS transistor.

On an upper face of the upper structure 11, for example, a color filter 15 of R (red), G (green) or B (blue) and an on-chip lens 16 are formed. On an upper side of the on-chip lens 16, the protective substrate 18 for protecting structural objects of the solid-state imaging apparatus 1, particularly, the on-chip lens 16 and the color filter 15 is disposed. The protective substrate 18 is, for example, a transparent glass substrate. The protective substrate 18 is more effective in protecting the on-chip lens 16 if hardness of the protective substrate 18 is higher than hardness of the on-chip lens 16.

The lower structure 12 before being divided into pieces is a structure in which a semiconductor circuit including a transistor and a wiring is formed on a semiconductor substrate (wafer). There is a case where the lower structure 12 included in the solid-state imaging apparatus 1 after being divided into pieces is also referred to as a lower chip, a signal processing substrate or a signal processing chip. A plurality of external terminals 14 for electrically connecting to a wiring outside the apparatus, which is not illustrated, are formed in the lower structure 12. The external terminal 14 is, for example, a solder ball.

The solid-state imaging apparatus 1 constitutes a cavity less structure in which the protective substrate 18 is fixed on the upper side of the upper structure 11 or an upper side of the on-chip lens 16 via a glass seal resin 17 disposed on the on-chip lens 16. Because hardness of the glass seal resin 17 is lower than hardness of the protective substrate 18, compared to a case where a seal resin does not exist, the glass seal resin 17 can make an effect of alleviating transmission of stress applied to the protective substrate 18 from the outside of the solid-state imaging apparatus 1 to the inside of the apparatus.

Note that, as a structure different from the cavity less structure, the solid-state imaging apparatus 1 may be configured such that a columnar or wall-shaped structure is formed on the upper face of the upper structure 11, and a cavity structure fixed at the above-described columnar or wall-shaped structure is formed so that the protective substrate 18 is supported above the on-chip lens 16 with a void in-between.

2. System Configuration of Solid-State Imaging Apparatus

Figure 2:
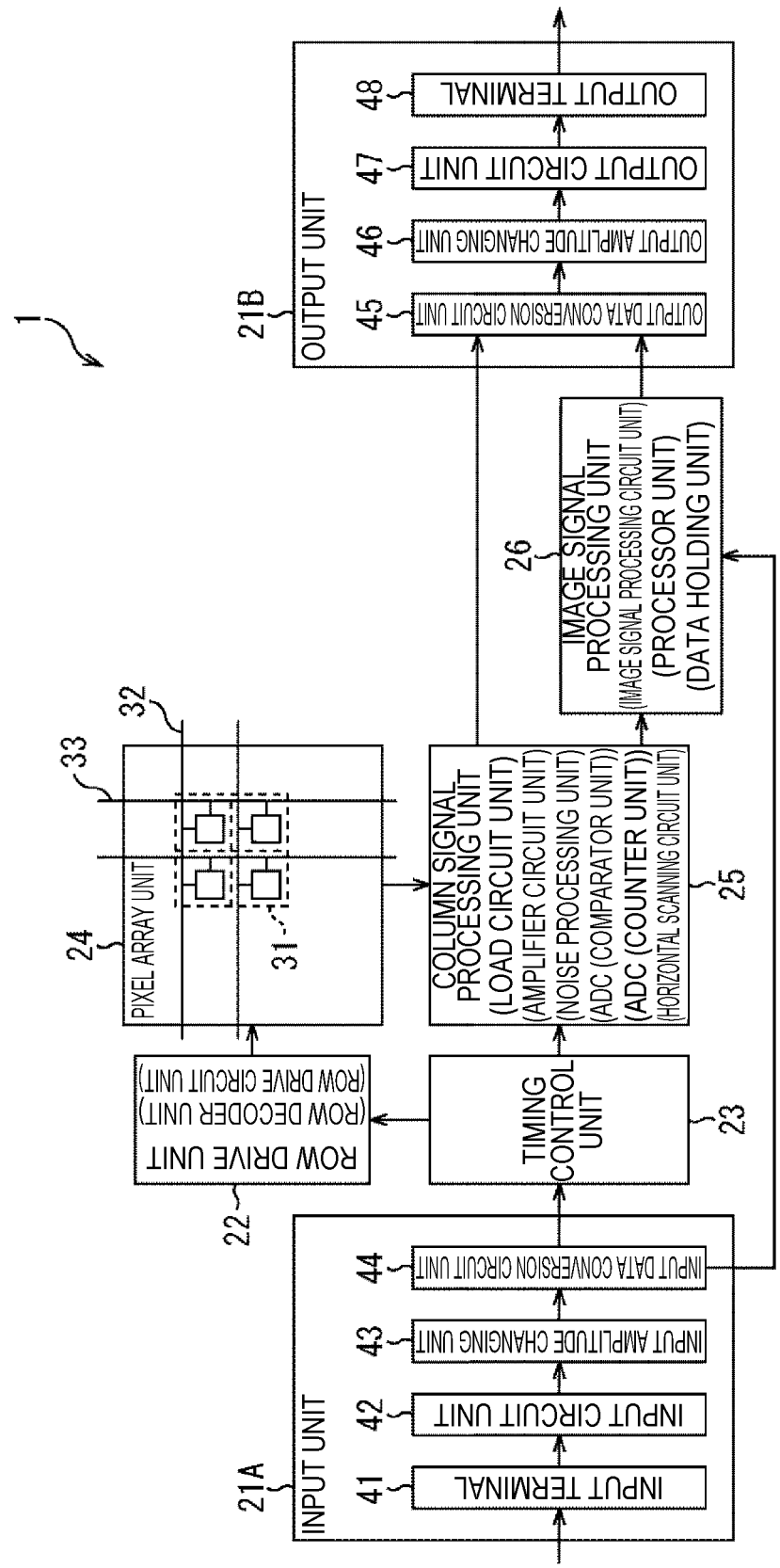
FIG. 2 is a block diagram illustrating a system configuration example of the solid-state imaging apparatus.

FIG. 2 is a block diagram illustrating a system configuration example of the solid-state imaging apparatus 1.

The solid-state imaging apparatus 1 in FIG. 2 includes a pixel array unit 24 in which a plurality of pixels 31 having photoelectric converting units (PDs) are arranged in a row direction and in a column direction.

The pixel array unit 24 includes a vertical signal line (column readout line) 33 for reading out a signal generated as a result of photoelectric conversion from a row drive signal line 32 for driving the pixels 31 for each row and a plurality of pixels 31 driven for each row. As illustrated in FIG. 2, a plurality of pixels 31 arranged in a row direction are connected to one row drive signal line 32. A plurality of pixels 31 arranged in a column direction are connected to one vertical signal line 33.

The solid-state imaging apparatus 1 further includes a row drive unit 22 and a column signal processing unit 25.

The row drive unit 22 includes, for example, a row address control unit which determines a position of a row in which pixels are driven, in other words, a row decoder unit, and a row drive circuit unit for causing a signal for driving the pixel 31 to be generated.

The column signal processing unit 25 includes, for example, a load circuit unit which is connected to the vertical signal line 33 and which forms a source follower circuit with the pixel 31. Further, the column signal processing unit 25 may include an amplifier circuit unit which amplifies a signal read out from the pixel 31 via the vertical signal line 33. Still further, the column signal processing unit 25 may further include a noise processing unit for removing a noise level of a system from a signal read out from the pixel 31 as a result of photoelectric conversion.

The column signal processing unit 25 includes an analog digital converter (ADC) for converting a signal read out from the pixel 31 or an analog signal subjected to the above-described noise processing into a digital signal. The ADC includes a comparator unit for comparing an analog signal to be converted with a reference sweep signal to be compared with this and a counter unit which measures time until a comparison result at the comparator unit is inverted. The column signal processing unit 25 may further include a horizontal scanning circuit unit which controls scanning of a readout column.

The solid-state imaging apparatus 1 further includes a timing control unit 23. The timing control unit 23 supplies a signal for controlling a timing to the row drive unit 22 and the column signal processing unit 25 on the basis of a reference clock signal or a timing control signal input to the apparatus. In the following description, in the present disclosure, there is a case where all or part of the row drive unit 22, the column signal processing unit 25 and the timing control unit 23 is simply referred to as a pixel peripheral circuit unit, a peripheral circuit unit or a control circuit unit.

The solid-state imaging apparatus 1 further includes an image signal processing unit 26. The image signal processing unit 26 is a circuit which performs various kinds of signal processing on data obtained as a result of photoelectric conversion, in other words, data obtained as a result of imaging operation at the solid-state imaging apparatus 1. The image signal processing unit 26 is, for example, configured to include an image signal processing circuit unit and a data holding unit. The image signal processing unit 26 may further include a processor unit.

Examples of signal processing executed at the image signal processing unit 26 can include tone curve correction processing of providing a number of tones in the case where AD converted imaged data is data obtained by imaging a dark subject, and reducing tones in the case where the imaged data is data obtained by imaging a bright subject. In this case, it is preferable to store characteristic data of the tone curve as to which tone curve is used as a basis of correction of a tone of the imaged data in advance in the data holding unit of the image signal processing unit 26.

The solid-state imaging apparatus 1 further includes an input unit 21A. The input unit 21A inputs, for example, the above-described reference clock signal, a timing control signal such as a vertical synchronization signal and a horizontal synchronization signal, characteristic data, or the like, to be stored in the data holding unit of the image signal processing unit 26 from the outside of the apparatus to the solid-state imaging apparatus 1. The input unit 21A includes an input terminal 41 which is an external terminal 14 for inputting data to the solid-state imaging apparatus 1 and an input circuit unit 42 which fetches a signal input to the input terminal 41 to the inside of the solid-state imaging apparatus 1.

The input unit 21A further includes an input amplitude changing unit 43 which changes an amplitude of the signal fetched at the input circuit unit 42 to an amplitude which can be easily utilized inside the solid-state imaging apparatus 1.

The input unit 21A further includes an input data conversion circuit unit 44 which changes sequence of a data string of input data. The input data conversion circuit unit 44 is, for example, a serial-to-parallel conversion circuit which receives a serial signal as input data and converts the serial signal into a parallel signal.

Note that there is a case where the input amplitude changing unit 43 and the input data conversion circuit unit 44 are omitted.

In the case where the solid-state imaging apparatus 1 is connected to an external memory device such as a flash memory, an SRAM and a DRAM, the input unit 21A can further include a memory interface circuit which receives data from these external memory devices.

The solid-state imaging apparatus 1 further includes an output unit 21B. The output unit 21B outputs image data imaged at the solid-state imaging apparatus 1 and image data subjected to signal processing at the image signal processing unit 26 from the solid-state imaging apparatus 1 to the outside of the apparatus. The output unit 21B includes an output terminal 48 which is an external terminal 14 for outputting data from the solid-state imaging apparatus 1 to the outside of the apparatus and an output circuit unit 47 which is a circuit which outputs data from the inside of the solid-state imaging apparatus 1 to the outside of the apparatus and which is a circuit which drives an external wiring located outside the solid-state imaging apparatus 1 connected to the output terminal 48.

The output unit 21B further includes an output amplitude changing unit 46 which changes an amplitude of a signal used inside the solid-state imaging apparatus 1 into an amplitude which can be easily utilized at the external device connected to the outside of the solid-state imaging apparatus 1.

The output unit 21B further includes an output data conversion circuit unit 45 which changes sequence of a data string of output data. The output data conversion circuit unit 45 is, for example, a parallel-to-serial conversion circuit which converts a parallel signal used inside the solid-state imaging apparatus 1 into a serial signal.

There is a case where the output data conversion circuit unit 45 and the output amplitude changing unit 46 are omitted.

In the case where the solid-state imaging apparatus 1 is connected to an external memory device such as a flash memory, an SRAM and a DRAM, the output unit 21B can further include a memory interface circuit which outputs data to these external memory devices.

Note that, in the present disclosure, there is a case where a circuit block including both or at least one of the input unit 21A and the output unit 21B will be referred to as an input/output unit 21 for convenience sake. Further, there is a case where a circuit unit including both or at least one of the input circuit unit 42 and the output circuit unit 47 will be referred to as an input/output circuit unit 49.

3. Circuit Arrangement Configuration Example of Pixel

Figure 3:
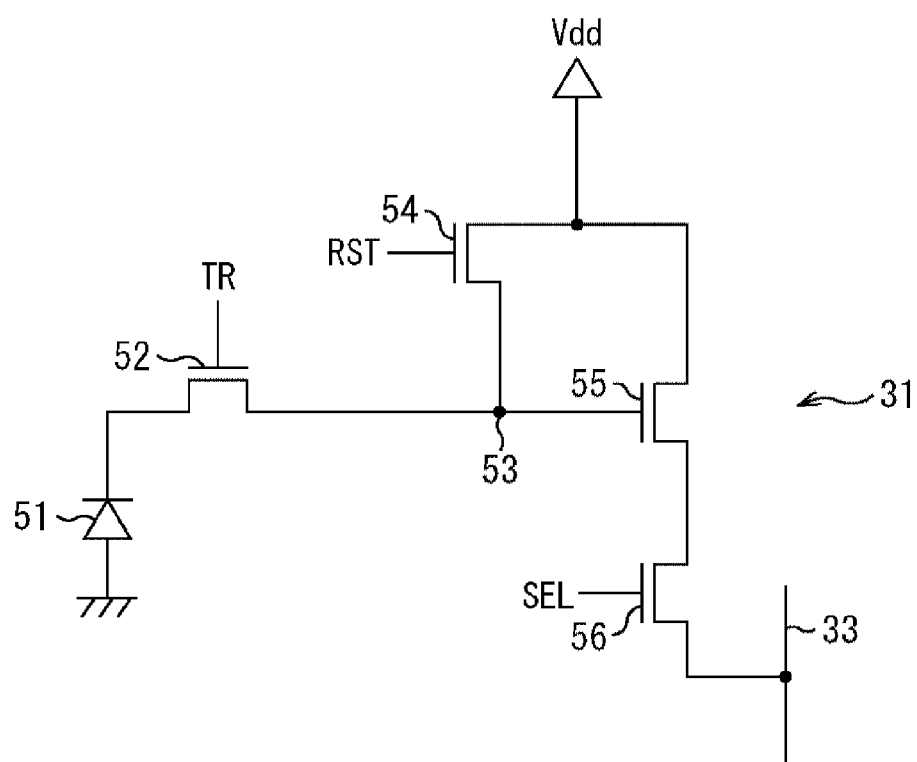
FIG. 3 is a diagram illustrating a circuit arrangement configuration example of a pixel.

FIG. 3 illustrates a circuit arrangement configuration example of the pixel 31 of the solid-state imaging apparatus 1 according to the present embodiment.

The pixel 31 has a photodiode 51 as a photoelectric conversion element, a transfer transistor 52, a floating diffusion (FD) 53, a reset transistor 54, an amplifier transistor 55 and a select transistor 56.

The photodiode 51 generates and accumulates an electric charge (signal electric charge) in accordance with an amount of received light. An anode terminal of the photodiode 51 is grounded, and a cathode terminal of the photodiode 51 is connected to the FD 53 via the transfer transistor 52.

The transfer transistor 52 reads out the electric charge generated at the photodiode 51 and transfers the electric charge to the FD 52 when the transfer transistor 52 is turned on by a transfer signal TR.

The FD 53 holds the electric charge read out from the photodiode 51. The reset transistor 54 resets a potential of the FD 53 by the electric charge accumulated in the FD 53 being discharged to a drain (constant voltage source Vdd) when the reset transistor 54 is turned on by a reset signal RST.

The amplifier transistor 55 outputs a pixel signal in accordance with a potential of the FD 53. That is, the amplifier transistor 55 constitutes a source follower circuit with a load MOS (not illustrated) as a constant current source connected via the vertical signal line 33, and a pixel signal indicating a level in accordance with the electric charge accumulated in the FD 53 is output from the amplifier transistor 55 to the column signal processing unit 25 via the select transistor 56 and the vertical signal line 33.

The select transistor 56 is turned on when the pixel 31 is selected by a selection signal SEL and outputs a pixel signal of the pixel 31 to the column signal processing unit 25 via the vertical signal line 33. Each signal line through which the transfer signal TR, the selection signal SEL and the reset signal RST are transmitted corresponds to the row drive signal line 32 in FIG. 2.

While the pixel 31 can be configured as described above, the configuration is not limited to this configuration, and other configurations can be also employed.

4. Configuration Examples of Input Circuit Unit and Output Circuit Unit

Figure 4:
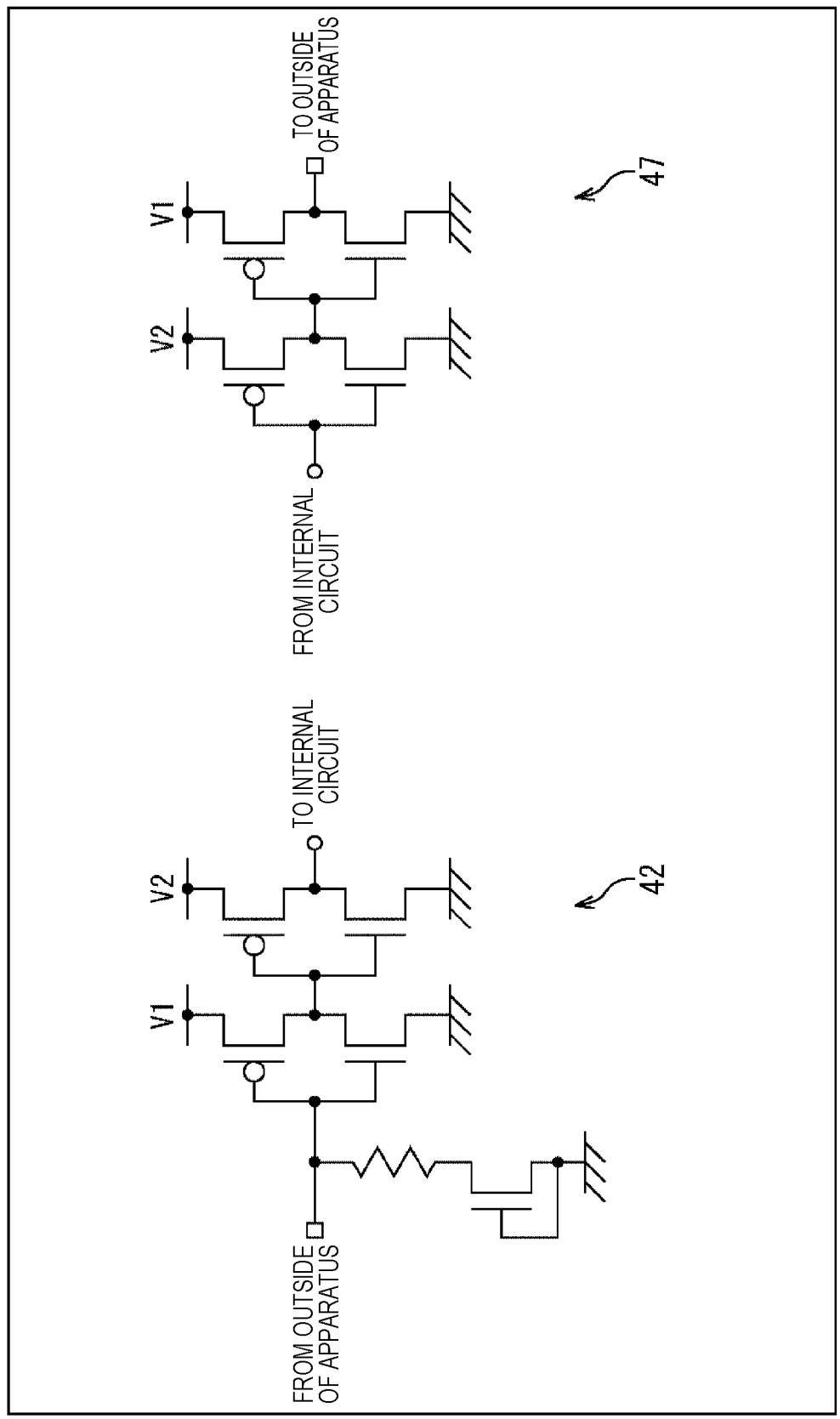
FIG. 4 is a diagram illustrating configuration examples of an input circuit unit and an output circuit unit.

FIG. 4 illustrates circuit arrangement configuration examples of the input circuit unit 42 provided at the input unit 21A and the output circuit unit 47 provided at the output unit 21B of the solid-state imaging apparatus 1 according to the present embodiment.

Note that, the input/output circuit unit 49 may employ a configuration including one of the input circuit unit 42 and the output circuit unit 47 for one external terminal 14, or may employ a configuration of a bidirectional input/output circuit including both the input circuit unit 42 and the output circuit unit 47 in parallel.

The input circuit unit 42 is a circuit having the following characteristics.
(1) The input circuit unit 42 is a circuit which maintains the same logic or only inverts the logic between data input from the input terminal 41 of the solid-state imaging apparatus 1 to the input circuit unit 42 and data output from the input circuit unit 42 to an internal circuit of the solid-state imaging apparatus 1. In other words, the input circuit unit 42 is a circuit which does not change sequence of data in a signal sequence. Further, in other words, the input circuit unit 42 is a circuit which does not change positions where "1" and "0" or "Hi" and "Low" of the logic in the signal sequence are switched.

(2) The input circuit unit 42 is a circuit which converts a voltage amplitude of a signal input to the input terminal 41 of the solid-state imaging apparatus 1 into a voltage amplitude which is favorable for a circuit disposed at a subsequent stage of the input circuit unit 42, in other words, a circuit further inside in the solid-state imaging apparatus 1 to receive. There is a case where this circuit converts data input to the circuit to have a smaller voltage amplitude.

(2)' Alternatively, the input circuit unit 42 is a circuit which converts the signal input to the input circuit unit 42 (for example, an amplitude differential signal of LVDS) into a format or a voltage amplitude which is favorable for a circuit disposed at a subsequent stage of the input circuit unit 42, in other words, a circuit further inside in the solid-state imaging apparatus 1 to receive (for example, a digital signal which fully swings at a single end) and outputs the converted signal. There is a case where this circuit converts data input to the circuit to have a larger voltage amplitude.

(3) Further, in the case where excessive noise is input to the input circuit unit 42, there is a case where a protective circuit is provided which shuts off this noise without propagating the noise to a circuit disposed at a subsequent stage of the input circuit unit 42, in other words, a circuit further inside in the solid-state imaging apparatus 1.

The output circuit unit 47 is a circuit having the following characteristics.

(1) The output circuit unit 47 is a circuit which maintains the same logic or only inverts the logic between data input to the output circuit unit 47 from an internal circuit of the solid-state imaging apparatus 1 and data output from the output circuit unit 47 to the outside of the solid-state imaging apparatus 1 via the output terminal 48 of the solid-state imaging apparatus 1. In other words, the output circuit unit 47 is a circuit which does not change sequence of data in a signal sequence. Further, in other words, a circuit which does not change positions where "1" and "0" or "Hi" and "Low" of the logic in the signal sequence are switched.

(2) The output circuit unit 47 is a circuit which increases current capability of driving a signal line between the output terminal 48 of the solid-state imaging apparatus 1 and an external element connected to the solid-state imaging apparatus 1 or a circuit which increases a voltage amplitude of the signal line. There is a case where this circuit converts data input to the circuit to have a larger voltage amplitude.

(2)' Alternatively, the output circuit unit 47 is a circuit which converts a signal input to the output circuit unit 47 from a circuit inside the solid-state imaging apparatus 1 (a digital signal which fully swings at a single end) into a format or a voltage amplitude which is favorable for an external element connected to the output terminal 48 to receive (for example, a small amplitude differential signal of LVDS) and outputs the converted signal. There is a case where this circuit converts data input to the circuit to have a smaller voltage amplitude.

As illustrated in FIG. 4, the input/output circuit unit 49 which includes at least one of the input circuit unit 42 and the output circuit unit 47 includes one or more transistors. In the present disclosure, there is a case where a transistor included in the input/output circuit unit 49 will be referred to as an input/output transistor for convenience sake. The input/output circuit unit 49 may include an inverter circuit, a buffer circuit, or the like, or may further include an enable circuit which controls input operation or output operation.

The input circuit unit 42 or the output circuit unit 47 can also function as an amplitude changing unit for an input signal or an output signal by a power supply voltage to be used at the circuit being appropriately set. For example, in the case where an amplitude of a signal in part of the pixel peripheral circuit unit or the image signal processing unit 26 of the solid-state imaging apparatus 1 is V2, while an amplitude of a signal input to the input terminal 41 from the outside of the solid-state imaging apparatus 1 or an amplitude of a signal output from the output terminal 48 to the outside of the solid-state imaging apparatus 1 is V1 which is greater than V2, in the case where a circuit of the input circuit unit 42 or the output circuit unit 47 is, for example, the circuit illustrated in FIG. 4, by setting a power supply voltage of an inverter located at the internal circuit side of the solid-state imaging apparatus 1 at V2 and setting a power supply voltage of an inverter located in an outward direction of the solid-state imaging apparatus 1 at V1, the input circuit unit 42 can receive a signal of the amplitude V1 from the outside and input the signal to the internal circuit of the solid-state imaging apparatus 1 after decreasing the amplitude to V2, and the output circuit unit 47 can receive a signal of the amplitude V2 from the internal circuit of the solid-state imaging apparatus 1 and output the signal to the outside after increasing the amplitude to V1. Note that, in the case where the voltages V1 and V2 illustrated in FIG. 4 are made the same voltage, the input circuit unit 42 and the output circuit unit 47 employ a configuration which does not include a function of changing a signal amplitude.

Note that, in the present disclosure including the above description, there is a case where a voltage difference between a reference voltage at a transistor circuit (in the case of the circuit in FIG. 4, an earth voltage) and a voltage which is a voltage of a power supply to be supplied to the circuit and which is different from the above-described reference voltage (in the case of the circuit in FIG. 4, for example, V1) is simply referred to as a power supply voltage.

5. Circuit Arrangement Configuration Example of Solid-State Imaging Apparatus

Circuit arrangement of the solid-state imaging apparatus 1 according to the present embodiment, that is, how respective blocks of the solid-state imaging apparatus 1 illustrated in FIG. 2 are divided and mounted on the upper structure 11 and the lower structure 12 will be described next.

Figure 5:
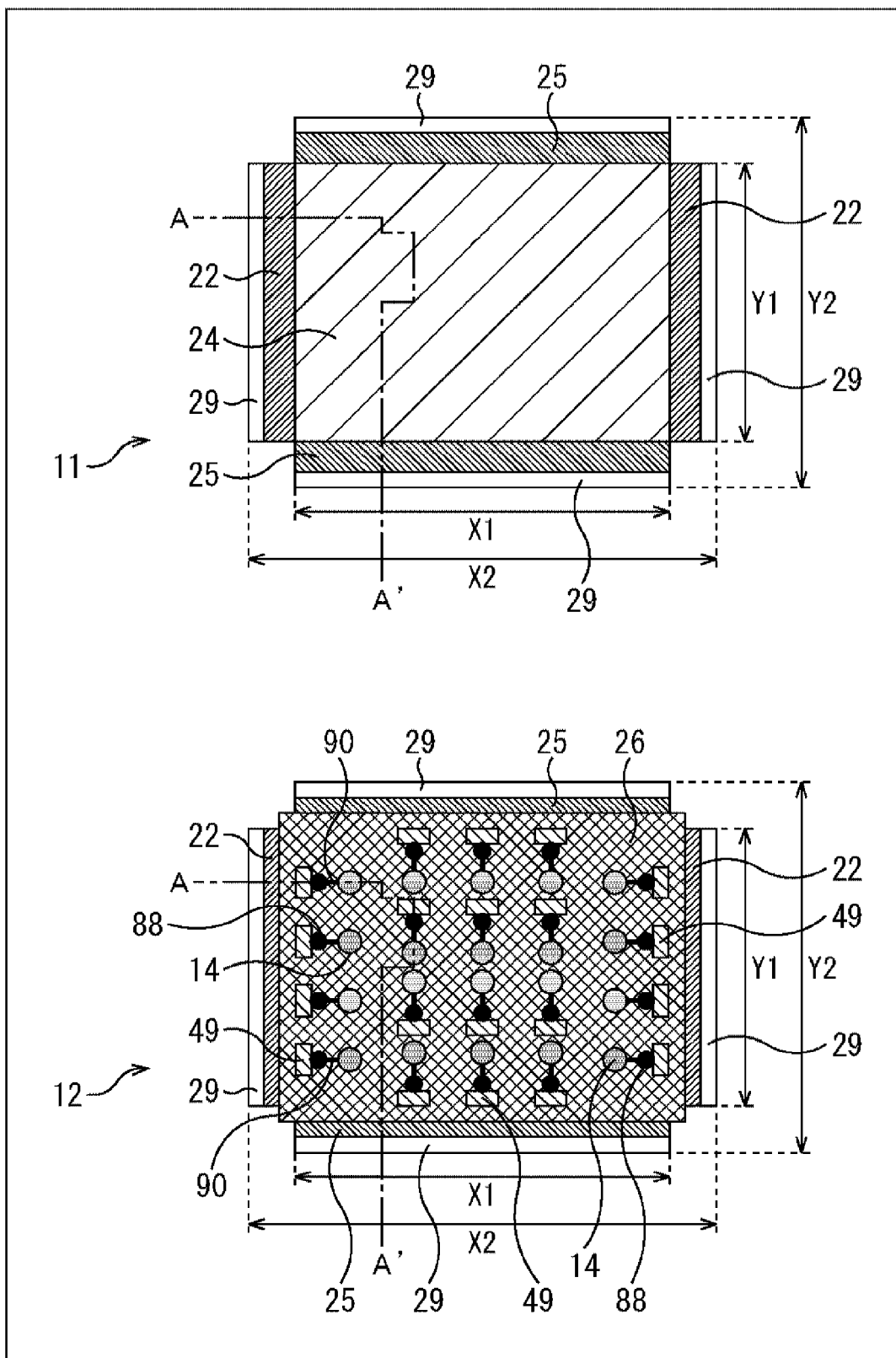
FIG. 5 is a diagram illustrating a first circuit arrangement configuration example of circuit arrangement in the solid-state imaging apparatus.

FIG. 5 is a diagram illustrating a first circuit arrangement configuration example of circuit arrangement in the solid-state imaging apparatus 1.

In the first circuit arrangement configuration example, the pixel array unit 24 is disposed in the upper structure 11.

Among the pixel peripheral circuit unit provided at the solid-state imaging apparatus 1, part of the row drive unit 22 is disposed in the upper structure 11 and part of the row drive unit 22 is disposed in the lower structure 12. For example, in the row drive unit 22, the row drive circuit unit is disposed in the upper structure 11, and the row decoder unit is disposed in the lower structure 12.

The row drive unit 22 disposed in the upper structure 11 is disposed outside in a row direction of the pixel array unit 24, and at least part of the row drive unit 22 disposed in the lower structure 12 is disposed at the lower side of the row drive unit 22 provided in the upper structure 11.

Among the pixel peripheral circuit units provided at the solid-state imaging apparatus 1, part of the column signal processing unit 25 is disposed in the upper structure 11, and part of the column signal processing unit 25 is disposed in the lower structure 12. For example, in the column signal processing unit 25, the load circuit unit, the amplifier circuit unit, the noise processing unit and the comparator unit of the ADC are disposed in the upper structure 11, and the counter unit of the ADC is disposed in the lower structure 12.

The column signal processing unit 25 disposed in the upper structure 11 is disposed outside in a column direction of the pixel array unit 24, and at least part of the column signal processing unit 25 disposed in the lower structure 12 is disposed at a lower side of the column signal processing unit 25 provided in the upper structure 11.

Wiring connecting units 29 for connecting wirings of the two row drive units 22 are disposed outside the row drive unit 22 disposed in the upper structure 11 and outside the row drive unit 22 disposed in the lower structure 12.

Figure 6:
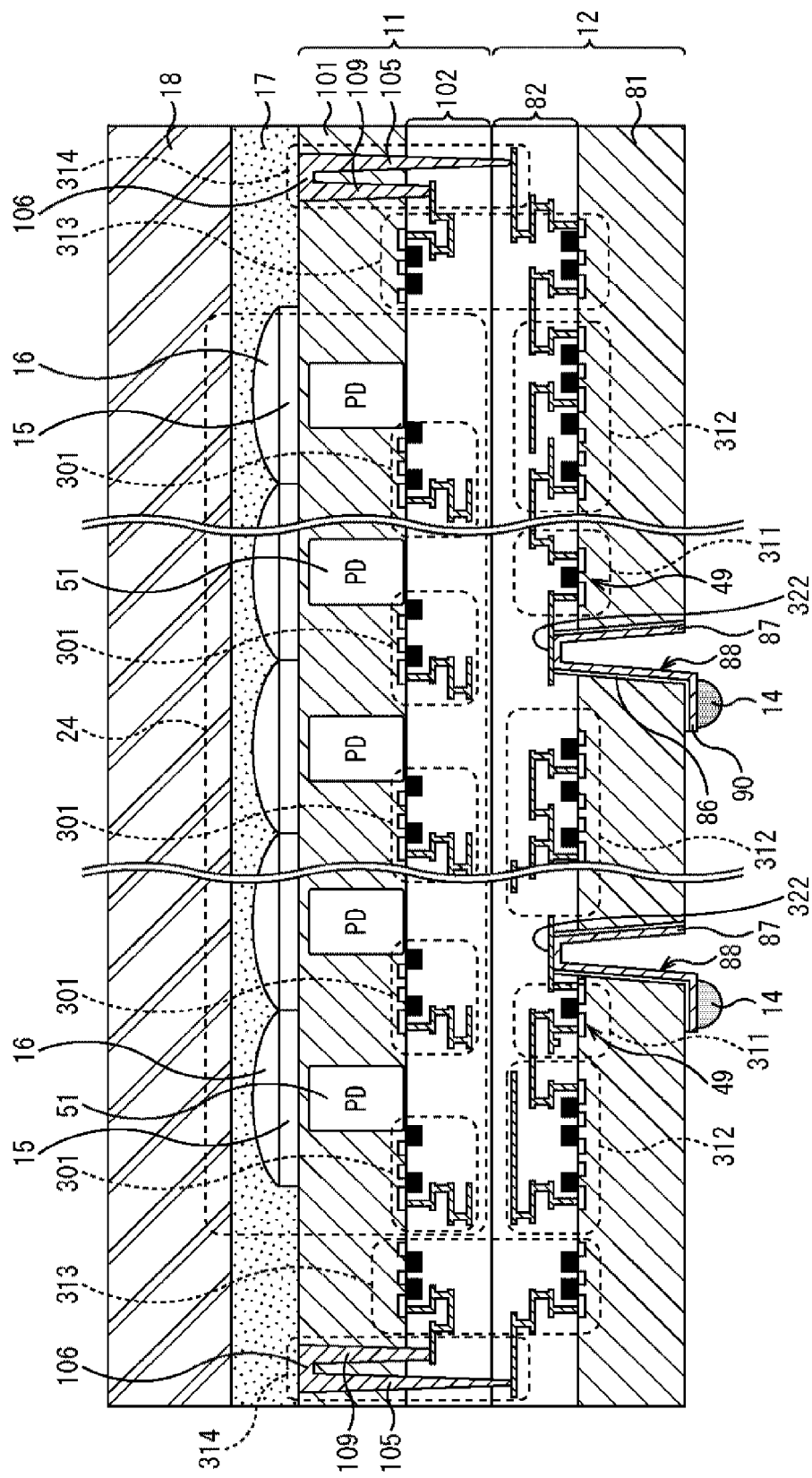
FIG. 6 is a diagram illustrating a cross-sectional structure in line A-A' in FIG. 5.

The wiring connecting units 29 for connecting wirings of the two column signal processing units 25 are also disposed outside the column signal processing unit 25 disposed in the upper structure 11 and outside the column signal processing unit 25 disposed in the lower structure 12. In these wiring connecting units 29, a wiring connection structure which will be described later using FIG. 6 is used.

An image signal processing unit 26 is disposed inside the row drive unit 22 and the column signal processing unit 25 disposed in the lower structure 12.

In the lower structure 12, the input/output circuit unit 49 is disposed in a region which is below the pixel array unit 24 of the upper structure 11.

The input/output circuit unit 49 is a circuit unit which includes both or at least one of the input circuit unit 42 and the output circuit unit 47. In the case where the input/output circuit unit 49 includes both the input circuit unit 42 and the output circuit unit 47, a plurality of input/output circuit units 49 are disposed in the lower structure 12 for each external terminal 14. In the case where the input/output circuit unit 49 is configured only with the input circuit unit 42, a plurality of input circuit units 42 are disposed in the lower structure 12 for each external terminal 14 (input terminal 41). In the case where the input/output circuit unit 49 is configured only with the output circuit unit 47, a plurality of output circuit units 47 are disposed in the lower structure 12 for each external terminal 14 (output terminal 48). Around each of the plurality of separately disposed input/output circuit units 49, the image signal processing unit 26 is disposed. In other words, the input/output circuit units 49 are disposed within regions where the image signal processing units 26 are disposed.

Note that, in the lower structure 12, the input/output circuit unit 49 may be disposed in a region which is below the row drive unit 22 or below the column signal processing unit 25 of the upper structure 11.

In other words, the input/output circuit unit 49 can be disposed in an arbitrary region at the lower structure 12 side where the external terminal 14 is formed and below a region of the pixel array unit 24 of the upper structure 11 or below the pixel peripheral circuit unit of the upper structure 11 (among the pixel peripheral circuit region 313 in FIG. 6, a circuit unit formed in the upper structure 11).

Note that, in the solid-state imaging apparatus 1 according to the present embodiment including other configuration examples which will be described later, a power supply terminal or an earth terminal may be disposed in place of the input terminal 41 and the input circuit unit 42 or the output circuit unit 47 or the output terminal 48 in a region where the input terminal 41 and the input circuit unit 42 or the output circuit unit 47 or the output terminal 48 are disposed.

Among the transistor circuits disposed in the lower structure 12, power supply voltages of transistor circuits which constitute the input circuit unit 42 and the output circuit unit 47 may higher than a power supply voltage of a transistor circuit which constitutes the image signal processing unit 26.

For example, the power supply voltages of the transistor circuits constituting the input circuit unit 42 and the output circuit unit 47 may be 1.8 to 3.3 V, and the power supply voltage of the transistor circuit constituting the image signal processing unit 26 may be 1.2 to 1.5 V. Because the power supply voltages of the former (transistor circuits constituting the input circuit unit 42 and the output circuit unit 47) are different from the power supply voltage of the latter (transistor circuit constituting the image signal processing unit 26), a distance between a well region to which the power supply voltages are applied at the input circuit unit 42 and the output circuit unit 47 and a well region to which the power supply voltage is applied at the image signal processing unit 26 disposed around the input circuit unit 42 and the output circuit unit 47, which are disposed separately from each other, that is, a width of a well separating region is preferably larger than a distance among a plurality of well regions to which power supply voltages are applied within the image signal processing unit 26.

Further, the depth of element separating regions provided at the input circuit unit 42 and the output circuit unit 47 may be deeper than the depth of an element separating region provided within the image signal processing unit 26. Further, the gate length of transistors provided at the input circuit unit 42 and the output circuit unit 47 is preferably larger than the gate length of the transistor provided within the image signal processing unit 26.

Among the pixel peripheral circuit unit provided at the solid-state imaging apparatus 1, a power supply voltage of a transistor circuit which constitutes part of the pixel peripheral circuit unit disposed in the upper structure 11, for example, one of the load circuit unit, the amplifier circuit unit, the noise processing unit and the comparator unit of the ADC provided at the column signal processing unit 25 may be higher than a power supply voltage of a transistor circuit which constitutes part of the pixel peripheral circuit unit disposed in the lower structure 12, for example, the counter unit of the ADC provided at the column signal processing unit 25. As an example, the power supply voltage of the transistor circuit of the former (the pixel peripheral circuit unit disposed in the upper structure 11, for example, one of the load circuit unit, the amplifier circuit unit, the noise processing unit and the comparator unit of the ADC provided at the column signal processing unit 25) may be 1.8 to 3.3 V, and the power supply voltage of the transistor circuit of the latter (the pixel peripheral circuit unit disposed in the lower structure 12, for example, the counter unit of the ADC) may be 1.2 to 1.5 V. The power supply voltage of the transistor circuit of the latter may be the same as the power supply voltage of the transistor circuit which constitutes the image signal processing unit 26 disposed in the lower structure 12. Because the power supply voltage of the transistor circuit of the former is higher than the power supply voltage of the transistor circuit of the latter, a distance among a plurality of well regions to which the power supply voltage is applied in the transistor circuit of the former is preferably larger than a distance among a plurality of well regions to which the power supply voltage is applied in the transistor circuit of the latter. Further, the depth of an element separating region provided at the transistor circuit of the former is preferably deeper than the depth of an element separating region provided at the transistor circuit of the latter. Further, the gate length of the transistor provided at the transistor circuit of the former is preferably longer than the gate length of the transistor provided at the transistor circuit of the latter.

Still further, a power supply voltage of a pixel transistor constituting the pixel 31 disposed in the upper structure 11 may be the same as a power supply voltage of a transistor circuit constituting the pixel peripheral circuit unit disposed in the upper structure 11 (for example, one of the load circuit unit, the amplifier circuit unit, the noise processing unit and the comparator unit of the ADC provided at the column signal processing unit 25).

A power supply voltage of a pixel transistor circuit constituting the pixel 31 disposed in the upper structure 11 may be higher than a power supply voltage of a transistor circuit constituting the pixel peripheral circuit unit (for example, the counter unit of the ADC) disposed in the lower structure 12 or the image signal processing unit 26. Therefore, in the case where an element separating region having a structure in which a semiconductor substrate is engraved as an element separating region is used, the depth of part of the element separating region provided around the pixel transistor disposed in the upper structure 11 may be deeper than the depth of the element separating region provided around the transistor of the pixel peripheral circuit unit or the image signal processing unit 26 disposed in the lower structure 12. Alternatively, as the element separating region around the pixel transistor, instead of the element separating region which is formed by engraving the semiconductor substrate, the element separating region forming an impurity region which has a conductive type opposite to a conductive type of a diffusion layer region of the pixel transistor may be partly used around the pixel transistor.

Further, the gate length of the pixel transistor disposed in the upper structure 11 may be longer than the gate length of the transistor of the pixel peripheral circuit unit or the image signal processing unit 26 disposed in the lower structure 12. Meanwhile, while it is concerned that a noise electric charge in the vicinity of the element separating region increases due to the depth of the element separating region becoming deeper, in order to suppress generation of the noise electric charge in the vicinity of the element separating region, the depth of the element separating region provided around the pixel transistor disposed in the upper structure 11 may be shallower than the depth of the element separating region provided around the transistor constituting the pixel peripheral circuit unit disposed in the upper structure 11.

6. Cross-Sectional Structure of Solid-State Imaging Apparatus

A cross-sectional structure and circuit arrangement of the solid-state imaging apparatus 1 according to the present embodiment will be further described with reference to FIG. 6.

FIG. 6 is a diagram illustrating a cross-sectional structure according to the solid-state imaging apparatus 1 in line A-A' in FIG. 5. Note that, for convenience sake, part of FIG. 6 is replaced with a cross-sectional structure in another configuration example of the present technology which will be described later.

At a portion including the upper structure 11 provided at the solid-state imaging apparatus 1 and a portion above the upper structure 11, the pixel array unit 24 in which a plurality of pixels 31 each of which has the on-chip lens 16, the color filter 15, the pixel transistor and the photodiode 51 are arranged in an array is disposed. In a region of the pixel array unit 24 (pixel array region), a pixel transistor region 301 is also disposed. The pixel transistor region 301 is a region where a pixel transistor of at least one of the transfer transistor 52, the amplifier transistor 55 and the reset transistor 54 is formed.

On a surface of the lower side of the semiconductor substrate 81 provided in the lower structure 12 and in a region located below the pixel array unit 24 provided in the upper structure 11, a plurality of external terminals 14 are disposed.

Note that, in the description of FIG. 6, a "region on a surface at a lower side of the semiconductor substrate 81 provided in the lower structure 12 and disposed below the pixel array unit 24 provided in the upper structure 11" is referred to as a first specific region, and a "region on a surface at an upper side of the semiconductor substrate 81 provided in the lower structure 12 and disposed below the pixel array unit 24 provided in the upper structure 11" is referred to as a second specific region.

At least part of a plurality of external terminals 14 disposed in the first specific region is a signal input terminal 14A for inputting a signal to the solid-state imaging apparatus 1 from the outside or a signal output terminal 14B for outputting signal from the solid-state imaging apparatus 1 to the outside. In other words, the signal input terminal 14A and the signal output terminal 14B are external terminals 14 excluding the power supply terminal and the earth terminal among the external terminals 14. In the present disclosure, the signal input terminal 14A or the signal output terminal 14B is referred to as a signal input/output terminal 14C.

In the first specific region and in the vicinity of the signal input/output terminal 14C, a through hole via 88 which penetrates through the semiconductor substrate 81 is disposed. Note that, in the present disclosure, there is a case where a via hole which penetrates through the semiconductor substrate 81 and a via wiring formed inside the via hole are collectively simply referred to as a through hole via 88.

The through hole via hole preferably has a structure formed by being engraved from a lower surface of the semiconductor substrate 81 to a conductive pad 322 (hereinafter, there is a case where the conductive pad 322 will be referred to as a via pad 322) which is part of a multilayer wiring layer 82 disposed over an upper surface of the semiconductor substrate 81 and which becomes an end (bottom) of the via hole.

The signal input/output terminal 14C disposed in the first specific region is electrically connected to the through hole via 88 disposed in the same first specific region (more specifically, a via wiring formed inside the through hole via hole).

In the second specific region and in a region in the vicinity of the signal input/output terminal 14C and the above-described through hole via, the input/output circuit unit 49 including the input circuit unit 42 or the output circuit unit 47 is disposed.

The signal input/output terminal 14C disposed in the first region is electrically connected to the input/output circuit unit 49 via the through hole via 88 and the via pad 322 or part of the multilayer wiring layer 82.

A region where the input/output circuit unit 49 is disposed is referred to as an input/output circuit region 311. On an upper surface of the semiconductor substrate 81 provided in the lower structure 12, a signal processing circuit region 312 is formed adjacent to the input/output circuit region 311. The signal processing circuit region 312 is a region where the image signal processing unit 26 described with reference to FIG. 2 is formed.

A region where the pixel peripheral circuit unit including all or part of the row drive unit 22 and the column signal processing unit 25 described with reference to FIG. 2 is disposed is referred to as a pixel peripheral circuit region 313. In a region outside the pixel array unit 24 on the lower surface of the semiconductor substrate 101 provided in the upper structure 11 and the upper surface of the semiconductor substrate 81 provided in the lower structure 12, the pixel peripheral circuit region 313 is disposed.

The signal input/output terminal 14C may be disposed in a region below the input/output circuit region 311 or in a region below the signal processing circuit region 312, disposed in the lower structure 12. Alternatively, the signal input/output terminal 14C may be disposed below the pixel peripheral circuit unit such as the row drive unit 22 and the column signal processing unit 24 disposed in the lower structure 12.

In the present disclosure, there is a case where a wiring connection structure which connects a wiring included in the multilayer wiring layer 102 of the upper structure 11 and a wiring included in the multilayer wiring layer 82 of the lower structure 12 is referred to as an upper and lower wiring connection structure, and a region where this structure is disposed is referred to as an upper and lower wiring connection region 314.

The upper and lower wiring connection structure is formed with a first through hole electrode (through silicon via) 109 which penetrates through the semiconductor substrate 101 from the upper surface of the upper structure 11 to the multilayer wiring layer 102, a second through hole electrode (through chip via) 105 which penetrates through the semiconductor substrate 101 and the multilayer wiring layer 102 from the upper surface of the upper structure 11 to the multilayer wiring layer 82 of the lower structure 12, and a through hole electrode connection wiring 106 for connecting these two through silicon vias (TSVs). In the present disclosure, there is a case where such an upper and lower wiring connection structure is referred to as a twin contact structure.

The upper and lower wiring connection region 314 is disposed outside the pixel peripheral circuit region 313.

While, in the present embodiment, the pixel peripheral circuit region 313 is formed in both the upper structure 11 and the lower structure 12, the pixel peripheral circuit region 313 may be formed in only one of the upper structure 11 and the lower structure 12.

Further, while, in the present embodiment, the upper and lower wiring connection region 314 is disposed outside the pixel array unit 24 and outside the pixel peripheral circuit region 313, the upper and lower wiring connection region 314 may be disposed outside the pixel array unit 24 and inside the pixel peripheral circuit region 313.

Further, in the present embodiment, as a structure of electrically connecting the multilayer wiring layer 102 of the upper structure 11 and the multilayer wiring layer 82 of the lower structure 12, a twin contact structure in which two through hole electrodes of the through silicon via 109 and through chip via 105 are used for connection is employed.

As a structure of electrically connecting the multilayer wiring layer 102 of the upper structure 11 and the multilayer wiring layer 82 of the lower structure 12, for example, a share contact structure in which the wiring layer 103 of the upper structure 11 and the wiring layer 83 of the lower structure 12 are commonly connected to one through hole electrode may be employed.

7. Circuit Arrangement of Solid-State Imaging Apparatus in the Case where Other Upper and Lower Wiring Connection Structures are Used Circuit arrangement and a cross-sectional structure of the solid-state imaging apparatus 1 in the case where other upper and lower wiring connection structures are used will be described with reference to FIG. 7 and FIG. 8.

Figure 7:
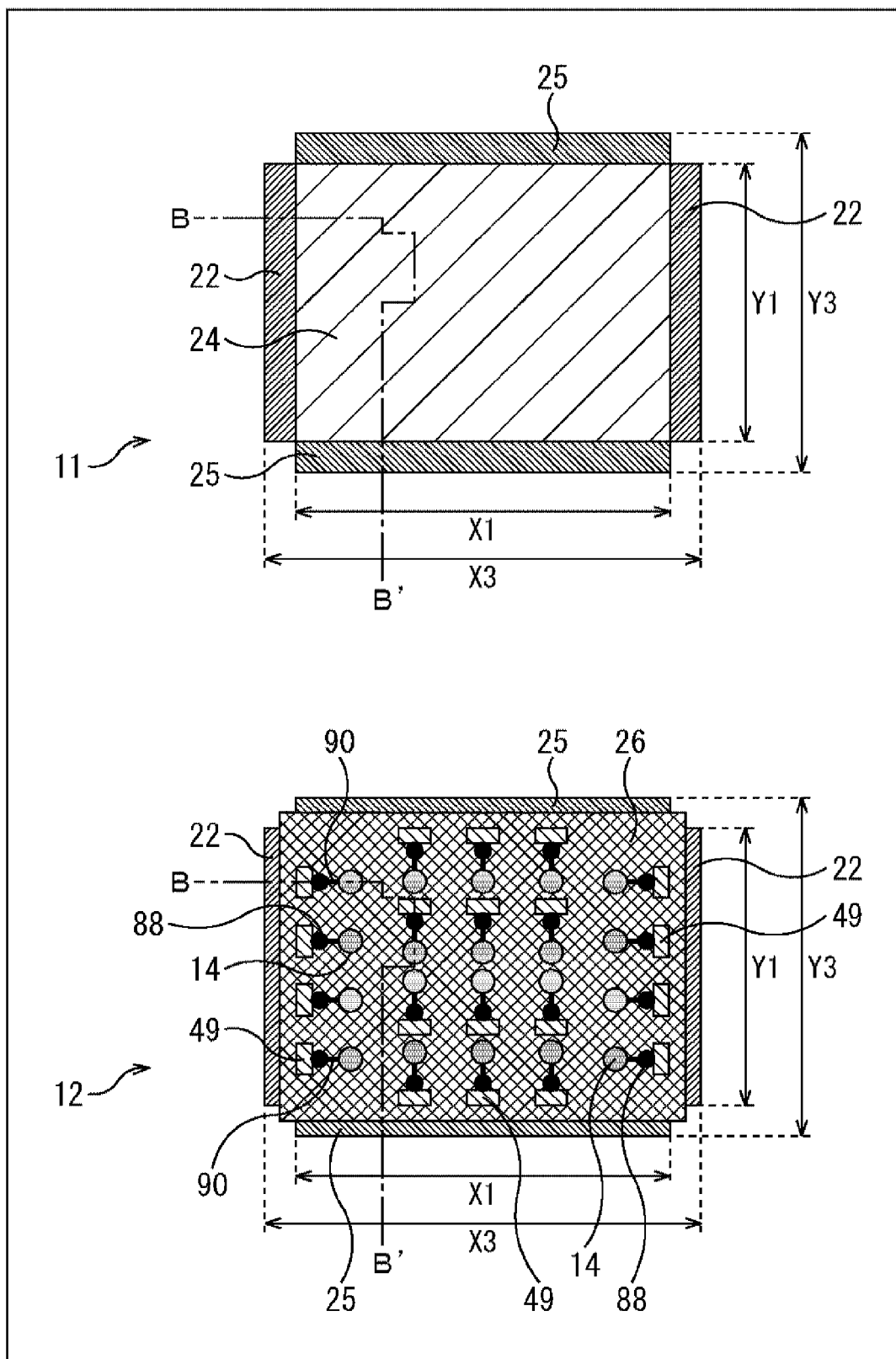
FIG. 7 is a diagram illustrating a second circuit arrangement configuration example of circuit arrangement in the solid-state imaging apparatus.
Figure 8:
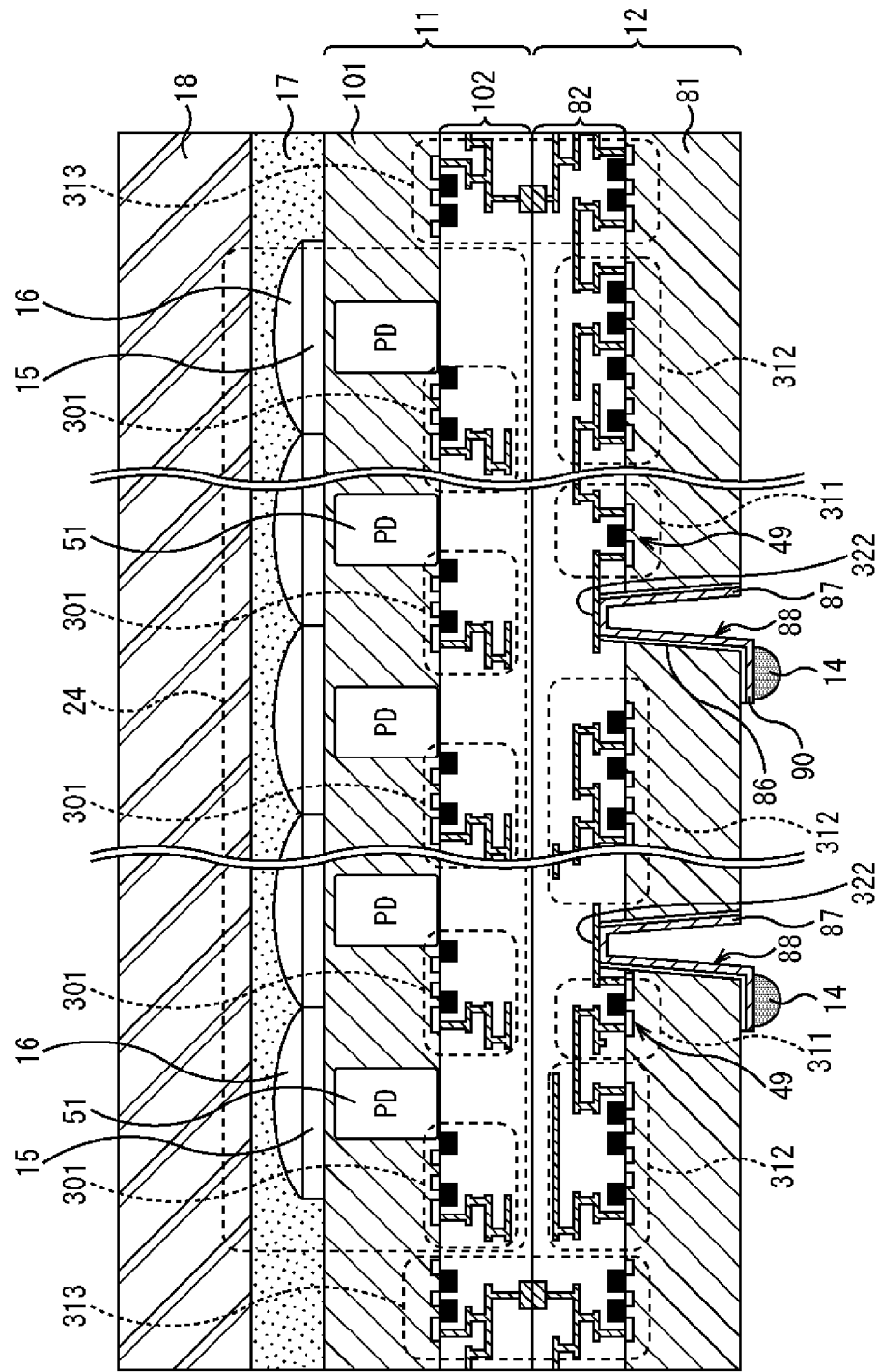
FIG. 8 is a diagram illustrating a cross-sectional structure in line B-B' in FIG. 7.

FIG. 8 is a diagram illustrating a cross-sectional structure of the solid-state imaging apparatus 1 in line B-B' in FIG. 7 in the case where a structure different from the upper and lower wiring connection structure illustrated in FIG. 6 is used. Note that, for convenience sake, part of FIG. 8 is replaced with a cross-sectional structure in another configuration example of the present technology which will be described later.

In the pixel peripheral circuit region 313 in FIG. 8, part of the wiring of the multilayer wiring layer 102 of the upper structure 11 is disposed on a lowermost face of the multilayer wiring layer 102, in other words, on a bonding face between the upper structure 11 and the lower structure 12. Further, part of the wiring of the multilayer wiring layer 82 of the lower structure 12 is also disposed on an uppermost face of the multilayer wiring layer 82, in other words, on a bonding face between the upper structure 11 and the lower structure 12. Part of the wiring of the multilayer wiring layer 102 and part of the wiring of the multilayer wiring layer 82 are disposed at substantially the same position on the bonding face, and the wirings are electrically connected to each other. As a form in which the wirings are electrically connected to each other, a form may be employed in which the two wirings are directly brought into contact with each other, or a form may be employed in which a thin insulating film or highly resistive film is formed between the two wirings and part of the formed film is electrically conductive. Alternatively, a form may be employed in which a thin insulating film or a highly resistive film is formed between the two wirings, and the two wirings propagate an electric signal through capacitive coupling.

In the present disclosure, there is a case where a structure in which part of the wiring of multilayer wiring layer 102 of the upper structure 11 and part of the wiring of the multilayer wiring layer 82 of the lower structure 12 are formed at substantially the same position on the above-described bonding face and the two wirings are electrically connected is collectively referred to as an upper and lower wiring direct connection structure or simply a wiring direct connection structure.

As a specific example of the above-described substantially the same position, for example, a position may be used where the above-described two wirings which are electrically connected at least partially overlaps in the case where the solid-state imaging apparatus 1 is planarly viewed from an upper side to a lower side. In the case where, for example, copper (Cu) is used as a material of the two wirings to be connected, there is a case where this connection structure is referred to as a Cu—Cu direct bonding structure or simply a Cu—Cu bonding structure.

In the case where the upper and lower wiring direct connection structure is used, this connection structure can be disposed outside the pixel array unit 24. Alternatively, this connection structure can be disposed inside the pixel peripheral circuit region 313 provided in the upper structure 11 and inside the pixel peripheral circuit region 313 provided in the lower structure 12. More specifically, among the wirings which constitute the upper and lower wiring direct connection structure, a wiring disposed in the upper structure 11 side of the bonding face can be disposed below the circuit provided at the pixel peripheral circuit region 313 of the upper structure 11. Further, among the wirings constituting the upper and lower wiring direct connection structure, a wiring disposed in the lower structure 12 side of the above-described bonding face can be disposed above the circuit provided at the pixel peripheral circuit region 313 of the lower structure 12. Alternatively, using a wiring disposed at the pixel array unit 24 (pixel transistor region 301) as a wiring of the upper structure 11, the upper and lower wiring direct connection structure formed with the wiring of the upper structure 11 and the wiring of the lower structure 12 can be disposed below the pixel array unit 24 (pixel transistor region 301).

<Second Circuit Arrangement Configuration Example>

FIG. 7 is a diagram illustrating a second circuit arrangement configuration example of the solid-state imaging apparatus 1.

In the second circuit arrangement configuration example, the above-described upper and lower wiring direct connection structure is used as the upper and lower wiring connection structure.

As illustrated in FIG. 7, arrangement of the pixel array unit 24 in the second circuit arrangement configuration example is similar to that in the first circuit arrangement configuration example illustrated in FIG. 5. That is, the pixel array unit 24 is disposed in the upper structure 11.

Further, as illustrated in FIG. 7, arrangement of the row drive unit 22 and the column signal processing unit 25 of the solid-state imaging apparatus 1 in the second circuit arrangement configuration example is similar to that in the first circuit arrangement configuration example illustrated in FIG. 5.

Meanwhile, arrangement of the upper and lower wiring connection unit in the second circuit arrangement configuration example is different from that in the first circuit arrangement configuration example illustrated in FIG. 5.

Connection between the wiring of the row drive unit 22 disposed in the upper structure 11 and the wiring of the row drive unit 22 disposed in the lower structure 12 is formed in a region where the row drive unit 22 disposed in the upper structure 11 overlaps with the row drive unit 22 disposed in the lower structure 12 using the upper and lower wiring direct connection structure.

Connection between the wiring of the column signal processing unit 25 disposed in the upper structure 11 and the wiring of the column signal processing unit 25 disposed in the lower structure 12 is formed in a region where the column signal processing unit 25 disposed in the upper structure 11 overlaps with the column signal processing unit 25 disposed in the lower structure 12 using the upper and lower wiring direct connection structure.

In the first circuit arrangement configuration example illustrated in FIG. 5, the upper and lower wiring connection structure which connects the wiring of the row drive unit 22 and the upper and lower wiring connection structure which connects the wiring of the column signal processing unit 25 are respectively disposed at the wiring connecting units 29 located outside the row drive unit 22 and outside the column signal processing unit 25. Meanwhile, in the second circuit arrangement configuration example illustrated in FIG. 7, the upper and lower wiring connection structure which connects the wiring of the row drive unit 22 and the upper and lower wiring connection structure which connects the wiring of the column signal processing unit 25 are respectively formed within a region of the row drive unit 22 and within a region of the column signal processing unit 25. Therefore, with the solid-state imaging apparatus 1 illustrated in the second circuit arrangement configuration example, in which the wiring connecting unit 29 is omitted in the upper structure 11 and the lower structure 12, it is possible to realize an apparatus with a smaller outline size than that of the solid-state imaging apparatus 1 illustrated in the first circuit arrangement configuration example.

8. Example of Comparison with Other Solid-State Imaging Apparatuses

Comparative Example 1

Characteristics of the structure of the solid-state imaging apparatus 1 will be described while the structure is compared with structures of other solid-state imaging apparatuses.

Figure 9:
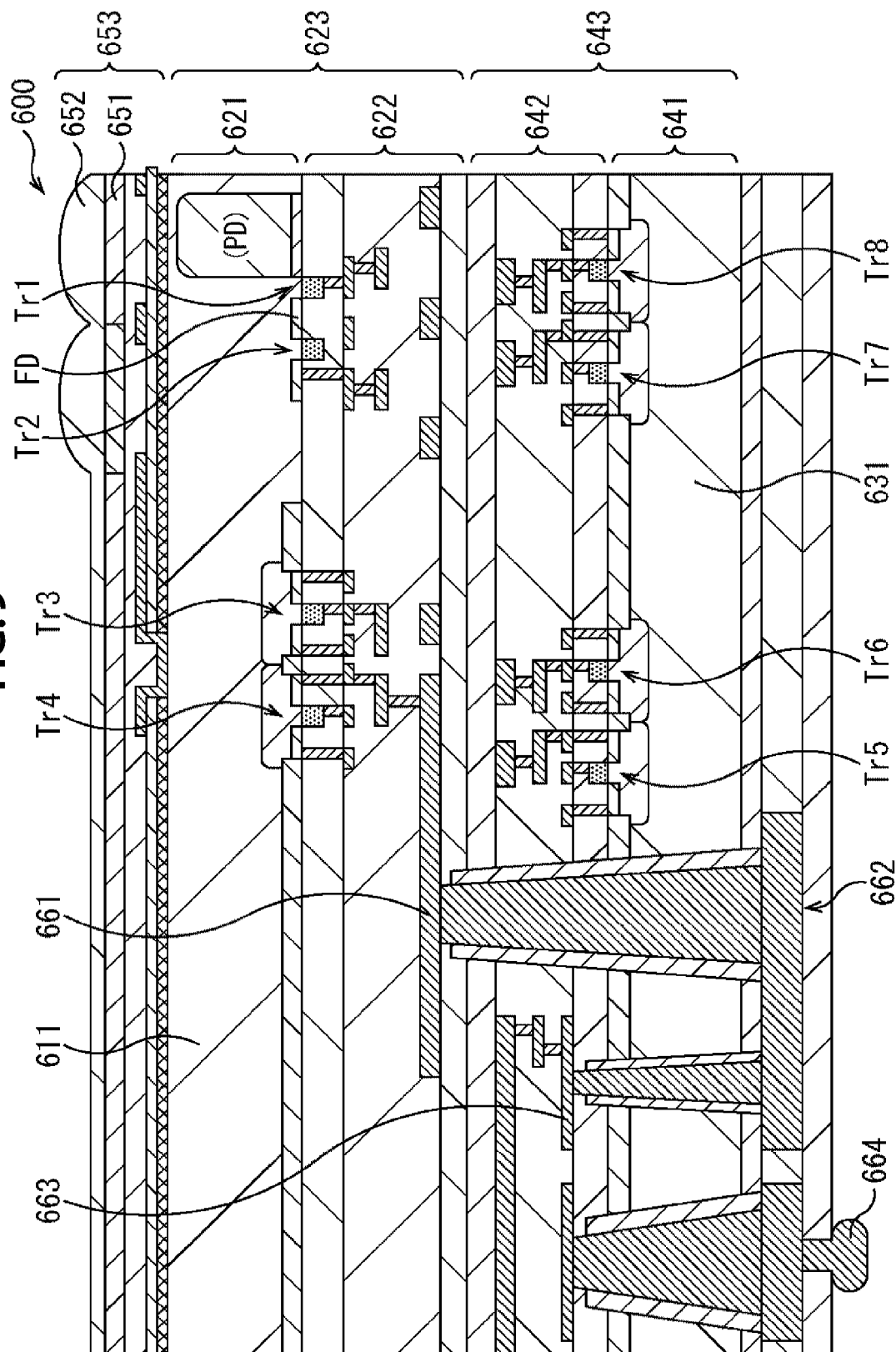
FIG. 9 is a diagram illustrating a cross-section of a solid-state imaging apparatus in a final shape as comparative example 1.

FIG. 9 is a diagram illustrating a cross-section of the solid-state imaging apparatus in a final shape disclosed in JP 2014-72294A (hereinafter, referred to as comparative structure disclosing literature 2) as comparative example 1.

The solid-state imaging apparatus 600 in FIG. 9 has a structure in which a first portion 623 including a first element portion 621 including a first semiconductor layer 611 and a first wiring portion 622, and a second portion 643 including a second element portion 641 including a second semiconductor layer 631 and a second wiring portion 642 are laminated. At a back surface side of the first portion 623, an optical member 653 in which a color filter 651, an on-chip lens 652, or the like, are formed is disposed.

In the solid-state imaging apparatus 600, a structure which connects a first wiring 661 and a second wiring 663 via a conductive member 662 is formed outside transistors Tr3 and Tr4 constituting a control unit and outside a region where transistors Tr5 to Tr8 constituting a signal processing unit are disposed, and an external terminal 664 is disposed outside this connection structure. Note that there is no description as to a position where an input/output circuit is disposed.

On the other hand, in the present technology, with a structure in which (1) the external terminal 14, (2) a semiconductor region in which the input circuit unit 42 or the output circuit unit 47 connected to the external terminal 14 is formed, (3) a semiconductor region in which the photodiode 51 which performs imaging and the pixel transistor are formed, (4) the color filter 15 and the on-chip lens 16, and (5) the protective substrate 18 are laminated in substantially the same region, it is possible to make outline size smaller than that of the solid-state imaging apparatus 600 in FIG. 9.

The solid-state imaging apparatus 600 in FIG. 9 does not include a protective substrate for protecting the on-chip lens 652 above the on-chip lens 652 in the final shape. As a method for manufacturing the solid-state imaging apparatus 600 in FIG. 9, the comparative structure disclosing literature 1 discloses bonding the first portion 623 and the second portion 643, forming the color filter 651 and the on-chip lens 652, and, after inverting the substrate, forming an opening for exposing an electrode portion and the external terminal 664. When the external terminal 663 is formed, it is necessary to bond the external terminal 664 on a metal wiring with pressure by applying stress equal to or greater than a specific value. In the solid-state imaging apparatus 600 which does not include a protective substrate on the on-chip lens 652, if the external terminal 664 is formed using the above-described manufacturing method, when the external terminal 664 is bonded with pressure, there is a possibility that the on-chip lens 652 may be damaged by the on-chip lens 652 being pressed into a manufacturing apparatus.

Further, in the solid-state imaging apparatus 600 in FIG. 9, the external terminal 664 is formed in a region outside the pixel array unit, and is not formed immediately below the on-chip lens 652. In this case, force applied to the on-chip lens 652 when the external terminal 664 is bonded with pressure is force which is applied for bonding the external terminal 664 with pressure being obliquely distributed.

If the external terminal 664 is formed immediately below the pixel region, that is, immediately below the on-chip lens 652 to realize a solid-state imaging apparatus with a small outline size, because the on-chip lens 652 is an extension of a direction of force to be applied for bonding the external terminal 664 with pressure, force applied to the on-chip lens 652 becomes greater, and there is a possibility that occurrence of a damage on the on-chip lens 652 may become more serious.

Further, comparative structure disclosing literature 1 also discloses a manufacturing method in which the color filter 651 and the on-chip lens 652 are formed after the external terminal 664 is formed.

However, in the case of this manufacturing method, in a state where a number of projecting portions by the external terminal 664 are provided on a surface of the solid-state imaging apparatus, when the color filter 651 and the on-chip lens 652 are formed, there is a possibility that it is difficult to fix the solid-state imaging apparatus at the manufacturing apparatus using a general method such as a vacuum suction method.

Meanwhile, the solid-state imaging apparatus 1 in FIG. 1 includes the protective substrate 18 on the on-chip lens 16. Therefore, it is possible to form the external terminal 14 without pressing the on-chip lens 16 into a manufacturing apparatus of the external terminal 14. The solid-state imaging apparatus 1 can employ a structure in which (1) the external terminal 14, (2) a semiconductor region in which the input circuit unit 42 or the output circuit unit 47 connected to the external terminal 14 is formed, (3) a semiconductor region in which a photodiode 51 which performs imaging and the pixel transistor are formed, (4) the color filter 15 and the on-chip lens 16, and (5) the protective substrate 18 are laminated in substantially the same region, so that it is possible to make an outline size smaller than that of the solid-state imaging apparatus in FIG. 9.

Comparative Example 2

Figure 10:
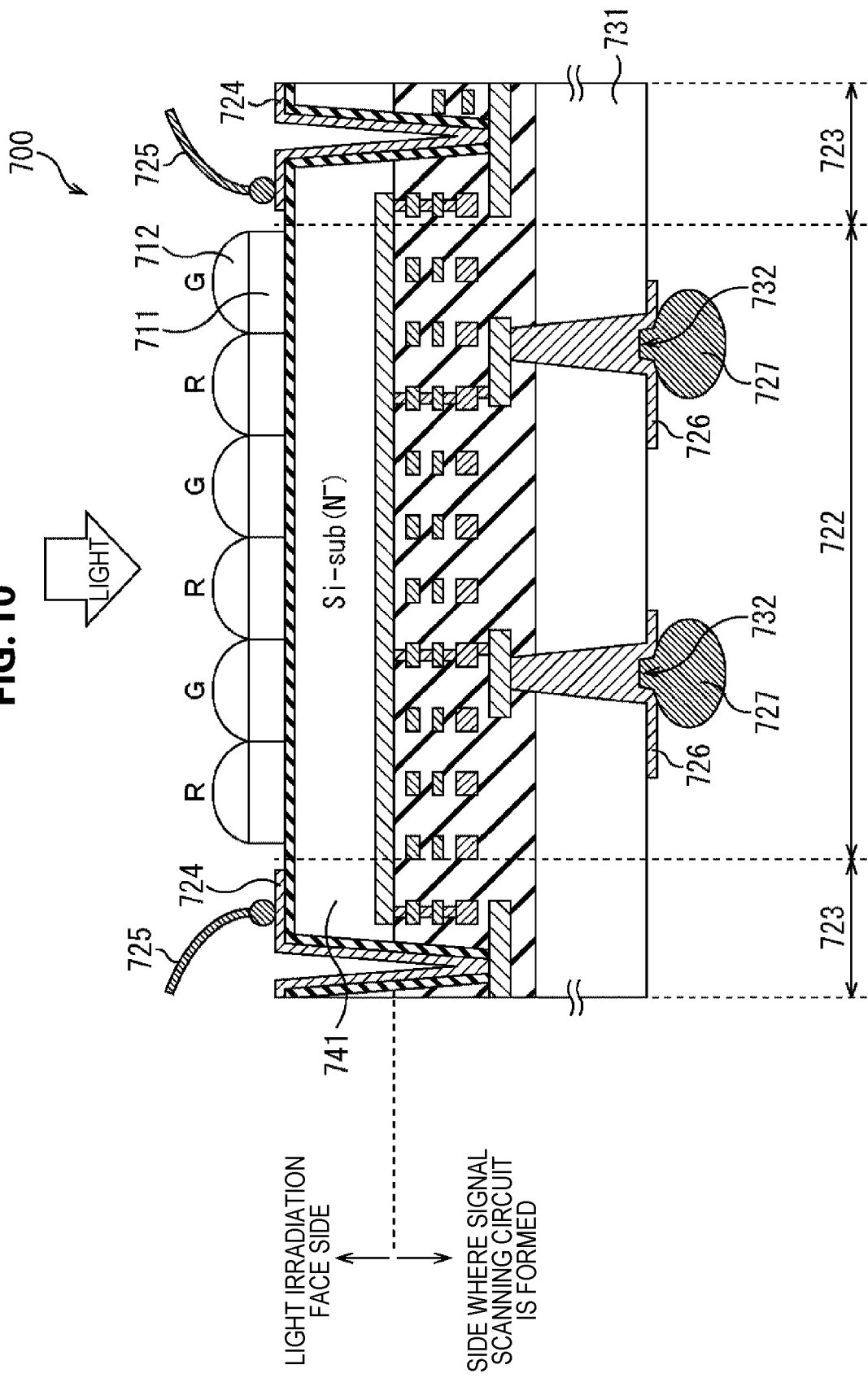
FIG. 10 is a diagram illustrating a cross-section of a solid-state imaging apparatus in a final shape as comparative example 2.

FIG. 10 is a diagram illustrating a cross-section of the solid-state imaging apparatus in a final shape disclosed in JP 2010-50149A (comparative structure disclosing literature 2) as comparative example 2.

The solid-state imaging apparatus 700 in FIG. 10 is separated into an imaging region 722 where a photodiode (not illustrated), the color filter 711, the on-chip lens 712, or the like, are formed, and a peripheral region 723 formed around the imaging region 722.

In the peripheral region 723, a first pad 724 for inputting/outputting a drive pulse or a signal is disposed. A bonding wire 725 is connected to the first pad 724. Within the imaging region 722, a second pad 726 for providing a reference potential Vss is disposed. An external terminal (solder ball) 727 is provided on the second pad 726.

As described above, the solid-state imaging apparatus 700 includes the external terminal 727 at the lower side of the pixel array.

In the solid-state imaging apparatus 1, with a structure in which (1) the external terminal 14, (2) a semiconductor region in which the input circuit unit 42 or the output circuit unit 47 connected to the external terminal 14 is formed, (3) a semiconductor region in which the photodiode 51 which performs imaging and the pixel transistor are formed, (4) the color filter 15 and the on-chip lens 16, and (5) the protective substrate 18 are laminated in substantially the same region, it is possible to make outline size smaller than that of the solid-state imaging apparatus 700 in FIG. 10.

The solid-state imaging apparatus 700 in FIG. 10 does not include a laminate structure such as the upper structure 11 and the lower structure 12 of the solid-state imaging element 1. In other words, the solid-state imaging apparatus 700 is a solid-state semiconductor apparatus which includes only one layer of a semiconductor substrate on which a transistor circuit is formed.

In the solid-state imaging apparatus 700 disclosed in FIG. 10, in the final shape, a via 732 which penetrates through a support substrate 731 and the external terminal 727 are formed at the lower side of the pixel array within the imaging region 722.

However, the external terminal 727 formed in FIG. 10 is a terminal for a reference potential Vss (earth potential). A terminal of the reference potential Vss does not need an input circuit including a transistor circuit, to supply the reference potential Vss to the inside of the solid-state imaging apparatus. Therefore, in the solid-state imaging apparatus 700 disclosed in FIG. 10, an external terminal 737 for the reference potential Vss can be disposed at the lower side of the imaging region 722.

Meanwhile, in the imaging region 722, pixels including photodiodes and pixel transistors are arranged. Therefore, in the case of a structure in which only one layer of the semiconductor substrate 741 in which a transistor circuit is formed is provided, it is difficult to also form an input circuit within the pixel region on the semiconductor substrate 741 in which pixels are formed. Therefore, in the solid-state imaging apparatus 700 including only one layer of the semiconductor substrate 741 disclosed in FIG. 10, while a power supply terminal for which an input/output circuit is not required can be disposed at the lower side of the pixel region, an external terminal for which an input circuit or an output circuit is required, in other words, an external terminal for signal input or for signal output cannot be disposed.

Further, the solid-state imaging apparatus 700 in FIG. 10 does not include a protective substrate on the on-chip lens 12 as with the case of the solid-state imaging apparatus 600 illustrated in FIG. 9. Therefore, there arises a problem that the on-chip lens 12 is damaged when the external terminal is bonded with pressure.

Meanwhile, the solid-state imaging apparatus 1 includes a structure in which a plurality of semiconductor substrates on which transistor circuits are formed are laminated. By this means, it becomes possible to dispose the external terminal 14 for which an input circuit or an output circuit is required, in other words, a signal input/output terminal 14C for signal input or for signal output, at the lower side of the pixel region. Further, the solid-state imaging apparatus 1 has a protective substrate 18 on the on-chip lens 16. Therefore, it becomes possible to form the external terminal 14 without pressing the on-chip lens 16 into the manufacturing apparatus of the external terminal 14. By this means, the solid-state imaging apparatus 1 can employ a structure in which (1) the external terminal 14, (2) a semiconductor region in which the input circuit unit 42 or the output circuit unit 47 connected to the external terminal 14 is formed, (3) a semiconductor region in which the photodiode 51 which performs imaging and the pixel transistor are formed, (4) the color filter 15 and the on-chip lens 16, and (5) the protective substrate 18 are laminated in substantially the same region, so that it is possible to make the outline size smaller than that of the solid-state imaging apparatus 700 in FIG. 10.

Comparative Example 3

Figure 11:
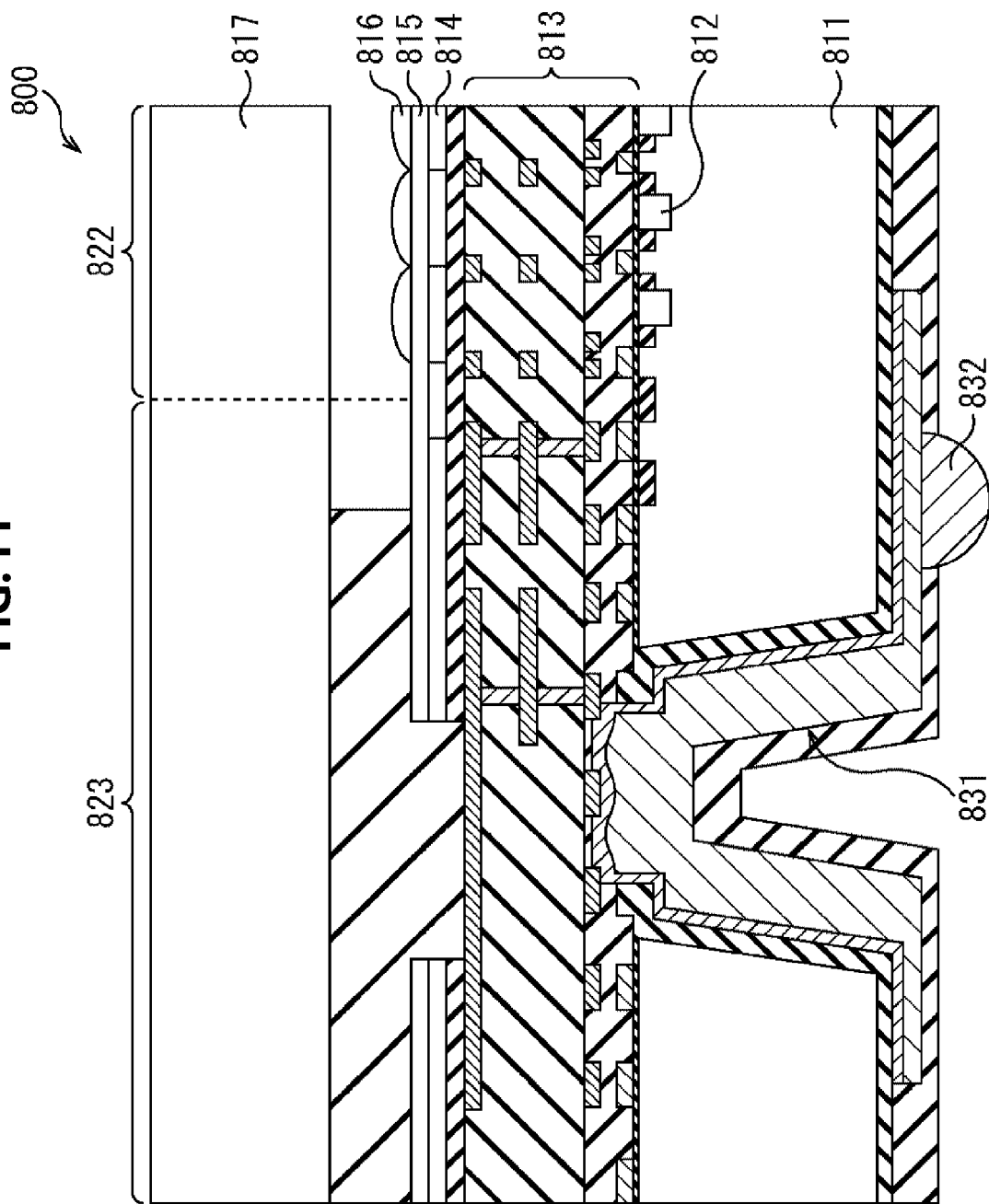
FIG. 11 is a diagram illustrating a cross-section of a solid-state imaging apparatus in a final shape as comparative example 3.

FIG. 11 is a diagram illustrating a cross-section of the solid-state imaging apparatus in a final shape disclosed in JP 2011-9645A (comparative structure disclosing literature 3) as comparative example 3.

In the solid-state imaging apparatus 800 in FIG. 11, an imaging element 812 including a photodiode and a transistor is formed on a first main surface (upper surface) of the semiconductor substrate 811. At the upper side of the imaging element 812, a multilayer wiring layer 813, a color filter 814, an overcoat 815 and an on-chip lens 816 are formed. Further, the solid-state imaging apparatus 800 includes a protective substrate 817 at the upper side of the on-chip lens 816.

Outside an imaging pixel unit 822 in which the imaging element 812, the color filter 814 and the on-chip lens 816 are formed, a peripheral circuit unit 823 in which a through-silicon via 831 which penetrates through the semiconductor substrate 811, an external terminal (solder ball) 832 connected to the outside, or the like, are formed is disposed.

The solid-state imaging apparatus 800 in FIG. 11 is a solid-state semiconductor apparatus which does not include a laminate structure in which the upper structure and the lower structure are laminated, in other words, includes only one layer of a semiconductor substrate on which a transistor circuit is formed as with the case of the solid-state imaging apparatus 700 in comparative example 2. Therefore, an external terminal for which an input circuit or an output circuit is required, in other words, an external terminal for signal input or for signal output cannot be disposed at the lower side of the pixel region.

Meanwhile, the solid-state imaging apparatus 1 employs a structure in which a plurality of semiconductor substrates in which transistor circuits are formed are laminated. By this means, it becomes possible to dispose the external terminal 14 for which an input circuit or an output circuit is required, in other words, the external terminal 14 for signal input or for signal output at the lower side of the pixel region. By this means, the solid-state imaging apparatus 1 can employ a structure in which (1) the external terminal 14, (2) a semiconductor region in which the input circuit unit 42 or the output circuit unit 47 connected to the external terminal 14 is formed, (3) a semiconductor region in which the photodiode 51 which performs imaging and a pixel transistor are formed, (4) the color filter 15 and the on-chip lens 16, and (5) the protective substrate 18 are laminated in substantially the same region, so that it is possible to make the outline size smaller than that of the solid-state imaging apparatus 800 in FIG. 11.

Further, in the case where the through silicon via 831 is formed only at an apparatus circumferential portion (peripheral circuit unit 823) as with the case of the solid-state imaging apparatus 800 in FIG. 11, a power supply terminal or a grounding terminal are also disposed only at an apparatus circumferential portion in a similar manner. In this case, it is necessary to dispose a number of power supply terminals and grounding terminals to take measures against IR drop and wiring delay. Meanwhile, in the solid-state imaging apparatus 1, because a through hole via 88 can be disposed in an arbitrary region of the lower structure 12 at an inner side of an upper and lower substrate connection region 314, part of them can be used as a power supply terminal or for an earth terminal. That is, the power supply terminal or the earth terminal can be also disposed in an arbitrary region. By this means, it is possible to make the number of power supply terminals and earth terminals smaller than that in the case where a through silicon via is disposed only at a circumferential portion. By this means, it is possible to reduce an overall circuit area of the solid-state imaging apparatus 1.

<Difference Between Solid-State Imaging Apparatus in FIG. 1 and Comparative Examples>

In the solid-state imaging apparatus 1, with a structure in which (1) the external terminal 14, (2) a semiconductor region in which the input circuit unit 42 or the output circuit unit 47 connected to the external terminal 14 is formed, (3) a semiconductor region in which the photodiode 51 which performs imaging and the pixel transistor are formed, (4) the color filter 15 and the on-chip lens 16, and (5) the protective substrate 18 are laminated in substantially the same region, it is possible to make outline size smaller.

In the case of the solid-state imaging apparatus having a semiconductor laminate structure which does not include a protective substrate, described in comparative example 1 and comparative example 2, there is a possibility that an on-chip lens may be damaged. That is, there is an obstructive factor in obtaining a solid-state imaging apparatus having an outline size equal to that of the present technology by employing a structure in which the above-described (1) to (4) are laminated in substantially the same region. That is to say, functions and operation of "realizing a small solid-state imaging apparatus by laminating the above-described (1) to (4) in substantially the same region" cannot be obtained by a solid-state imaging apparatus having a semiconductor laminate structure which does not include a protective substrate described in comparative example 1 and comparative example 2.

In the case of a solid-state imaging apparatus which includes only one layer of the semiconductor substrate in which a transistor circuit is formed described in comparative example 3, it is impossible to realize a solid-state imaging apparatus having an outline size equal to that in the present technology by employing a structure in which the above-described (1) to (5) are laminated in substantially the same region. In other words, there is an obstructive factor. That is to say, functions and operation of "realizing a small solid-state imaging apparatus by laminating the above-described (1) to (5) in substantially the same region" cannot be obtained by the solid-state imaging apparatus which includes only one layer of the semiconductor substrate in which a transistor circuit is formed described in comparative example 3.

In this manner, functions and operation of "realizing a solid-state imaging apparatus having a smaller outline size by employing a structure in which the above-described (1) to (5) are laminated in substantially the same region, than that of a solid-state imaging apparatus which does not include this structure" can be neither obtained from a configuration of a "solid-state imaging apparatus having a semiconductor laminate structure which does not include a protective substrate" described in comparative example 1 and comparative example 2 alone, nor can be obtained from a configuration of a "solid-state imaging apparatus which includes only one layer of a semiconductor substrate in which a transistor circuit is formed" described in comparative example 3 alone.

9. Other Circuit Arrangement Configuration Example of Solid-State Imaging Apparatus <Third Circuit Arrangement Configuration Example>

Figure 12:
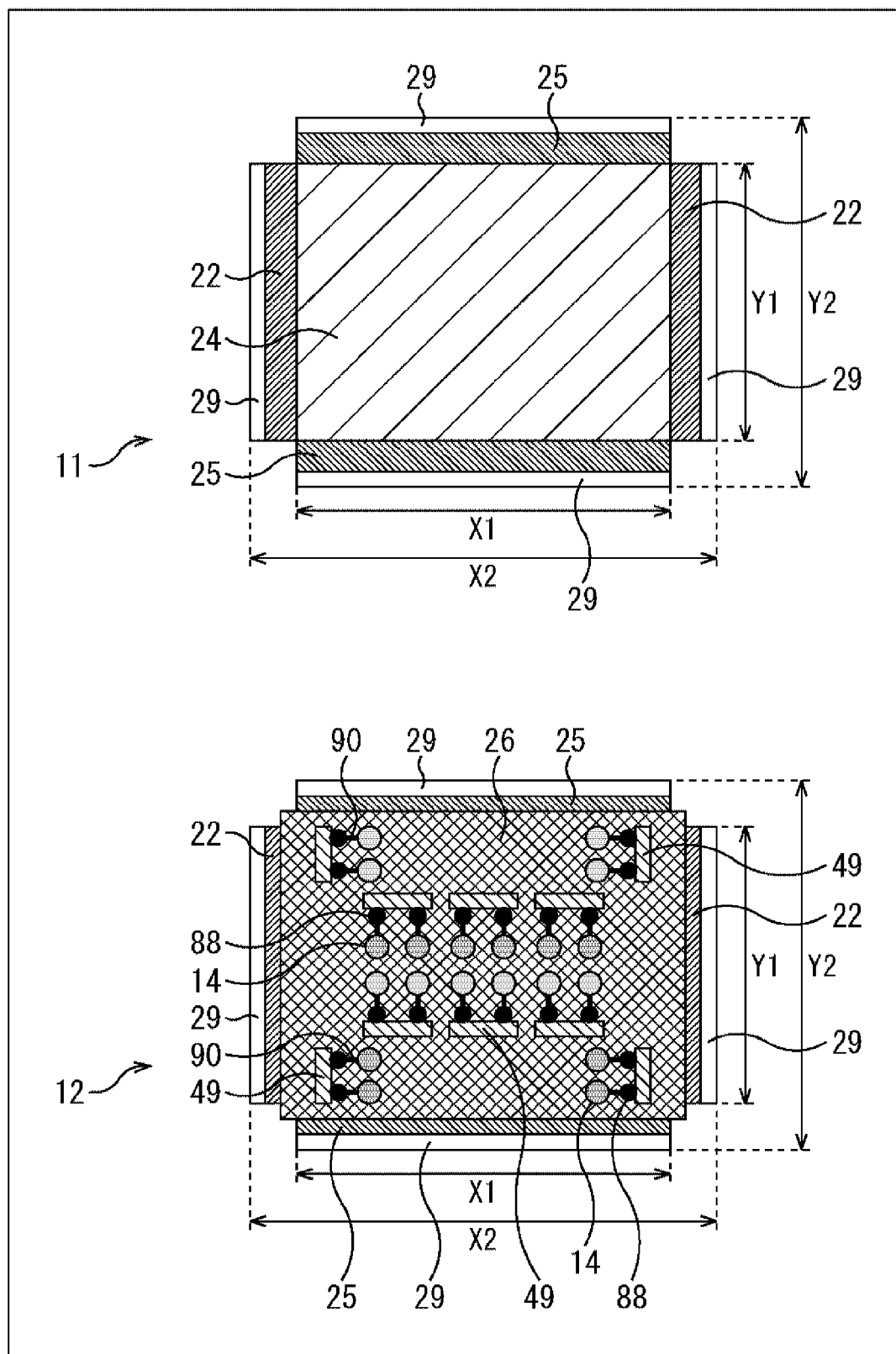
FIG. 12 is a diagram illustrating a third circuit arrangement configuration example of circuit arrangement in the solid-state imaging apparatus.

FIG. 12 is a Diagram Illustrating Another Circuit Arrangement Configuration Example of the solid-state imaging apparatus 1, that is, a third circuit arrangement configuration example which is a modification of the first circuit arrangement configuration example.

In the first circuit arrangement configuration example illustrated in FIG. 5, the input/output circuit units 49 are respectively disposed for each one external terminal 14. The image signal processing unit 26 encloses each of the input/output circuit units 49.

Meanwhile, in the third circuit arrangement configuration example illustrated in FIG. 12, the input/output circuit units 49 are collectively disposed for each group of a plurality of external terminals 14. Inside one region of the input/output circuit unit 49, for example, the input/output circuit unit 49 of one external terminal 14 and the input/output circuit unit 49 of the other external terminal 14 are disposed in contact with each other, and an image signal processing unit 26 is not disposed between these input/output circuit units 49. Because portions where units are disposed between separated wells having different power supply voltages become less in the third arrangement configuration example in which a plurality of input/output circuit units 49 having the same power supply voltage are collectively disposed as one input/output circuit unit region than in the first circuit arrangement configuration example in which the input/output circuit unit 49 and the image signal processing unit 26 having different power supply voltages are alternately disposed adjacent to each other, even if an outline size of the solid-state imaging apparatus 1 is the same, there is a possibility that, for example, more circuits can be mounted on the image signal processing unit 26 in the lower structure 12.

Further, in the third circuit arrangement configuration example illustrated in FIG. 12, part of the input/output circuit unit 49 may be disposed at the lower side of the pixel peripheral circuit unit included in the upper structure 11, for example, at the lower side of the row drive unit 22 included in the upper structure 11 or outside a region where the image signal processing unit 26 included in the lower structure 12 is disposed instead of being disposed at the lower side of the pixel array unit 24 included in the upper structure 11. By this means, even if the outline size of the solid-state imaging apparatus 1 is the same, there is a possibility that, for example, more circuits can be mounted on the image signal processing unit 26 in the lower structure 12.

<Fourth Circuit Arrangement Configuration Example>

Figure 13:
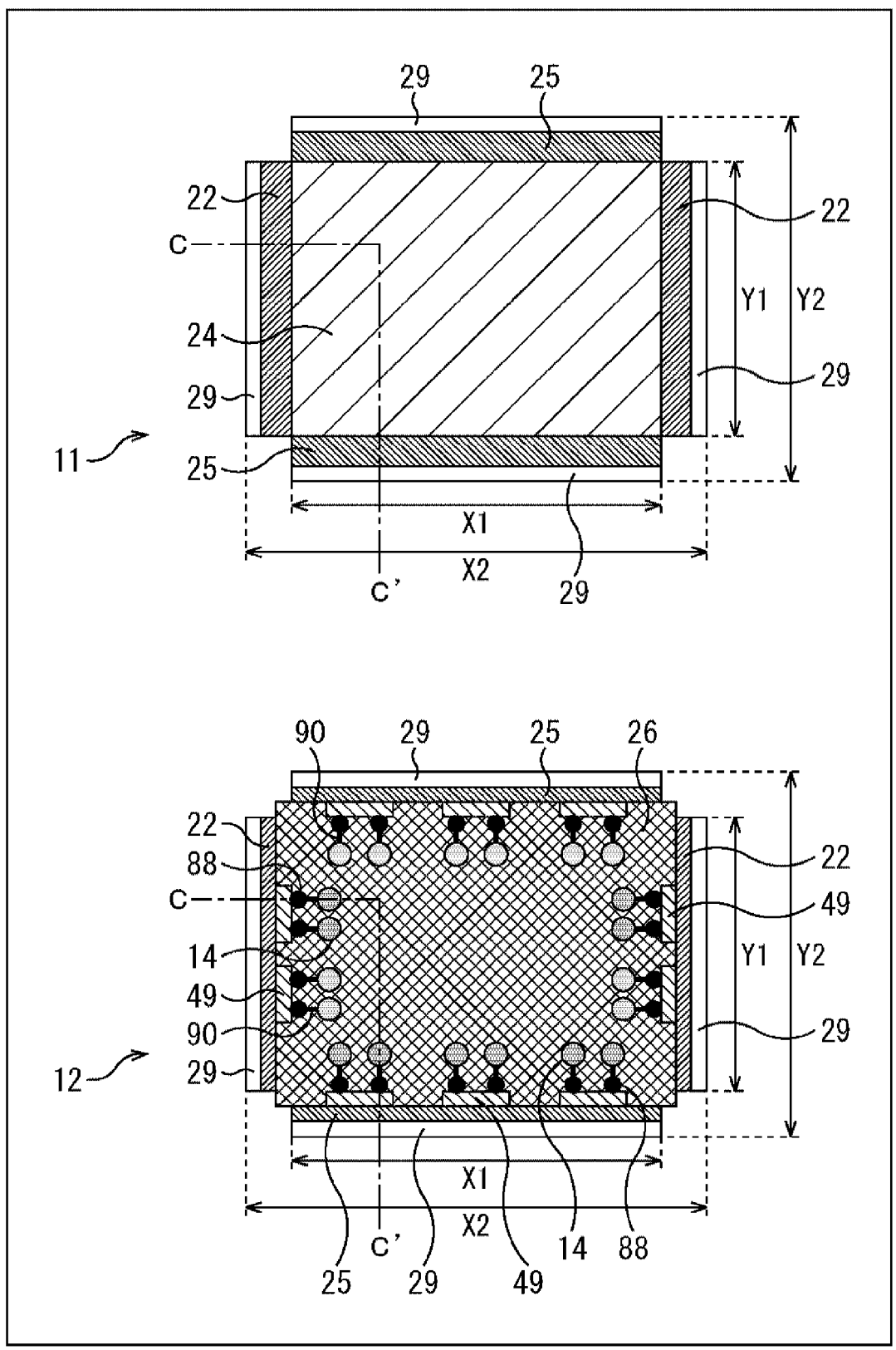
FIG. 13 is a diagram illustrating a fourth circuit arrangement configuration example of circuit arrangement in the solid-state imaging apparatus.

FIG. 13 is a diagram illustrating another circuit arrangement configuration example of the solid-state imaging apparatus 1, that is, a fourth circuit arrangement configuration example which is a modification of the first and third circuit arrangement configuration examples.

Figure 14:
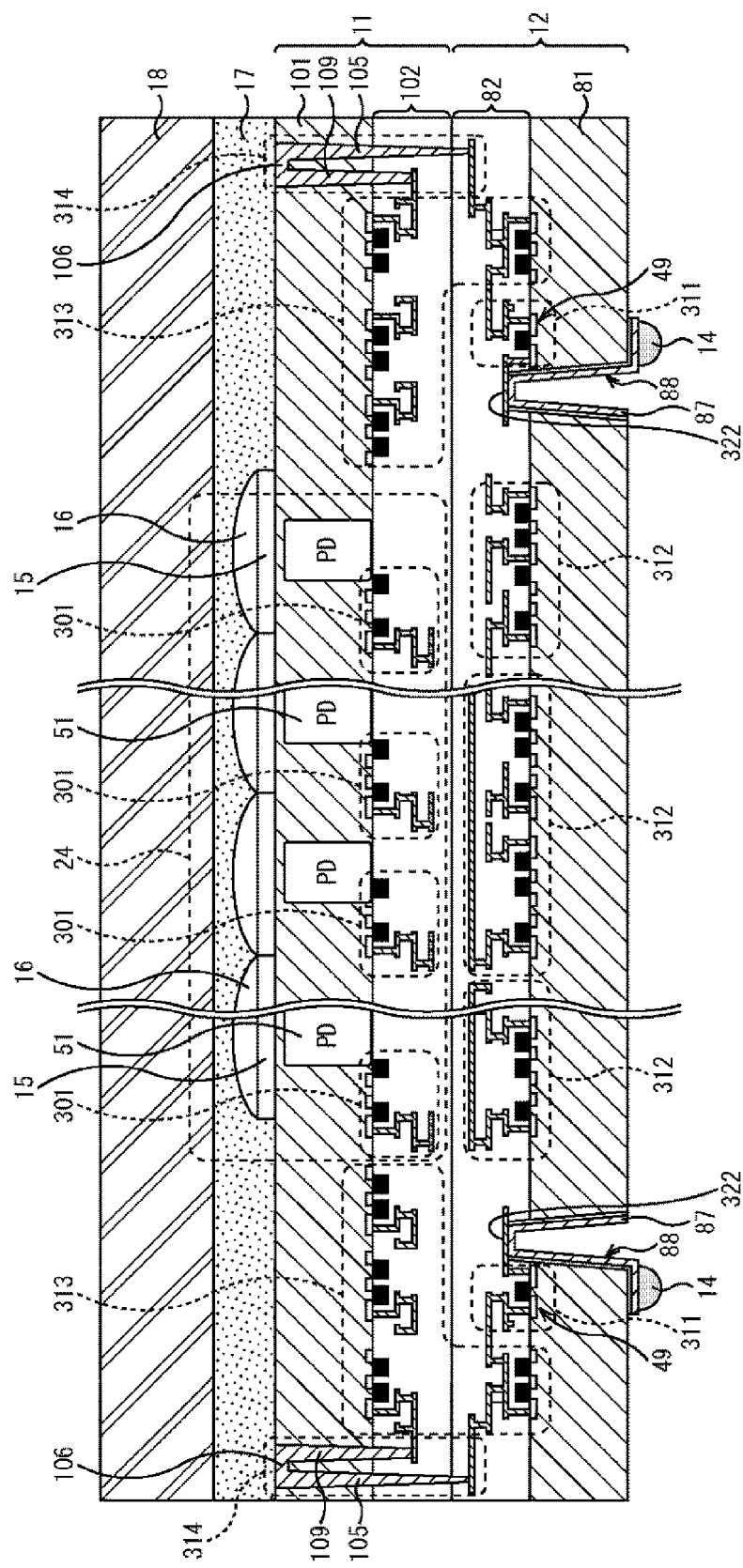
FIG. 14 is a diagram illustrating a cross-sectional structure in line C-C' in FIG. 13.

FIG. 14 is a diagram illustrating a cross-sectional structure according to the solid-state imaging apparatus 1 in line C-C' in FIG. 13. Note that, for convenience sake, part of FIG. 14 is replaced with a cross-sectional structure in another configuration example of the present technology which will be described later.

In the fourth circuit arrangement configuration example illustrated in FIG. 13 and FIG. 14, the input/output circuit unit 49, in other words, all of the input circuit unit 42 and the output circuit unit 47 is disposed at a circumferential portion of a region where the image signal processing unit 26 included in the lower structure 12 is disposed. The region where the input/output circuit unit 49 is disposed may be at the lower side of the row drive unit 22 and the column signal processing unit 25 (pixel peripheral circuit region 313) included in the upper structure 11 or may be at the lower side of the circumferential portion of the pixel array unit 24 included in the upper structure 11.

Note that a region where the input/output circuit unit 49 is disposed, for example, does not have to be seamlessly disposed over a row direction of the column signal processing unit 25, and there may be a region where the input/output circuit unit 49 is not disposed between the column signal processing unit 25 and the image signal processing unit 26.

Further, a region where the input/output circuit unit 49 is disposed does not have to be seamlessly disposed over a column direction of the row drive unit 22, and, there may be a region where the input/output circuit unit 49 is not disposed between the row drive unit 22 and the image signal processing unit 26.

Because portions where units are disposed between separated wells having different power supply voltages become less in the fourth circuit arrangement configuration example than in the third circuit arrangement configuration example, even if the outline size of the solid-state imaging apparatus 1 is the same, there is a possibility that, for example, more circuits can be mounted on the image signal processing unit 26 in the lower structure 12.

<Fifth Circuit Arrangement Configuration Example>

Figure 15:
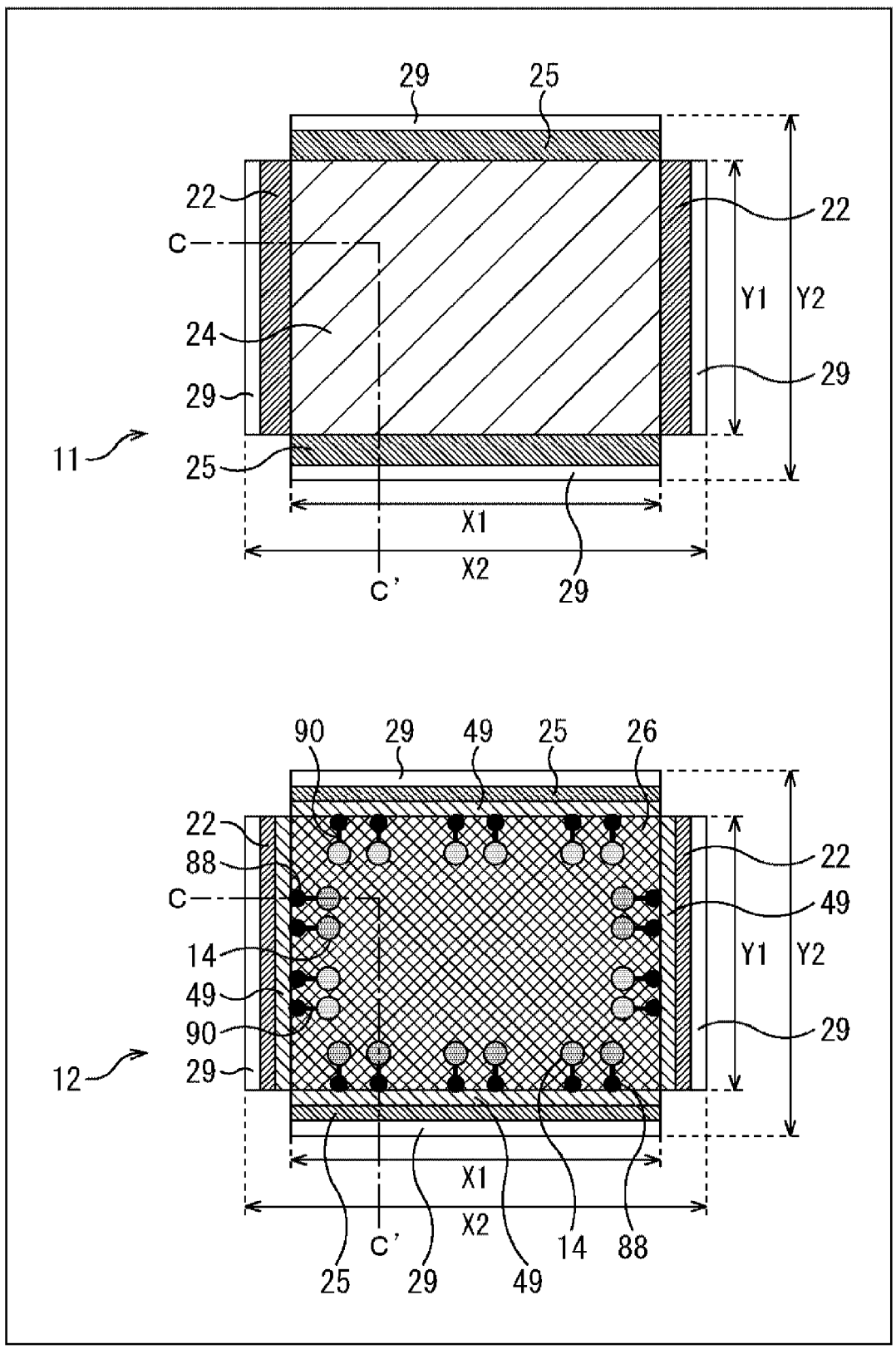
FIG. 15 is a diagram illustrating a fifth circuit arrangement configuration example of circuit arrangement in the solid-state imaging apparatus.

FIG. 15 is a diagram illustrating another circuit arrangement configuration example of the solid-state imaging apparatus 1, that is, a fifth circuit arrangement configuration example which is a modification of the first, third, and fourth circuit arrangement configuration examples.

In the fourth circuit arrangement configuration example illustrated in FIG. 13, there is a region where the input/output circuit unit 49 is not disposed between the column signal processing unit 25 and the image signal processing unit 26 or between the row drive unit 22 and the image signal processing unit 26.

Meanwhile, in the fifth circuit arrangement configuration example illustrated in FIG. 15, the input/output circuit unit 49 is disposed in a line over a row direction of the column signal processing unit 25 or over a column direction of the row drive unit 22. By this means, there is a possibility that an area of the input/output circuit unit 49 can be made larger.

Further, in the fifth circuit arrangement configuration example, even if the outline size is the same as the size of the solid-state imaging apparatus 1 in the first and the third circuit arrangement configuration examples, there is a possibility that, for example, more circuits can be mounted on the image signal processing unit 26 in the lower structure 12.

<Sixth Circuit Arrangement Configuration Example>

Figure 16:
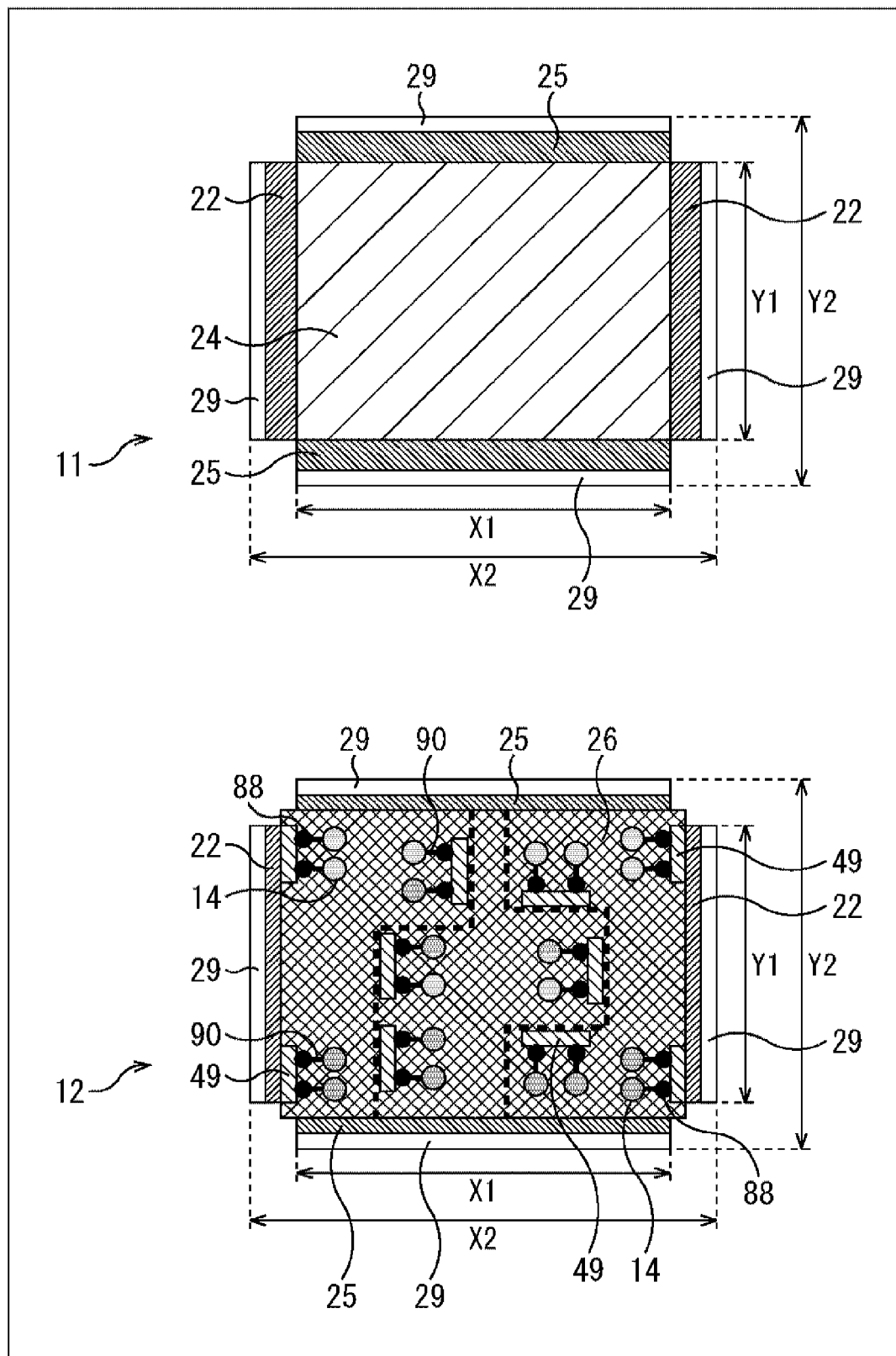
FIG. 16 is a diagram illustrating a sixth circuit arrangement configuration example of circuit arrangement in the solid-state imaging apparatus.

FIG. 16 is a diagram illustrating another circuit arrangement configuration example of the solid-state imaging apparatus 1, that is, a sixth circuit arrangement configuration example which is a modification of the first and third circuit arrangement configuration examples.

In the first and the third circuit arrangement configuration examples, the input/output circuit unit 49 is disposed in a region which becomes a lower side of the pixel array unit 24 of the upper structure 11 in the lower structure 12, and the image signal processing unit 26 is disposed around the input/output circuit unit 49.

In the sixth circuit arrangement configuration example in FIG. 16, the image signal processing unit 26 of the lower structure 12 is disposed to employ a configuration including a plurality of (three in FIG. 16) circuit blocks divided with dashed line. In the sixth circuit arrangement configuration example, the input/output circuit unit 49 is disposed at a portion which becomes a block boundary of circuit blocks provided at the image signal processing unit 26 or a boundary with the row drive unit 22.

In the case where the image signal processing unit 26 is disposed while being divided into a plurality of circuit blocks, there is a case where a power supply line to a circuit provided at each circuit block and an earth wire are disposed at a block boundary portion. Therefore, there is a case where a distance between circuits at the block boundary portion is made larger than a distance between circuits inside a circuit block. In this manner, by disposing the input/output circuit unit 49 at a boundary portion of the circuit block where circuit density is relatively low, there is a possibility that the input/output circuit unit 49 can be disposed with easier layout design of the circuit and without substantially decreasing an integration degree of a circuit than in the case where the input/output circuit unit 49 is disposed inside the circuit block. By this means, even if the outline size of the solid-state imaging apparatus 1 is the same, by using the sixth circuit arrangement configuration example, there is a possibility that, for example, more circuits can be mounted on the image signal processing unit 26 in the lower structure 12.

<Seventh Circuit Arrangement Configuration Example>

Figure 17:
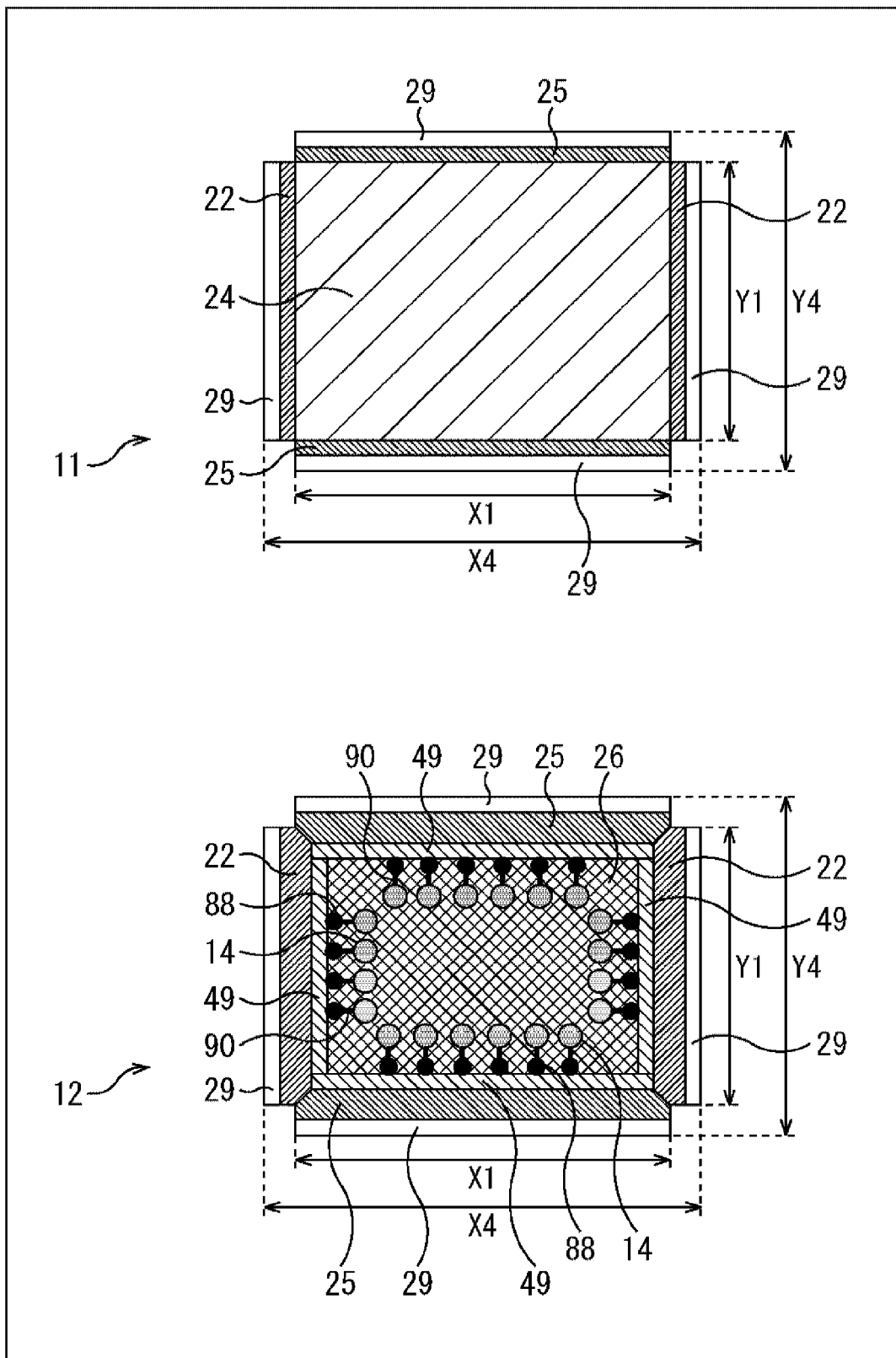
FIG. 17 is a diagram illustrating a seventh circuit arrangement configuration example of circuit arrangement in the solid-state imaging apparatus.

FIG. 17 is a diagram illustrating another circuit arrangement configuration example of the solid-state imaging apparatus 1, that is, a seventh circuit arrangement configuration example which is a modification of the fifth circuit arrangement configuration example.

In the seventh circuit arrangement configuration example in FIG. 17, the row drive unit 22 disposed in the upper structure 11 is formed to have a larger area than an area of the row drive unit 22 disposed in the lower structure 12. Further, the row drive unit 22 disposed in the lower structure 12 is disposed extending longer in an inward direction of the apparatus than the row drive unit 22 disposed in the upper structure 11.

In a similar manner, the column signal processing unit 25 disposed in the lower structure 12 is formed to have a larger area than an area of the column signal processing unit 25 disposed in the upper structure 11. Further, the column signal processing unit 25 disposed in the lower structure 12 is disposed extending longer in the inward direction of the apparatus than the column signal processing unit 25 disposed in the upper structure 11.

By this means, in the seventh circuit arrangement configuration example, even if the size of the pixel array unit 24 of the solid-state imaging apparatus 1 is the same, there is a possibility that the outline size of the solid-state imaging apparatus 1 can be made smaller than that in the fifth circuit arrangement configuration example illustrated in FIG. 15.

Note that the arrangement example of the row drive unit 22 and the column signal processing unit 25 described in the seventh circuit arrangement configuration example can be applied to other configuration examples of the present technology.

<Eighth Circuit Arrangement Configuration Example>

Figure 18:
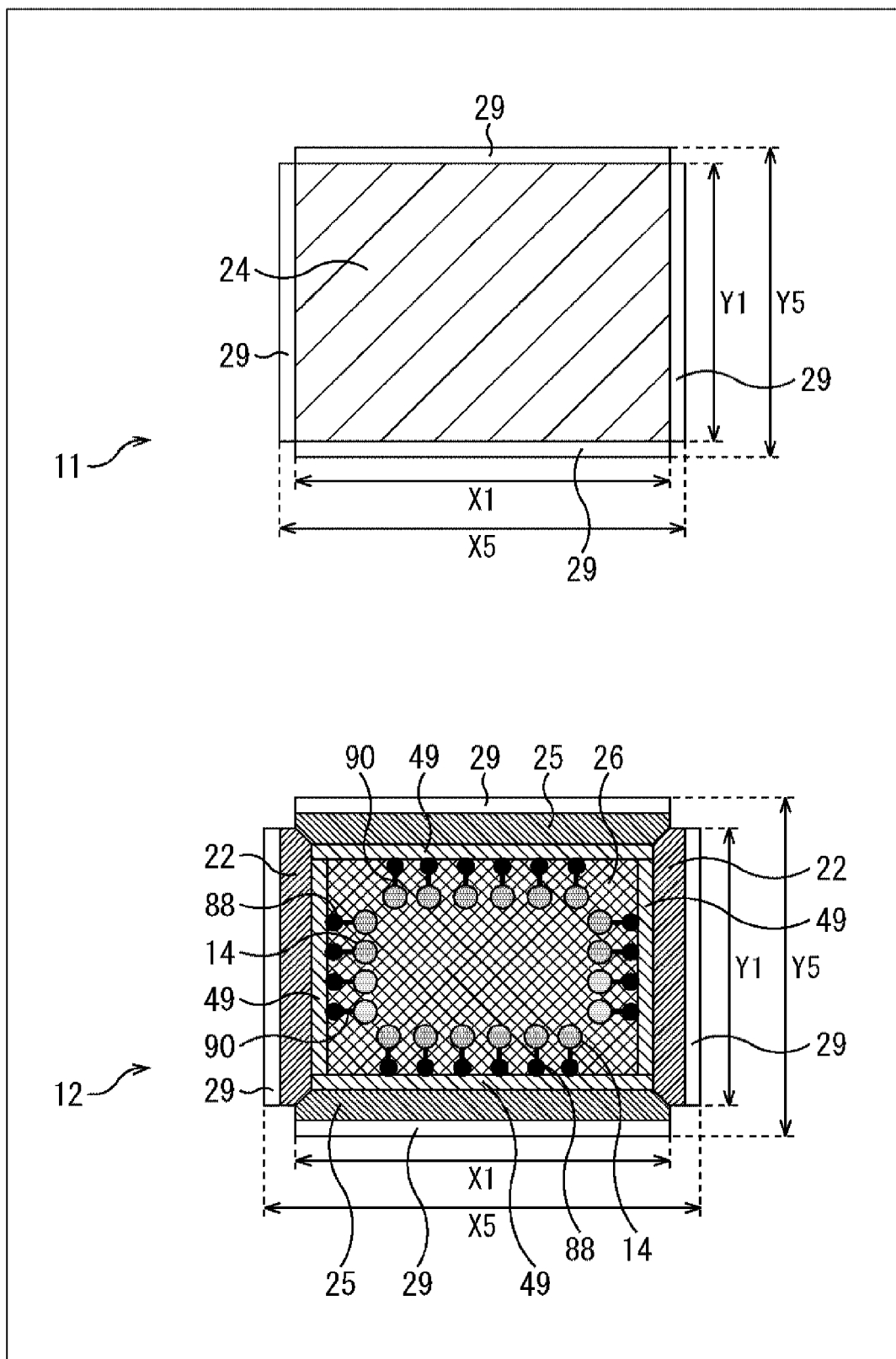
FIG. 18 is a diagram illustrating an eighth circuit arrangement configuration example of circuit arrangement in the solid-state imaging apparatus.

FIG. 18 is a diagram illustrating another circuit arrangement configuration example of the solid-state imaging apparatus 1, that is, an eighth circuit arrangement configuration example which is a modification of the seventh circuit arrangement configuration example.

In the seventh circuit arrangement configuration example illustrated in FIG. 17, the row drive unit 22 is also disposed in the upper structure 11 although the area of the row drive unit 22 disposed in the upper structure 11 is smaller than the area of the row drive unit 22 disposed in the lower structure 12. In a similar manner, the column signal processing unit 25 is also disposed in the upper structure 11 although the area of the column signal processing unit 25 disposed in the upper structure 11 is smaller than the area of the column signal processing unit 25 disposed in the lower structure 12.

Meanwhile, in the eighth circuit arrangement configuration example in FIG. 18, the row drive unit 22 and the column signal processing unit 25 are disposed only in the lower structure 12. A signal output from the row drive unit 22 to the pixel array unit 24 is transmitted from the row drive unit 22 disposed in the lower structure 12 to the pixel array unit 24 disposed in the upper structure 11 via the wiring connecting unit 29 having the upper and lower wiring connection structure in the pixel peripheral circuit region 313 illustrated in FIG. 8. In a similar manner, a signal input from the pixel array unit 24 to the column signal processing unit 25 is transmitted from the pixel array unit 24 disposed in the upper structure 11 to the column signal processing unit 25 disposed in the lower structure 12 via the wiring connecting unit 29 having the upper and lower wiring connection structure in the pixel peripheral circuit region 313 illustrated in FIG. 8. By this means, compared to the seventh circuit arrangement configuration example illustrated in FIG. 17, in the eighth circuit arrangement configuration example, there is a possibility that the outline size of the solid-state imaging apparatus 1 can be made smaller even if the size of the pixel array unit 24 of the solid-state imaging apparatus 1 is the same.

Note that the arrangement example of the row drive unit 22 and the column signal processing unit 25 described in the eighth circuit arrangement configuration example can be applied to other configuration examples of the present technology.

<Ninth Circuit Arrangement Configuration Example>

Figure 19:
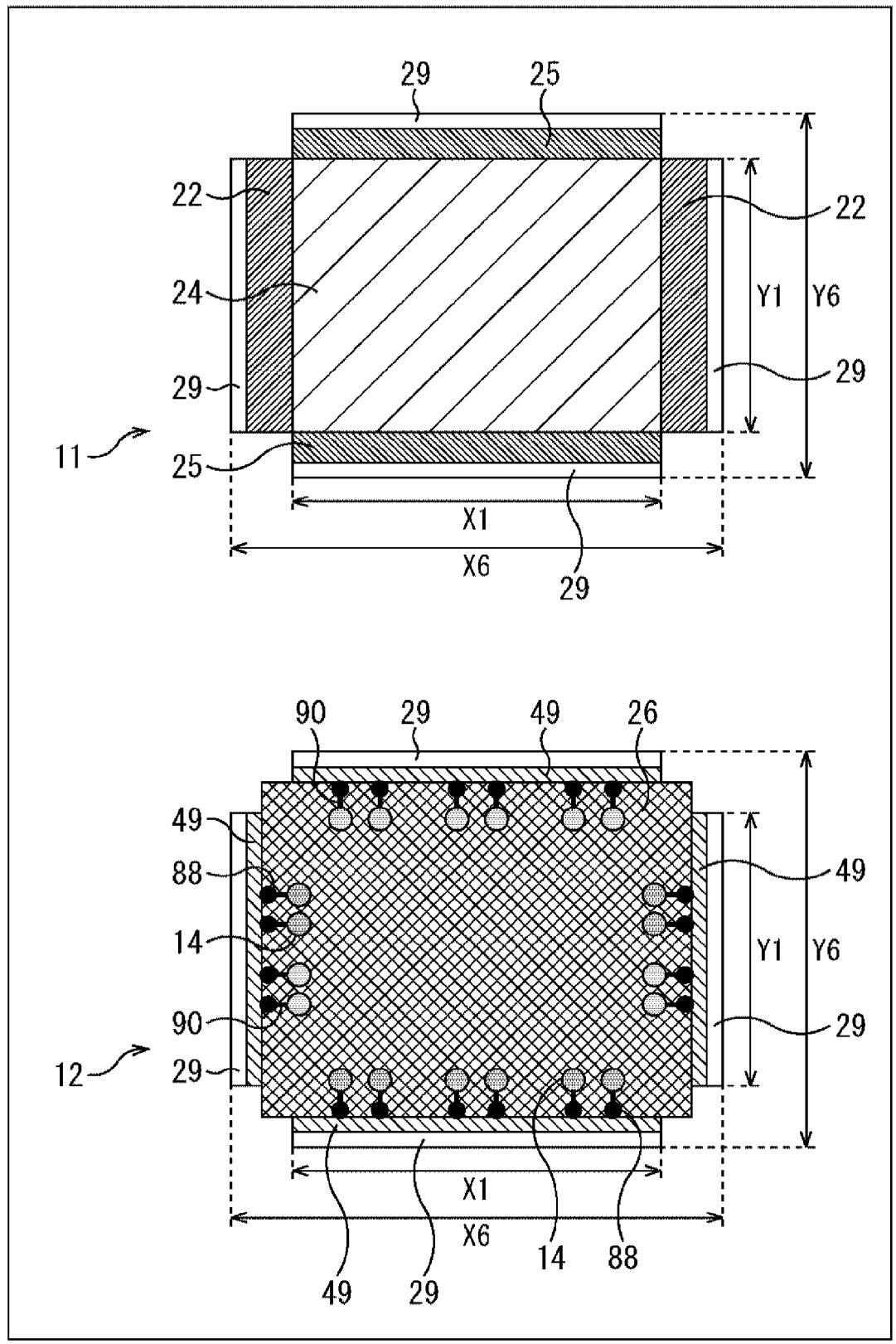
FIG. 19 is a diagram illustrating a ninth circuit arrangement configuration example of circuit arrangement in the solid-state imaging apparatus.

FIG. 19 is a diagram illustrating another circuit arrangement configuration example of the solid-state imaging apparatus 1, that is, a ninth circuit arrangement configuration example which is a modification of the fifth circuit arrangement configuration example.

In the ninth circuit arrangement configuration example illustrated in FIG. 19, the row drive unit 22 and the column signal processing unit 25 are all disposed in the upper structure 11. In the lower structure 12, in a region located at the lower side of the row drive unit 22 and the column signal processing unit 25 disposed in the upper structure 11, the image signal processing unit 26 is disposed extending longer in a circumferential direction than in the fifth circuit arrangement configuration example illustrated in FIG. 15. Further, the input/output circuit unit 49 may be disposed in a region located at the lower side of the row drive unit 22 and the column signal processing unit 25 disposed in the upper structure 11. By this means, even if the size of the pixel array unit 24 of the solid-state imaging apparatus 1 is the same, in the ninth circuit arrangement configuration example, there is a possibility that an area of the image signal processing unit 26 can be made larger and more circuit can be mounted on the image signal processing unit 26 than in the fifth circuit arrangement configuration example illustrated in FIG. 15.

Note that the arrangement example of the row drive unit 22 and the column signal processing unit 25 described in the ninth circuit arrangement configuration example can be applied to other configuration examples of the present technology.

<Tenth Circuit Arrangement Configuration Example>

Figure 20:
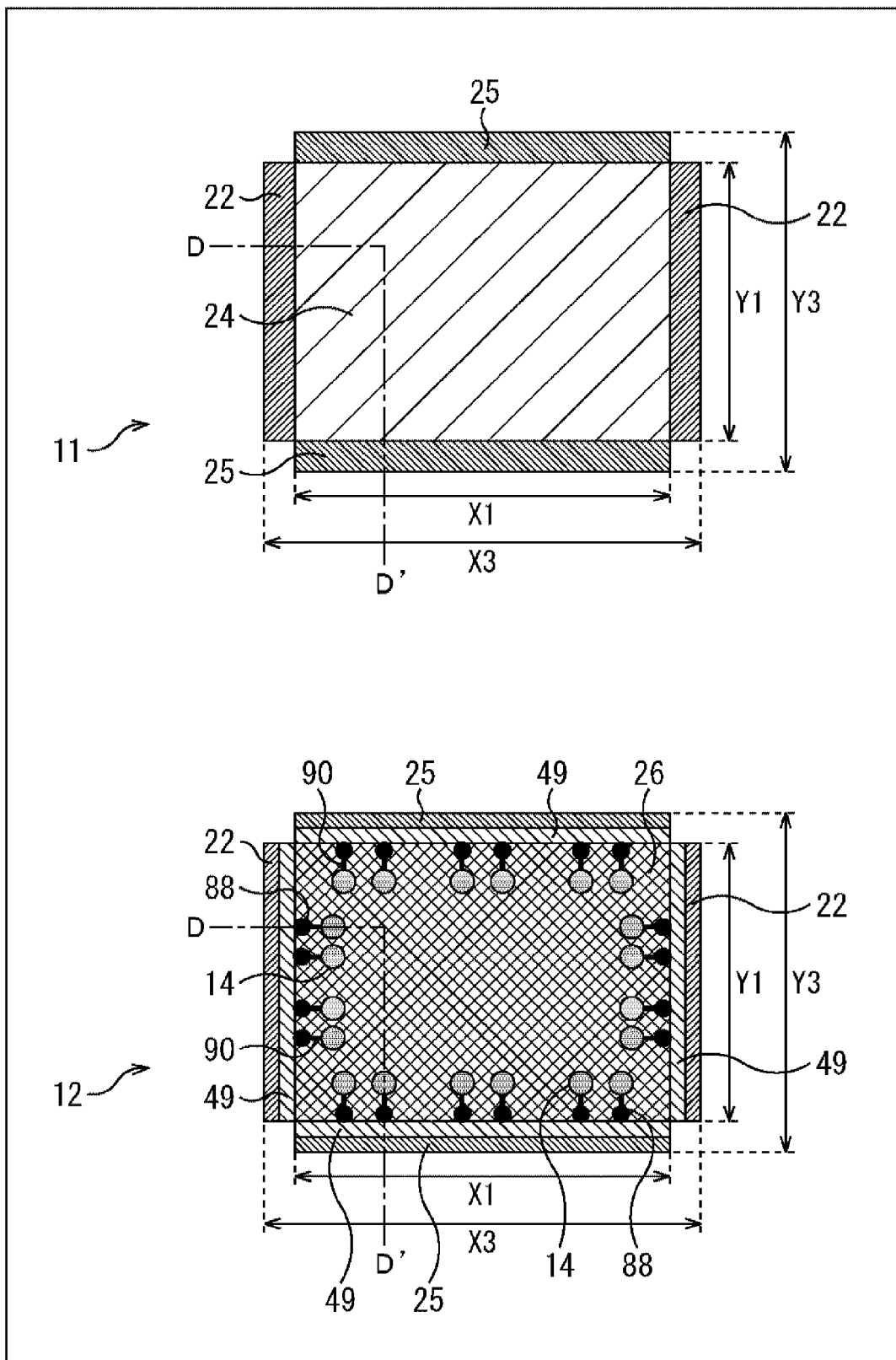
FIG. 20 is a diagram illustrating a tenth circuit arrangement configuration example of circuit arrangement in the solid-state imaging apparatus.

FIG. 20 is a diagram illustrating another circuit arrangement configuration example of the solid-state imaging apparatus 1, that is, a tenth circuit arrangement configuration example which is a modification of the second circuit arrangement configuration example.

Figure 21:
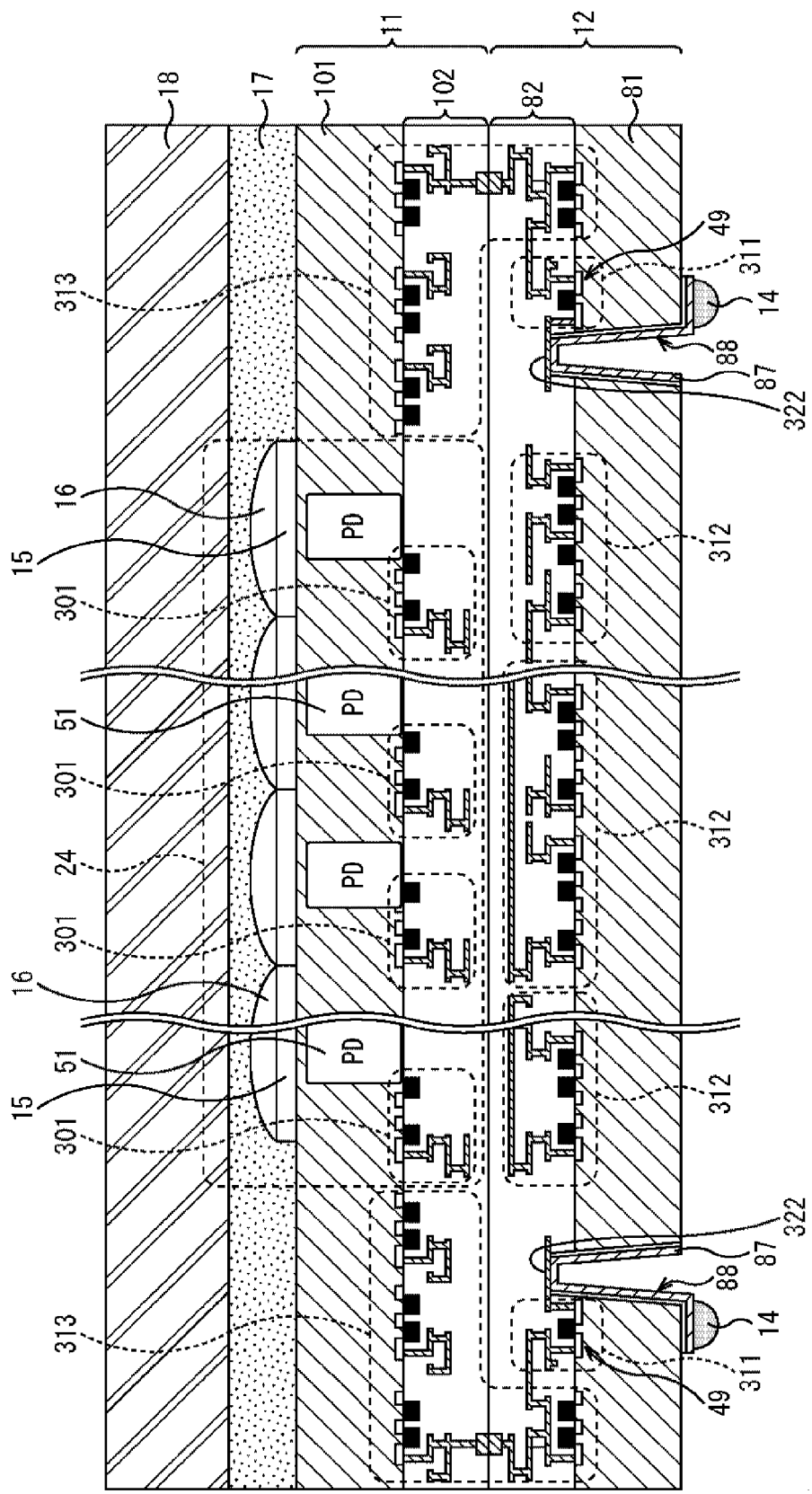
FIG. 21 is a diagram illustrating a cross-sectional structure in line D-D' in FIG. 20.

FIG. 21 is a diagram illustrating a cross-sectional structure according to the solid-state imaging apparatus 1 in line D-D' in FIG. 20. Note that, for convenience sake, part of FIG. 21 is replaced with a cross-sectional structure in another configuration example of the present technology which will be described later.

In the tenth circuit arrangement configuration example illustrated in FIG. 20 and FIG. 21, as with the case of the second circuit arrangement configuration example illustrated in FIG. 7 and FIG. 8, the upper and lower wiring connection structure can be disposed inside the pixel peripheral circuit region 313 provided in the upper structure 11 and inside the pixel peripheral circuit region 313 provided in the lower structure 12.

Further, in the tenth circuit arrangement configuration example illustrated in FIG. 20 and FIG. 21, the input/output circuit unit 49, in other words, all of the input circuit unit 42 and the output circuit unit 47 is disposed outside the region where the image signal processing unit 26 of the lower structure 12 is disposed. The region where the input/output circuit unit 49 is disposed may be at the lower side of the row drive unit 22 and the column signal processing unit 25 included in the upper structure 11 or may be at the lower side of the pixel array unit 24 included in the upper structure 11.

Note that a region where the input/output circuit unit 49 is disposed, for example, does not have to be seamlessly disposed over a row direction of the column signal processing unit 25, and there may be a region where the input/output circuit unit 49 is not disposed between the column signal processing unit 25 and the image signal processing unit 26.

Further, a region where the input/output circuit unit 49 is disposed does not have to be seamlessly disposed over a column direction of the row drive unit 22, and, there may be a region where the input/output circuit unit 49 is not disposed between the row drive unit 22 and the image signal processing unit 26. In the tenth circuit arrangement configuration example, even if the outline size is the same as the size of the solid-state imaging apparatus 1 in the second circuit arrangement configuration examples illustrated in FIG. 7, there is a possibility that, for example, more circuits can be mounted on the image signal processing unit 26 in the lower structure 12.

Note that the circuit arrangement example described in the tenth circuit arrangement configuration example can be also applied to other configuration examples of the present technology.

<Eleventh Circuit Arrangement Configuration Example>

Figure 22:
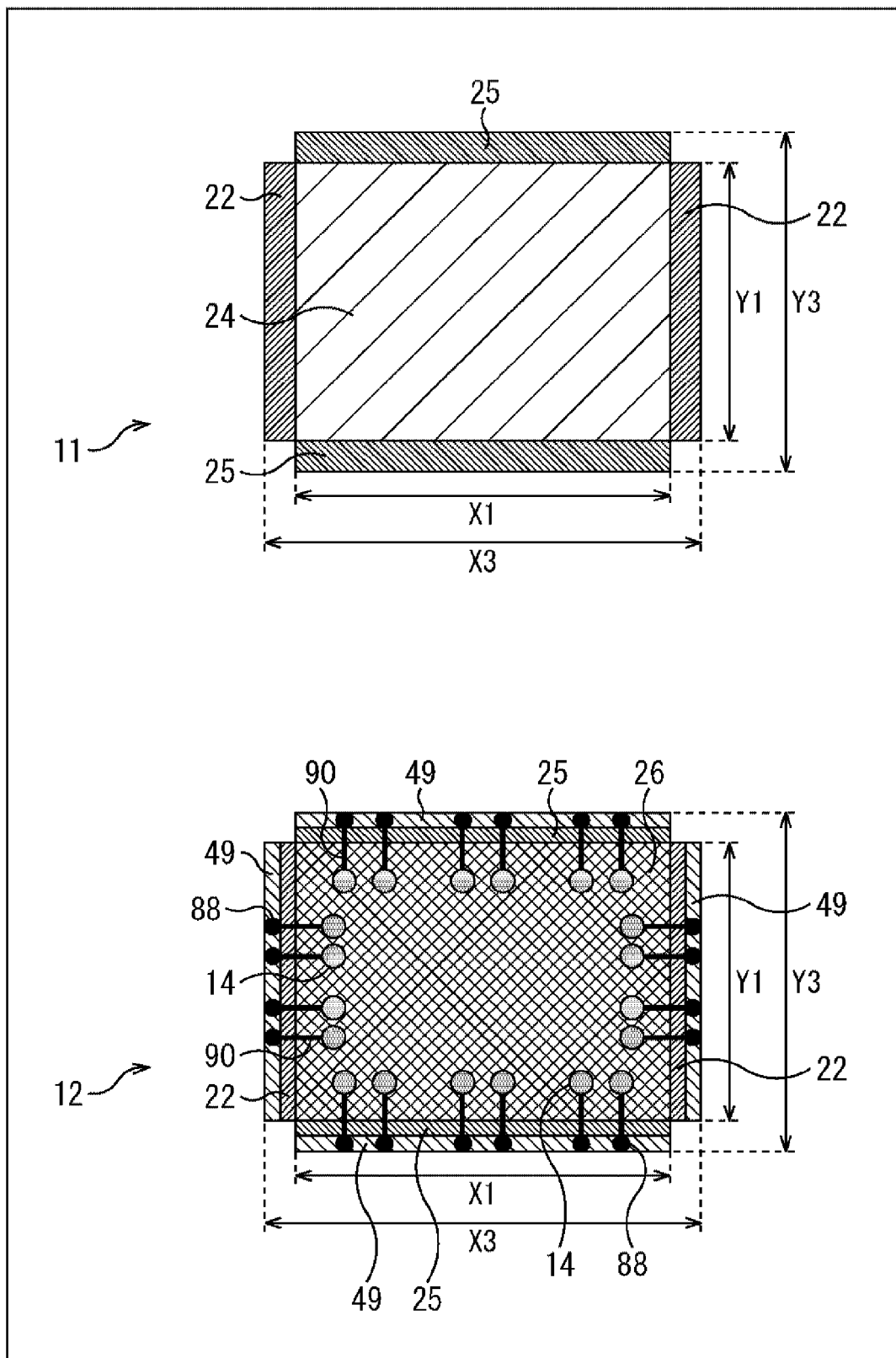
FIG. 22 is a diagram illustrating an eleventh circuit arrangement configuration example of circuit arrangement in the solid-state imaging apparatus.

FIG. 22 is a diagram of another circuit arrangement configuration example of the solid-state imaging apparatus 1, that is, an eleventh circuit arrangement configuration example which is a modification of the tenth circuit arrangement configuration example.

In the tenth circuit arrangement configuration example illustrated in FIG. 20, part of the row drive unit 22 and part of the column signal processing unit 25 are disposed in both the upper structure 11 and the lower structure 12. In the lower structure 12, the input/output circuit unit 49 is disposed in a region located at the lower side of the row drive unit 22 disposed in the upper structure 11, and in a region at an inner side of the apparatus from the row drive unit 22 disposed in the lower structure 12. In a similar manner, in the lower structure 12, the input/output circuit unit 49 is disposed in a region located at a lower side of the column signal processing unit 25 disposed in the upper structure 11 and in a region at an inner side of the apparatus from the column signal processing unit 25 disposed in the lower structure 12.

In the eleventh circuit arrangement configuration example illustrated in FIG. 22, part of the row drive unit 22 and part of the column signal processing unit 25 are disposed in both the upper structure 11 and the lower structure 12. In the lower structure 12, the input/output circuit unit 49 is disposed in a region located at the lower side of the row drive unit 22 disposed in the upper structure 11 and in a region at an outer side of the apparatus from the row drive unit 22 disposed in the lower structure 12. In a similar manner, in the lower structure 12, the input/output circuit unit 49 is disposed in a region at the lower side of the column signal processing unit 25 disposed in the upper structure 11 and in a region at an outer side of the apparatus from the column signal processing unit 25 disposed in the lower structure 12.

By this means, compared to the tenth circuit arrangement configuration example illustrated in FIG. 20, for example, in the lower structure 12, there is a possibility that a signal line between the image signal processing unit 26 and the row drive unit 22 disposed in the lower structure 12 and a signal line between the image signal processing unit 26 and the column signal processing unit 25 can be easily disposed or these signal lines can be densely disposed.

Note that the circuit arrangement example described in the eleventh circuit arrangement configuration example can be also applied to other configuration examples of the present technology.

10. Detailed Structure of Solid-State Imaging Apparatus

Figure 23:
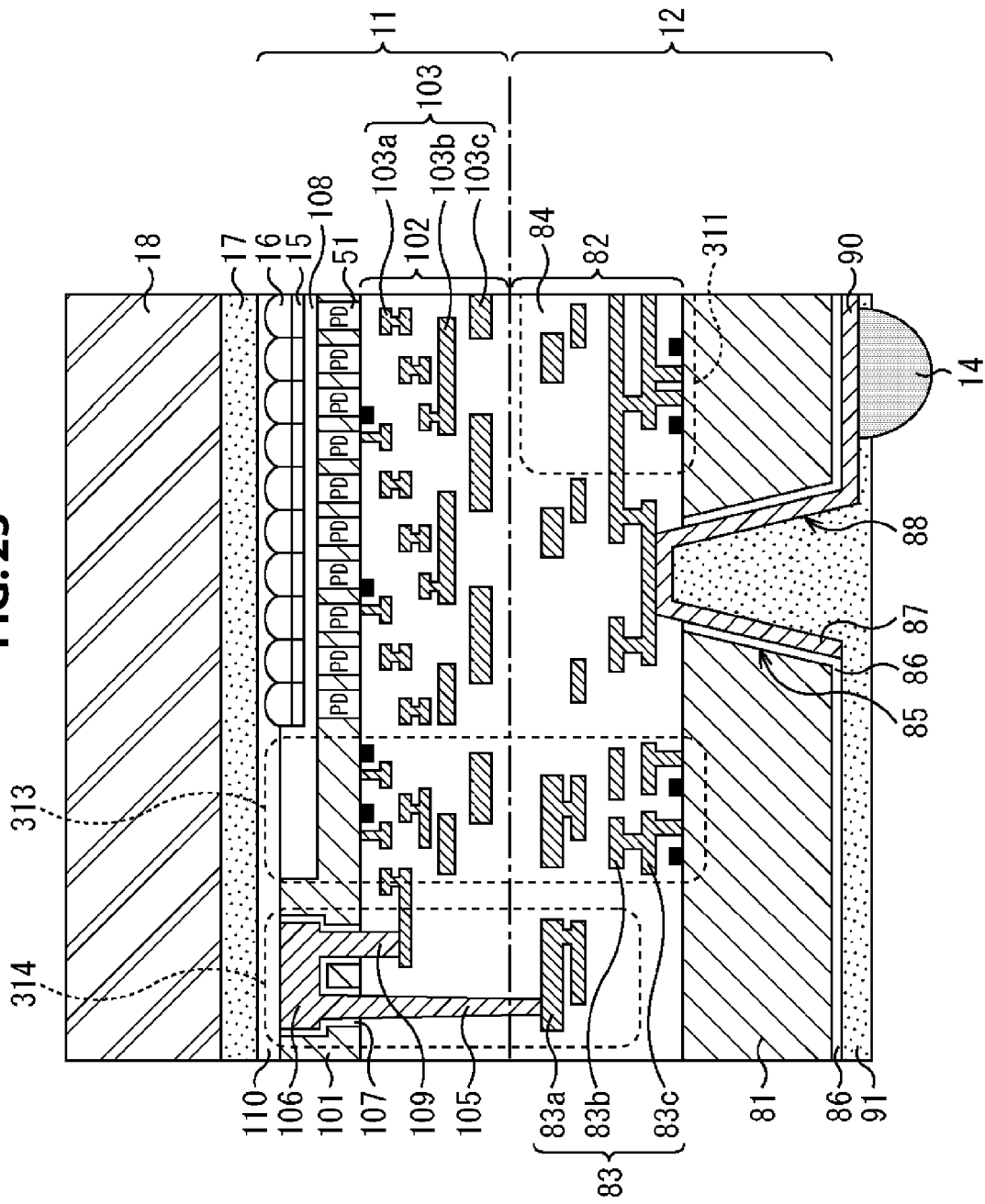
FIG. 23 is an enlarged cross-sectional diagram illustrating a portion around a circumference of the solid-state imaging apparatus 1.

A detailed structure of the solid-state imaging apparatus 1 will be described next with reference to FIG. 23. FIG. 23 is an enlarged cross-sectional diagram illustrating a portion around a circumference of the solid-state imaging apparatus 1 including a twin contact structure.

In the lower structure 12, a multilayer wiring layer 82 is formed at an upper side (the upper structure 11 side) of the semiconductor substrate 81 formed with, for example, silicon (Si). With this multilayer wiring layer 82, the input/output circuit region 311 illustrated in FIG. 6, a signal processing circuit region 312 (which is not illustrated in FIG. 23), a pixel peripheral circuit region 313, or the like, are formed.

The multilayer wiring layer 82 includes a plurality of wiring layers 83 formed with a wiring layer 83a which is an uppermost layer closest to the upper structure 11, a middle wiring layer 83b, a wiring layer 83c which is a lowermost layer closest to the semiconductor substrate 81, or the like, and an interlayer insulating film 84 formed between the wiring layers 83.

The plurality of wiring layers 83 are formed using, for example, copper (Cu), aluminum (Al), tungsten (w), or the like, and the interlayer insulating film 84 is formed with, for example, a silicon oxide film, a silicon nitride film, or the like. The plurality of wiring layers 83 and the interlayer insulating layer 84 may be all formed with the same material or may be formed with two or more materials according to layers.

A silicon through hole 85 which penetrates through the semiconductor substrate 81 is formed at a predetermined position on the semiconductor substrate 81, and a through hole via (through silicon via (TSV)) 88 is formed on an inner wall of the silicon through hole 85 by a connection conductor 87 being embedded via an insulating film 86. The insulating film 86 can be formed with, for example, an $SiO_2$ film, an SiN film, or the like. While, in the present embodiment, the through hole via 88 is formed in an inverse tapered shape which has a smaller plane area in the wiring layer 83 side than in the external terminal 14 side, conversely, the through hole via 88 may be formed in a forward tapered shape which has a smaller area in the external terminal 14 side, or may be formed in a non-tapered shape in which an area at the external terminal 14 side is substantially the same as an area of the wiring layer 83 side.

The connection conductor 87 of the through hole via 88 is connected to a rewiring 90 formed at the lower side of the semiconductor substrate 81, and the rewiring 90 is connected to the external terminal 14. The connection conductor 87 and the rewiring 90 can be formed with, for example, copper (Cu), tungsten (W), titanium (Ti), tantalum (Ta), a titanium-tungsten alloy (TiW), polysilicon, or the like.

Further, a solder mask (solder resist) 91 is formed at the lower side of the semiconductor substrate 81 except a region where the external terminal 14 is formed so as to cover the rewiring 90 and the insulating film 86.

Meanwhile, a multilayer wiring layer 102 is formed in the upper structure 11, for example, at the lower side (lower structure 12 side) of the semiconductor substrate 101 formed with silicon (Si). A circuit of the pixel 31 illustrated in FIG. 3 is formed with this multilayer wiring layer 102.

The multilayer wiring layer 102 includes a plurality of wiring layers 103 formed with a wiring layer 103a at the uppermost layer closest to the semiconductor substrate 101, a middle wiring layer 103b and a wiring layer 103c at the lowermost layer closest to the lower structure 12, and an interlayer insulating film 104 formed between the wiring layers 103.

As a material to be used for the plurality of wiring layers 103 and the interlayer insulating film 104, the same types of materials as the materials of the above-described wiring layers 83 and the interlayer insulating film 84 can be used. Further, the plurality of wiring layers 103 and the interlayer insulating film 104 are the same as the above-described wiring layers 83 and the interlayer insulating film 84 in that they can be formed with one or more different materials.

Note that, while, in the example in FIG. 23, the multilayer wiring layer 102 of the upper structure 11 includes five layers of wiring layers 103, and the multilayer wiring layer 82 of the lower structure 12 includes four layers of wiring layers 83, the total number of wiring layers is not limited to this, and the multilayer wiring layer can be formed with an arbitrary number of layers.

A photodiode 51 formed through PN junction is formed within the semiconductor substrate 101 for each pixel 31.

Further, while detailed illustration is omitted, a plurality of pixel transistors such as a transfer transistor 52 and an amplifier transistor 55, an FD 53, or the like, are also formed in the multilayer wiring layer 102 and the semiconductor substrate 101.

A through silicon via 109 connected to a predetermined wiring layer 103 of the upper structure 11 and a through chip via 105 connected to a predetermined wiring layer 83 of the lower structure 12 are formed at a predetermined position on the semiconductor substrate 101 on which the color filter 15 and the on-chip lens 16 are not formed.

The through chip via 105 and the through silicon via 109 are connected with a connection wiring 106 formed on an upper face of the semiconductor substrate 101. Further, an insulating film 107 is formed between each of the through silicon via 109 and the through chip via 105 and the semiconductor substrate 101.

A flattening film 108 is formed between the photodiode 51 and the color filter 15 of the semiconductor substrate 101, and a flattening film 110 is also formed between the on-chip lens 16 and the glass seal resin 17.

As described above, the laminate structure 13 of the solid-state imaging apparatus 1 illustrated in FIG. 1 has a laminate structure in which the multilayer wiring layer 82 side of the lower structure 12 and the multilayer wiring layer 102 side of the upper structure 11 are pasted. FIG. 23 illustrates a face at which the multilayer wiring layer 82 of the lower structure 12 and the multilayer wiring layer 102 of the upper structure 11 are pasted with dashed-dotted line.

Further, in the laminate structure 13 of the solid-state imaging apparatus 1, the wiring layer 103 of the upper structure 11 and the wiring layer 83 of the lower structure 12 are connected with two through hole electrodes of the through silicon via 109 and the through chip via 105, and the wiring layer 83 and the external terminal (back surface electrode) 14 of the lower structure 12 are connected with the through hole via 88 and the rewiring 90. By this means, a pixel signal generated at the pixel 31 of the upper structure 11 is transmitted to the lower structure 12, subjected to signal processing at the lower structure 12 and output to the outside of the apparatus from the external terminal 14.

11. Manufacturing Method

<Manufacturing Method in the Case of Twin Contact Structure>

A manufacturing method of the solid-state imaging apparatus 1 including a twin contact structure will be described next with reference to FIG. 24 to FIG. 38.

First, the lower structure 12 and the upper structure 11 in a wafer state are separately manufactured.

As the lower structure 12, the input/output circuit unit 49 and the multilayer wiring layer 82 which becomes part of the row drive unit 22 or the column signal processing unit 25 are formed in a region which becomes each chip portion of the silicon substrate (silicon wafer) 81. The semiconductor substrate 81 at this time point is in a state before the semiconductor substrate 81 is made thinner, and, for example, has a thickness of approximately 600 μm.

On the other hand, as the upper structure 11, the photodiode 51 and a source/drain region of the pixel transistor of each pixel 31 are formed in a region which becomes each chip portion of the silicon substrate (silicon wafer) 101. Further, on one face of the semiconductor substrate 101, the multilayer wiring layer 102 constituting the row drive signal line 32, the vertical signal line 33, or the like, is formed. The semiconductor substrate 101 at this time point is also in a state before the semiconductor substrate 101 is made thinner, and, for example, has a thickness of approximately 600 μm.

Figure 24:
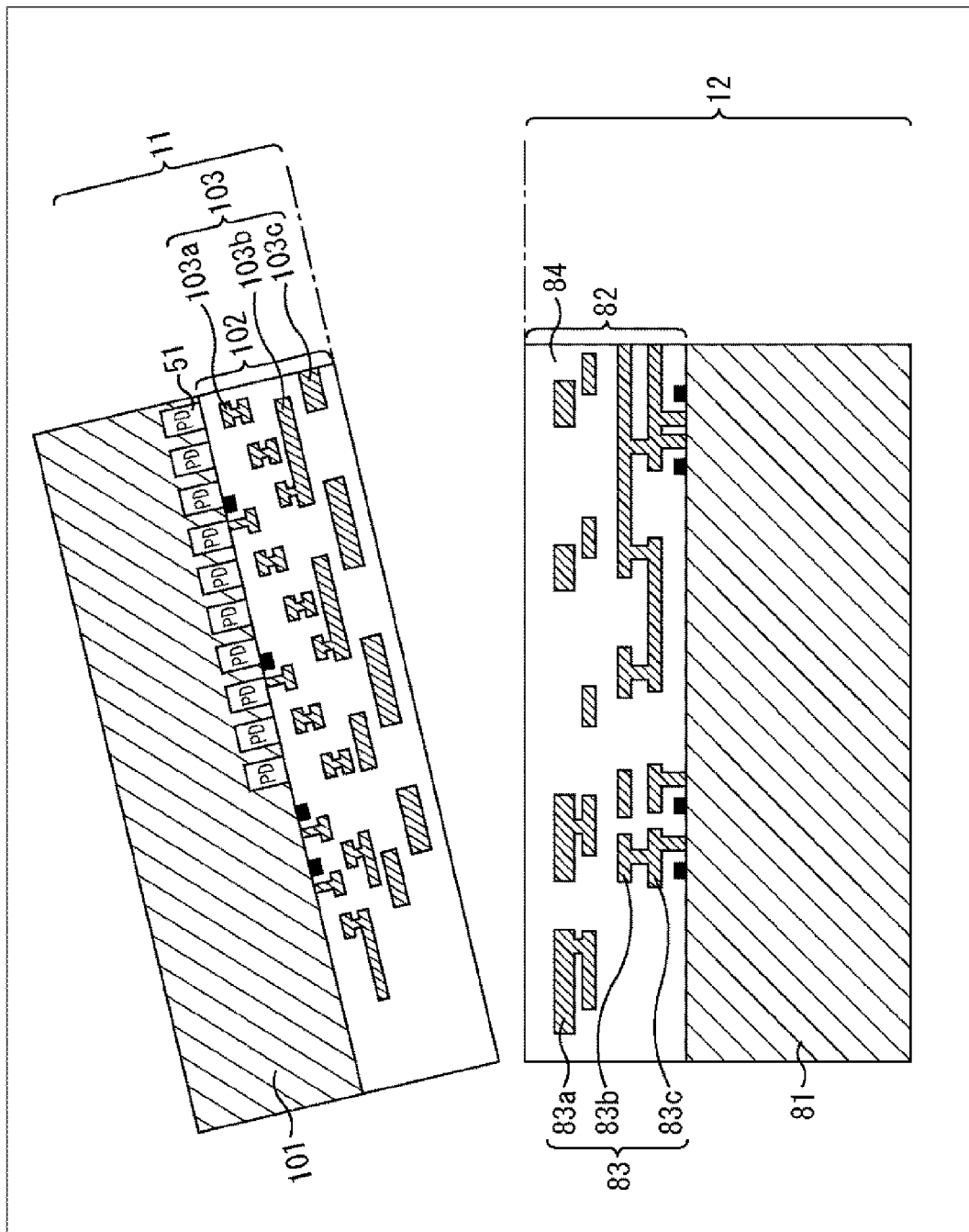
FIG. 24 is a diagram explaining a manufacturing method of a solid-state imaging apparatus having a twin contact structure.
Figure 25:
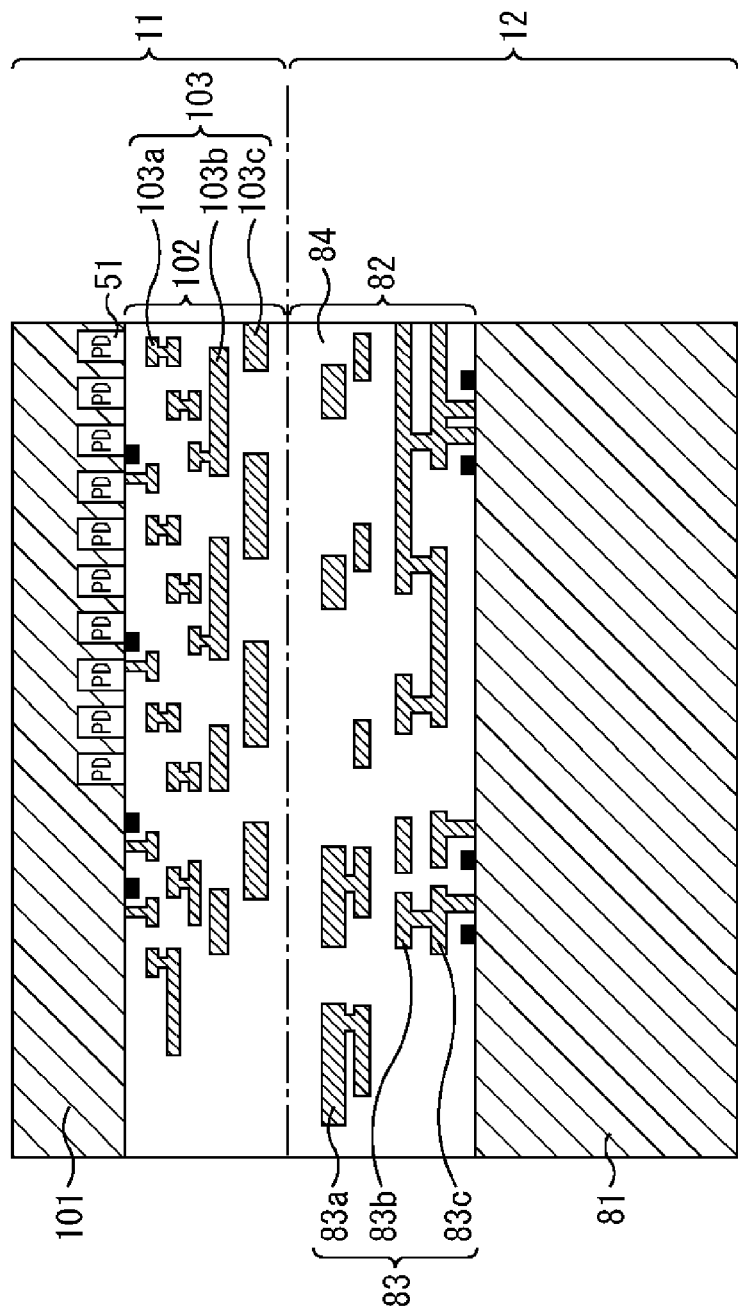
FIG. 25 is a diagram explaining a manufacturing method of a solid-state imaging apparatus having a twin contact structure.

Then, as illustrated in FIG. 24, after the manufactured multilayer wiring layer 82 side of the lower structure 12 and the manufactured multilayer wiring layer 102 side of the upper structure 11 which are in a wafer state are pasted to face each other, as illustrated in FIG. 25, the semiconductor substrate 101 of the upper structure 11 is made thinner. While pasting can be performed through, for example, plasma bonding or bonding using an adhesive, in the present embodiment, pasting is performed through plasma bonding. In the case of plasma bonding, the multilayer wiring layers are bonded by forming a film such as a plasma TEOS film, a plasma SiN film, an SiON film (block film) and an SiC film on each of the bonding faces of the upper structure 11 and the lower structure 12, performing plasma processing on the bonding faces and overlapping the bonding faces, and then, performing annealing treatment.

Figure 26:
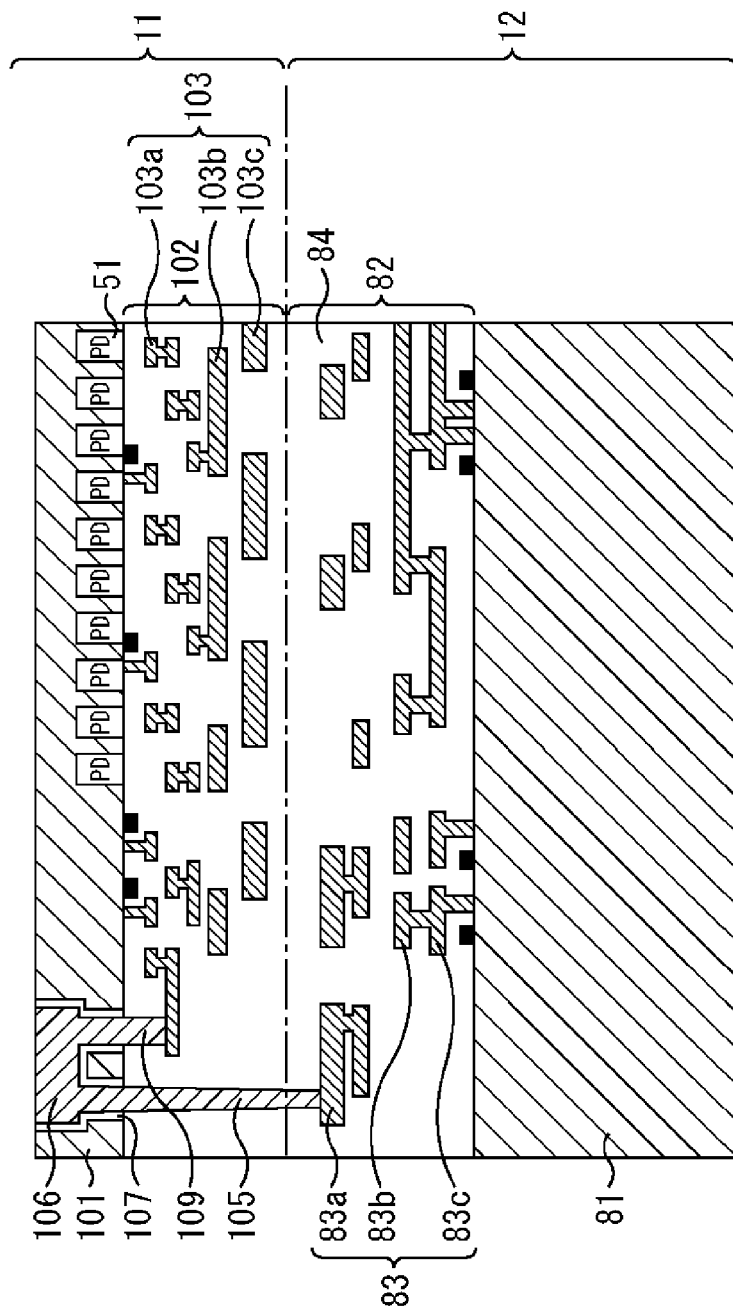
FIG. 26 is a diagram explaining a manufacturing method of a solid-state imaging apparatus having a twin contact structure.

After the semiconductor substrate 101 of the upper structure 11 is made thinner, as illustrated in FIG. 26, the through silicon via 109 and the through chip via 105, and the connection wiring 106 which connects these are formed in a region which becomes the upper and lower wiring connection region 314 using a damascene method.

Figure 27:
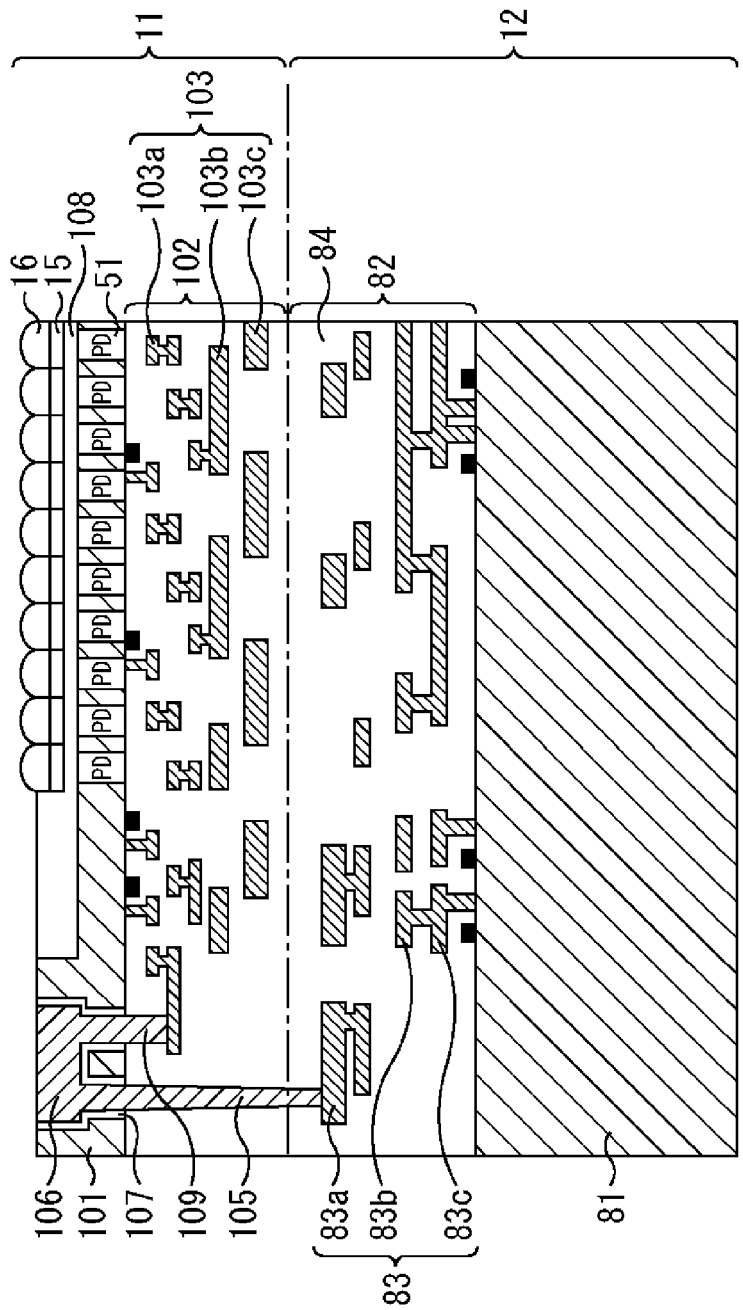
FIG. 27 is a diagram explaining a manufacturing method of a solid-state imaging apparatus having a twin contact structure.

Then, as illustrated in FIG. 27, the color filter 15 and the on-chip lens 16 are formed above the photodiode 51 of each pixel 31 via the flattening film 108.

Figure 28:
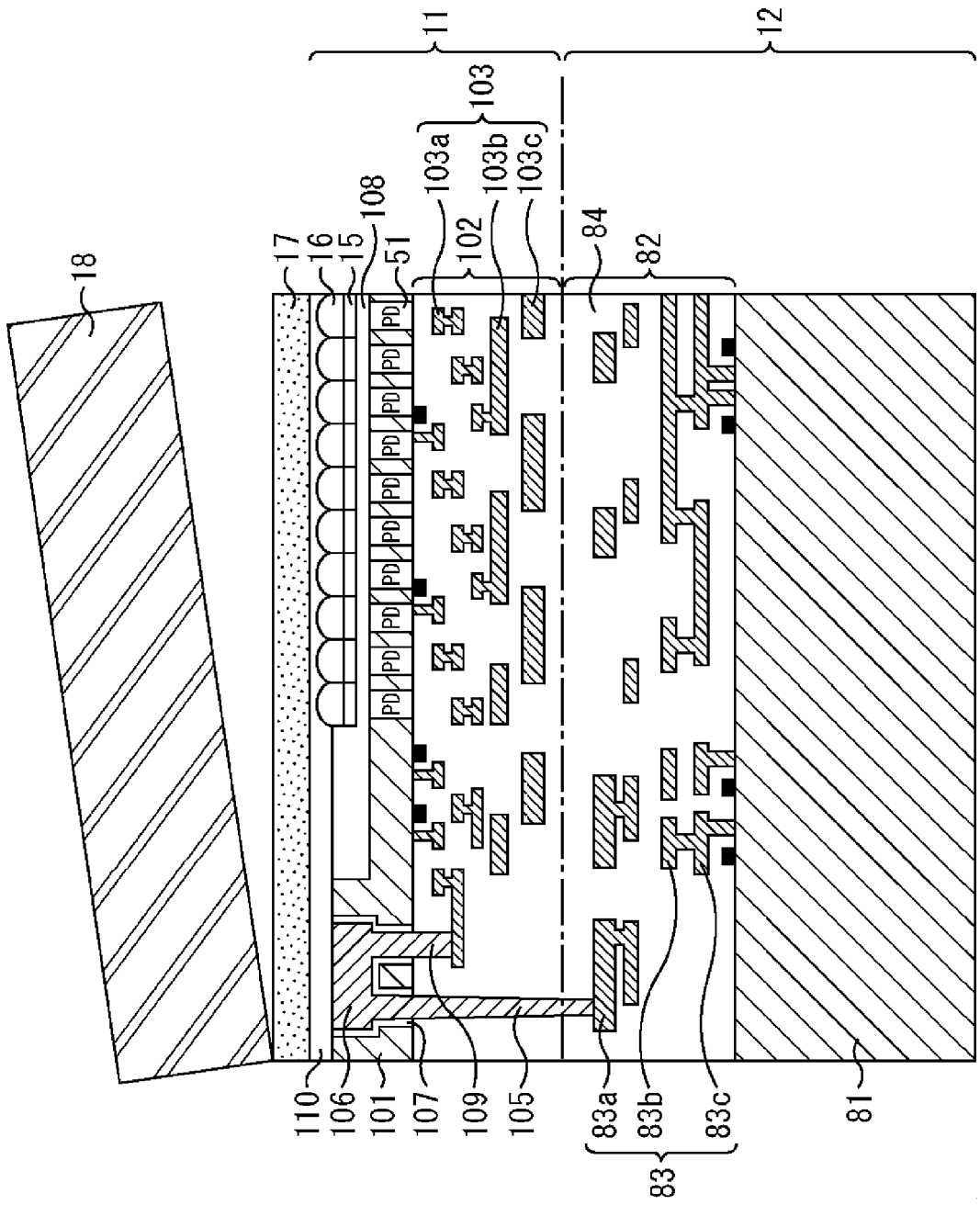
FIG. 28 is a diagram explaining a manufacturing method of a solid-state imaging apparatus having a twin contact structure.
Figure 29:
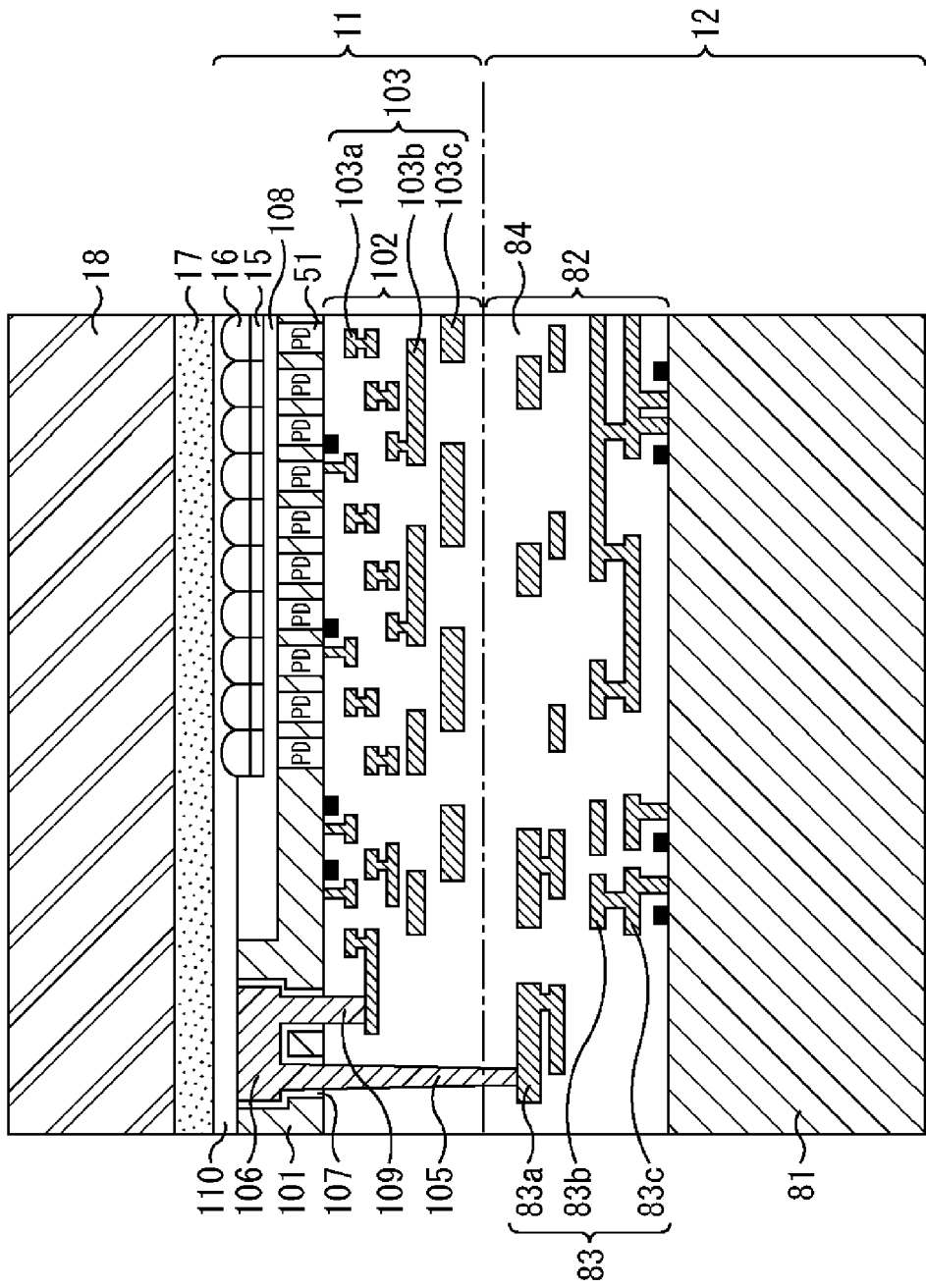
FIG. 29 is a diagram explaining a manufacturing method of a solid-state imaging apparatus having a twin contact structure.

Then, as illustrated in FIG. 28, the glass seal resin 17 is applied on the whole face where the on-chip lens 16 of the laminate structure 13 in which the upper structure 11 and the lower structure 12 are pasted is formed, via the flattening film 110, and, as illustrated in FIG. 29, the glass protective substrate 18 is connected with a cavity less structure.

Figure 30:
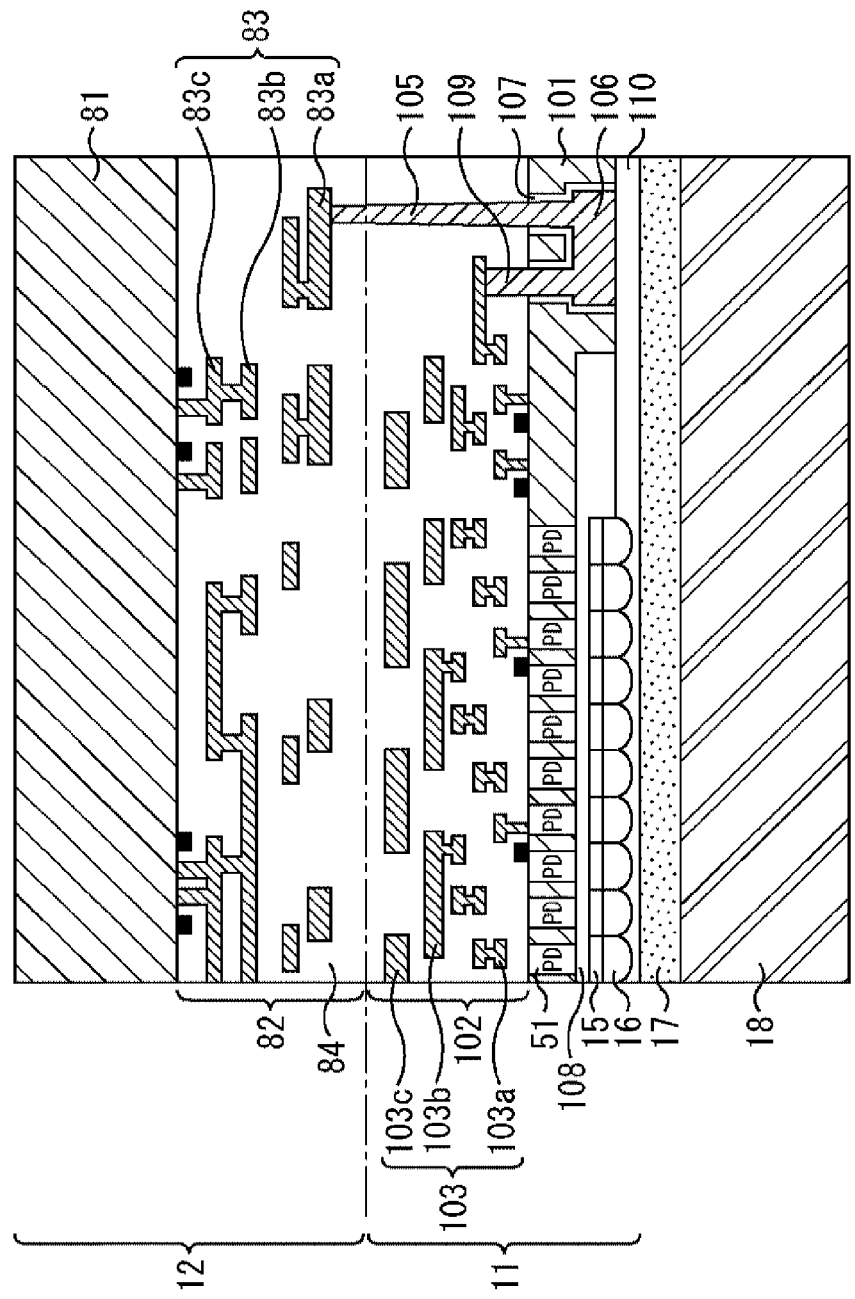
FIG. 30 is a diagram explaining a manufacturing method of a solid-state imaging apparatus having a twin contact structure.

Then, as illustrated in FIG. 30, after the whole laminate structure 13 is inverted, the semiconductor substrate 81 of the lower structure 12 is made thinner to such a degree that device characteristics are not affected, for example, approximately between 30 and 100 μm.

Figure 31:
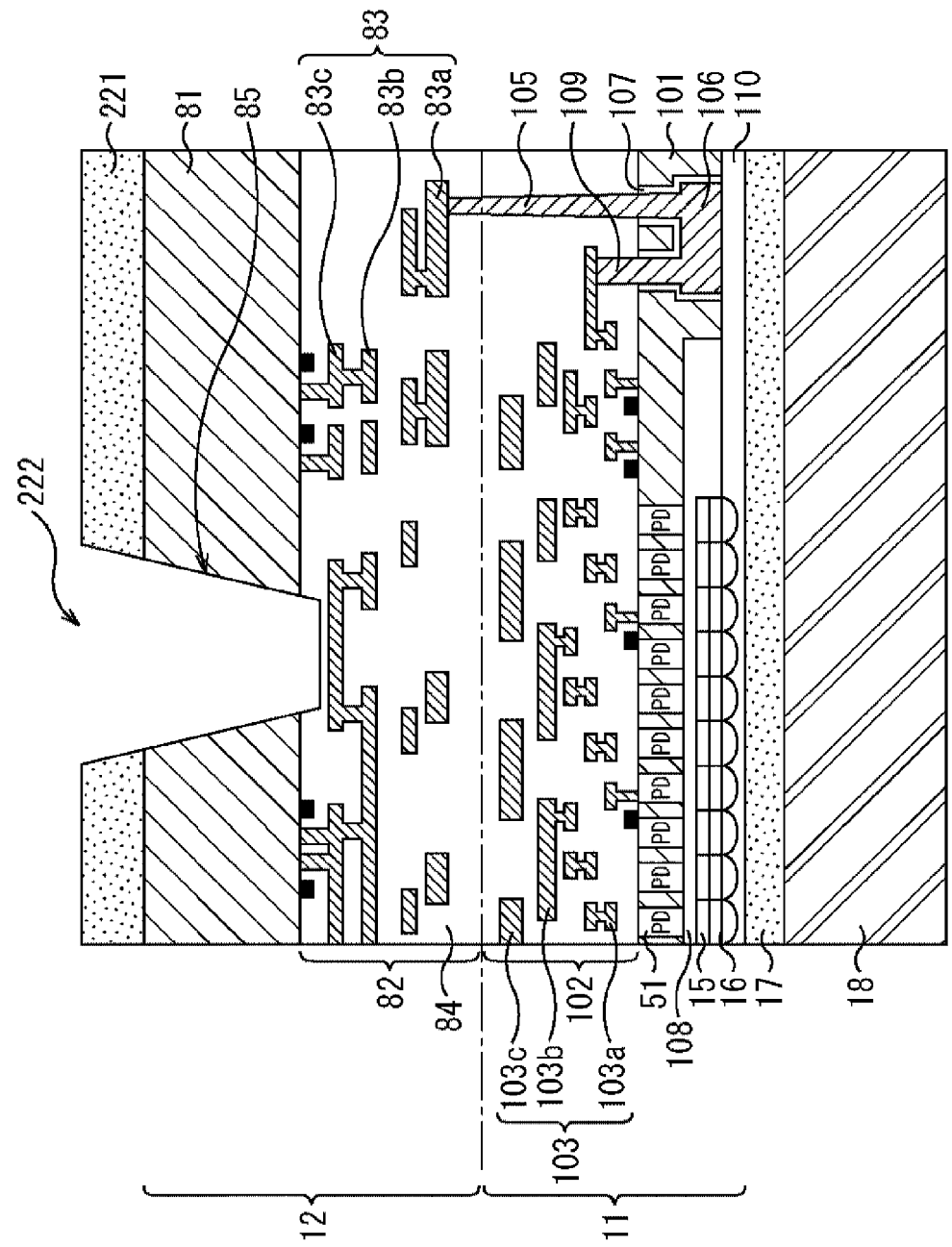
FIG. 31 is a diagram explaining a manufacturing method of a solid-state imaging apparatus having a twin contact structure.

Then, as illustrated in FIG. 31, after a photoresist 221 is patterned so that a position where the through hole via 88 (not illustrated) is disposed opens on the semiconductor substrate 81 which is made thinner, part of the semiconductor substrate 81 and the interlayer insulating layer 84 under the semiconductor substrate 81 is removed through dry etching, thereby an opening portion 222 is formed.

Figure 32:
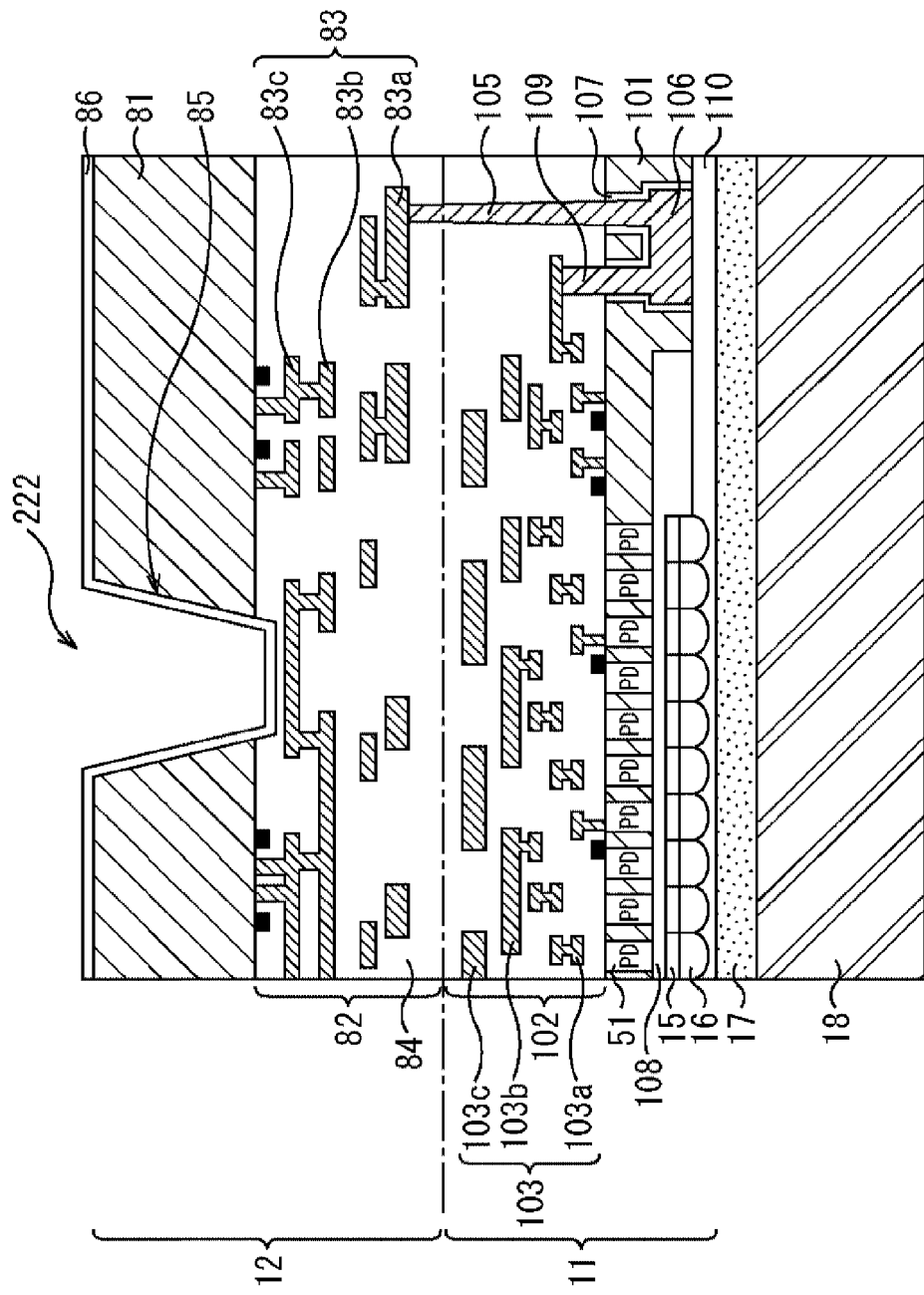
FIG. 32 is a diagram explaining a manufacturing method of a solid-state imaging apparatus having a twin contact structure.

Then, as illustrated in FIG. 32, the insulating film (isolation film) 86 is formed on the whole upper face of the semiconductor substrate 81 including the opening portion 222 using, for example, a plasma CVD method. As described above, the insulating film 86 can be, for example, an $SiO_2$ film, an SiN film, or the like.

Figure 33:
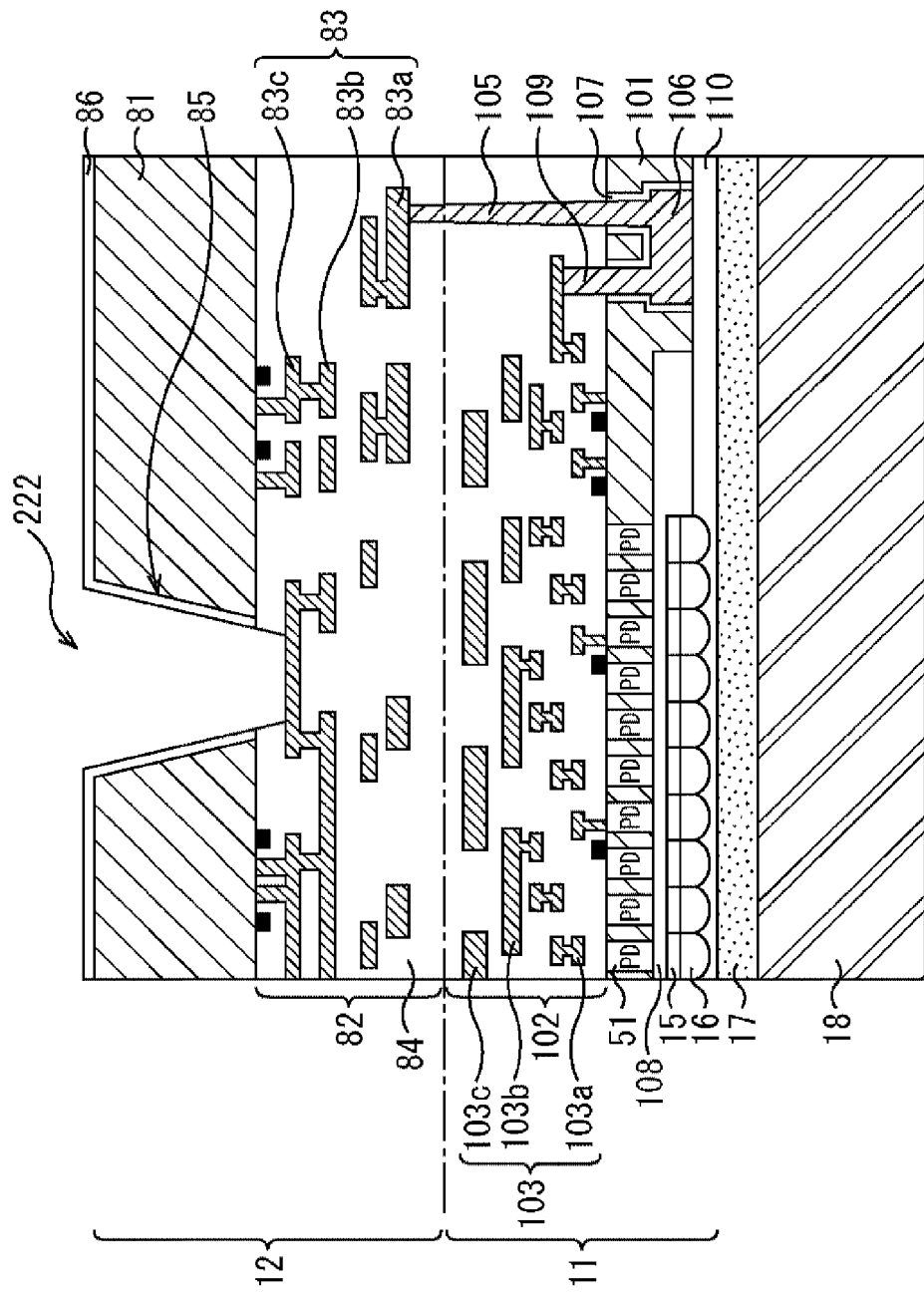
FIG. 33 is a diagram explaining a manufacturing method of a solid-state imaging apparatus having a twin contact structure.

Then, as illustrated in FIG. 33, the insulating film 86 on a bottom face of the opening portion 222 is removed using an etch back method, so that the wiring layer 83c closest to the semiconductor substrate 81 is exposed.

Figure 34:
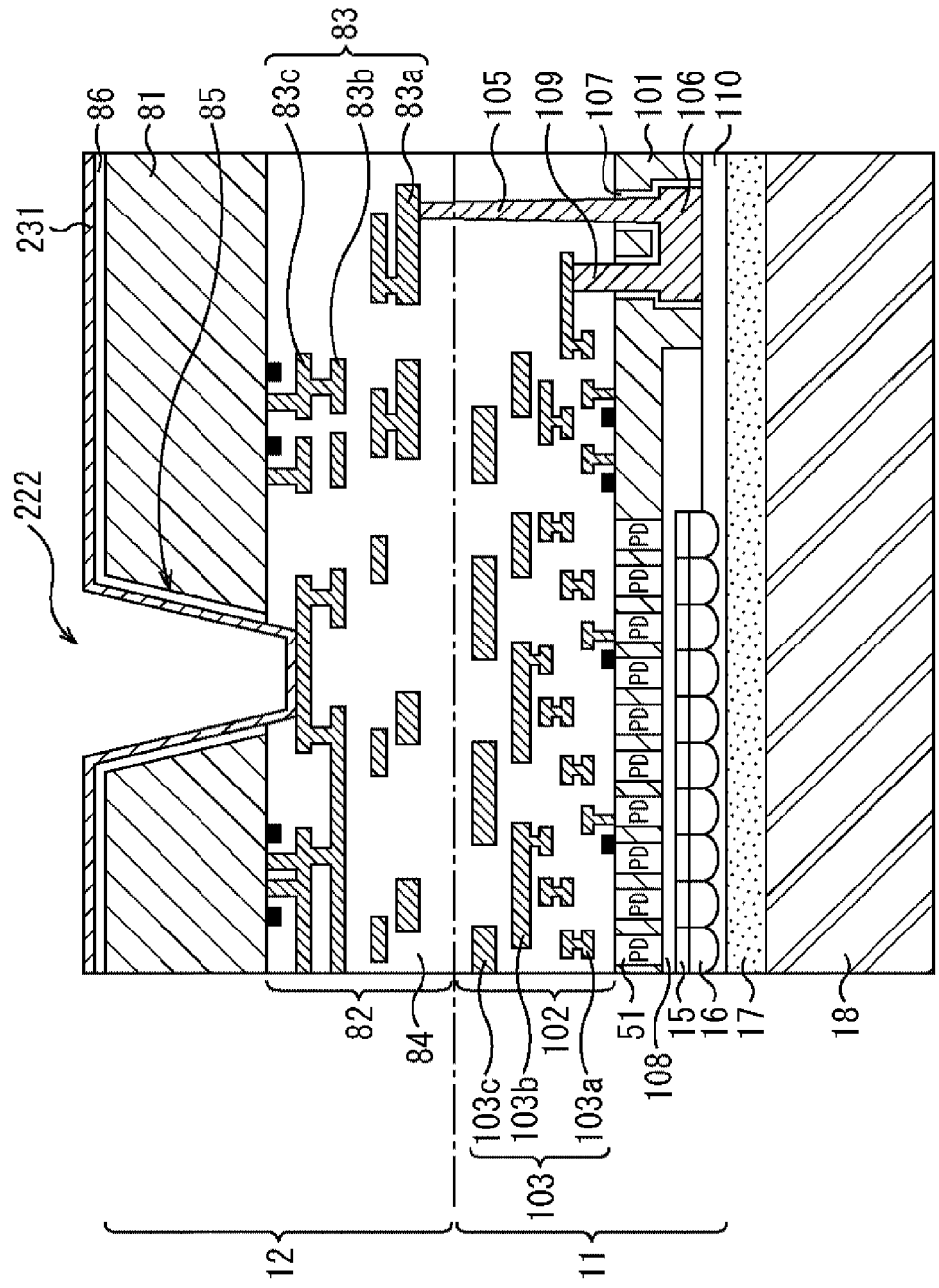
FIG. 34 is a diagram explaining a manufacturing method of a solid-state imaging apparatus having a twin contact structure.

Then, as illustrated in FIG. 34, a barrier metal film (not illustrated) and a Cu seed layer 231 are formed using a sputtering method. The barrier metal film is a film for preventing diffusion of the connection conductor 87 (Cu) illustrated in FIG. 35, and the Cu seed layer 231 becomes an electrode when the connection conductor 87 is embedded using an electroplating method. As a material of the barrier metal film, tantalum (Ta), titanium (Ti), tungsten (W), zirconium (Zr), its nitride film, carbonized film, or the like, can be used. In the present embodiment, titanium is used as the barrier metal film.

Figure 35:
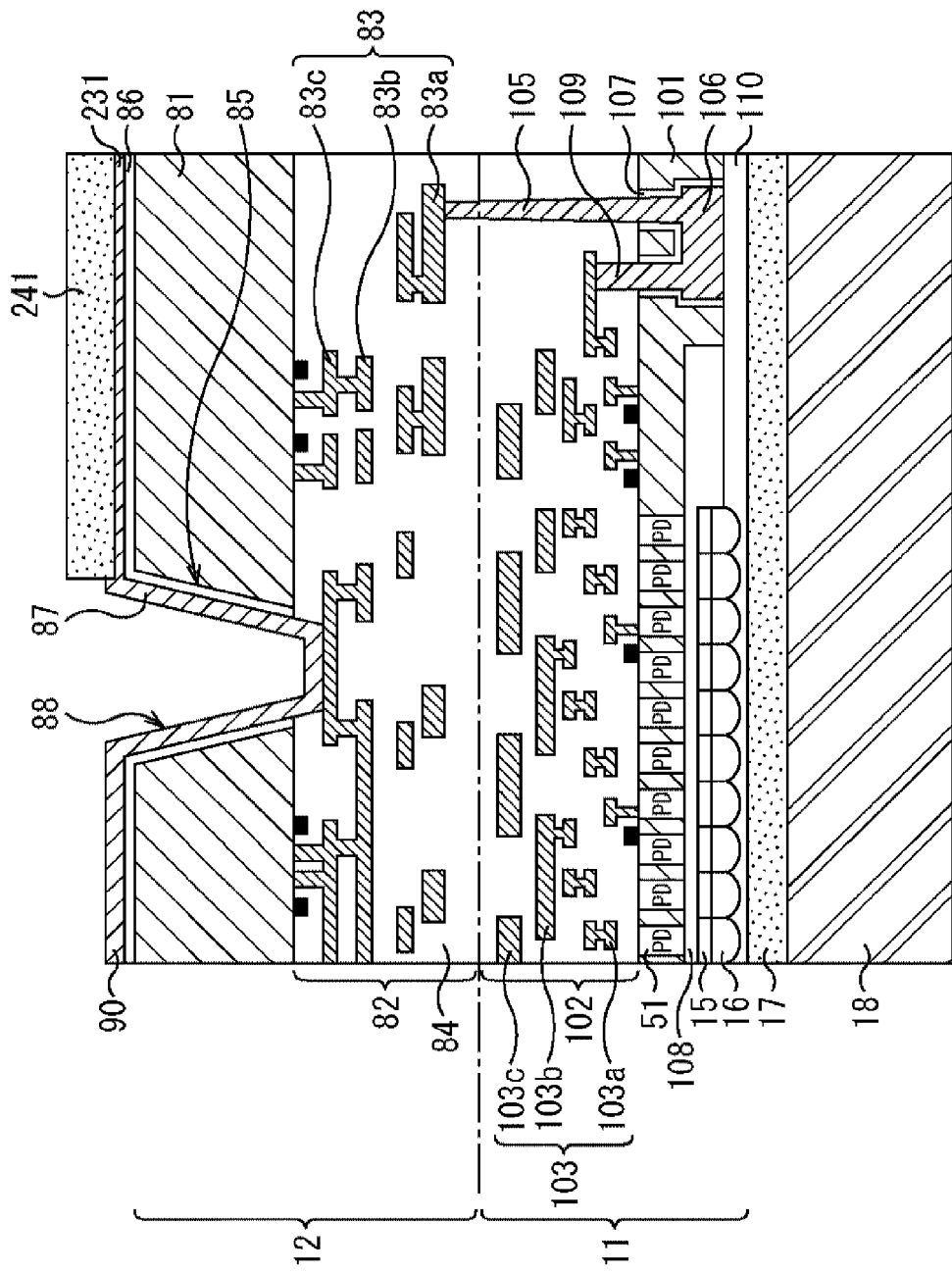
FIG. 35 is a diagram explaining a manufacturing method of a solid-state imaging apparatus having a twin contact structure.

Then, as illustrated in FIG. 35, after a resist pattern 241 is formed in a required region on the Cu seed layer 231, copper (Cu) as the connection conductor 87 is plated using an electroplating method. By this means, the through hole via 88 is formed, and the rewiring 90 is also formed at the upper side of the semiconductor substrate 81.

Figure 36:
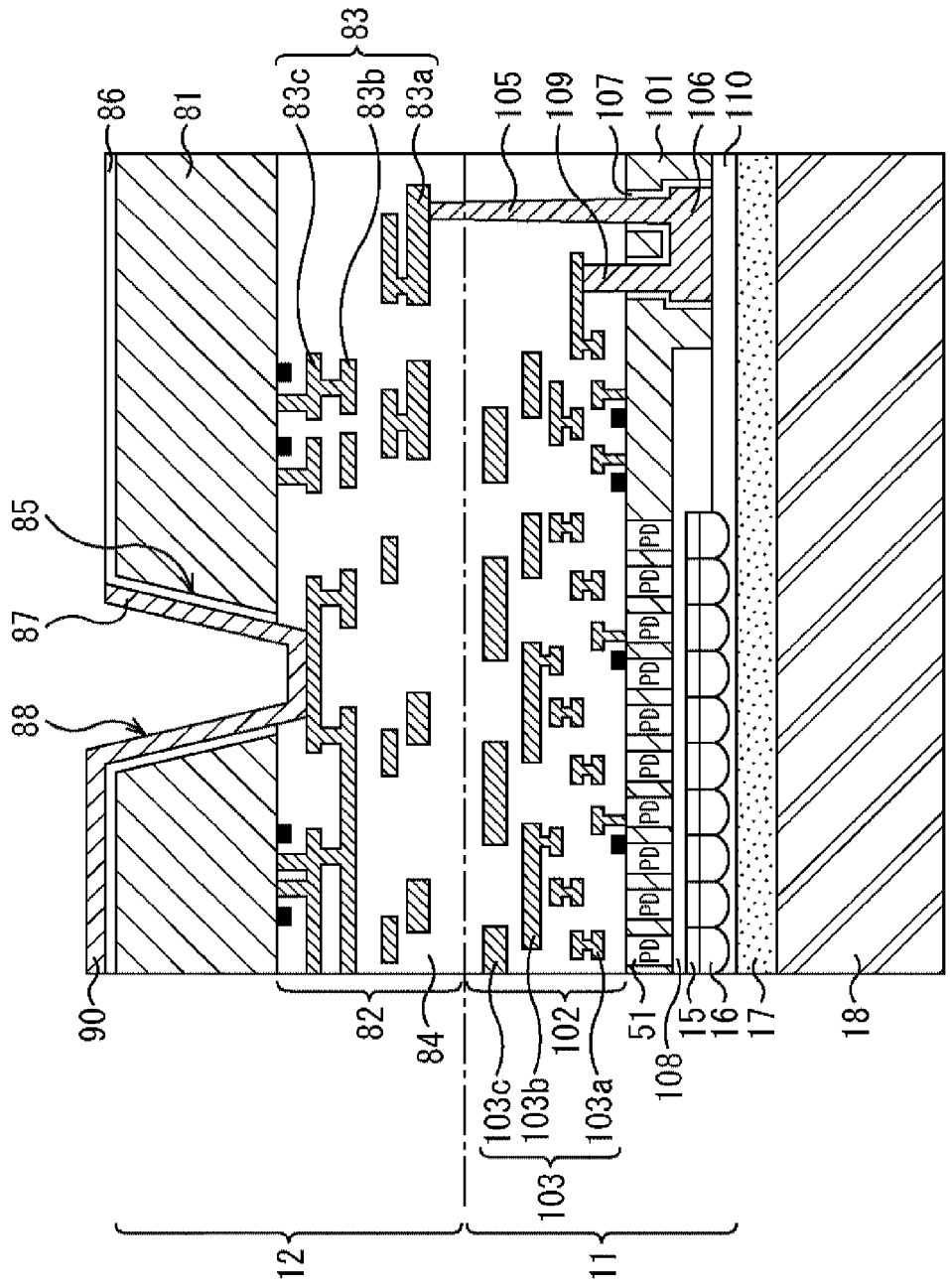
FIG. 36 is a diagram explaining a manufacturing method of a solid-state imaging apparatus having a twin contact structure.

Then, as illustrated in FIG. 36, after the resist pattern 241 is removed, the barrier metal film (not illustrated) and the Cu seed layer 231 under the resist pattern 241 are removed through wet etching.

Figure 37:
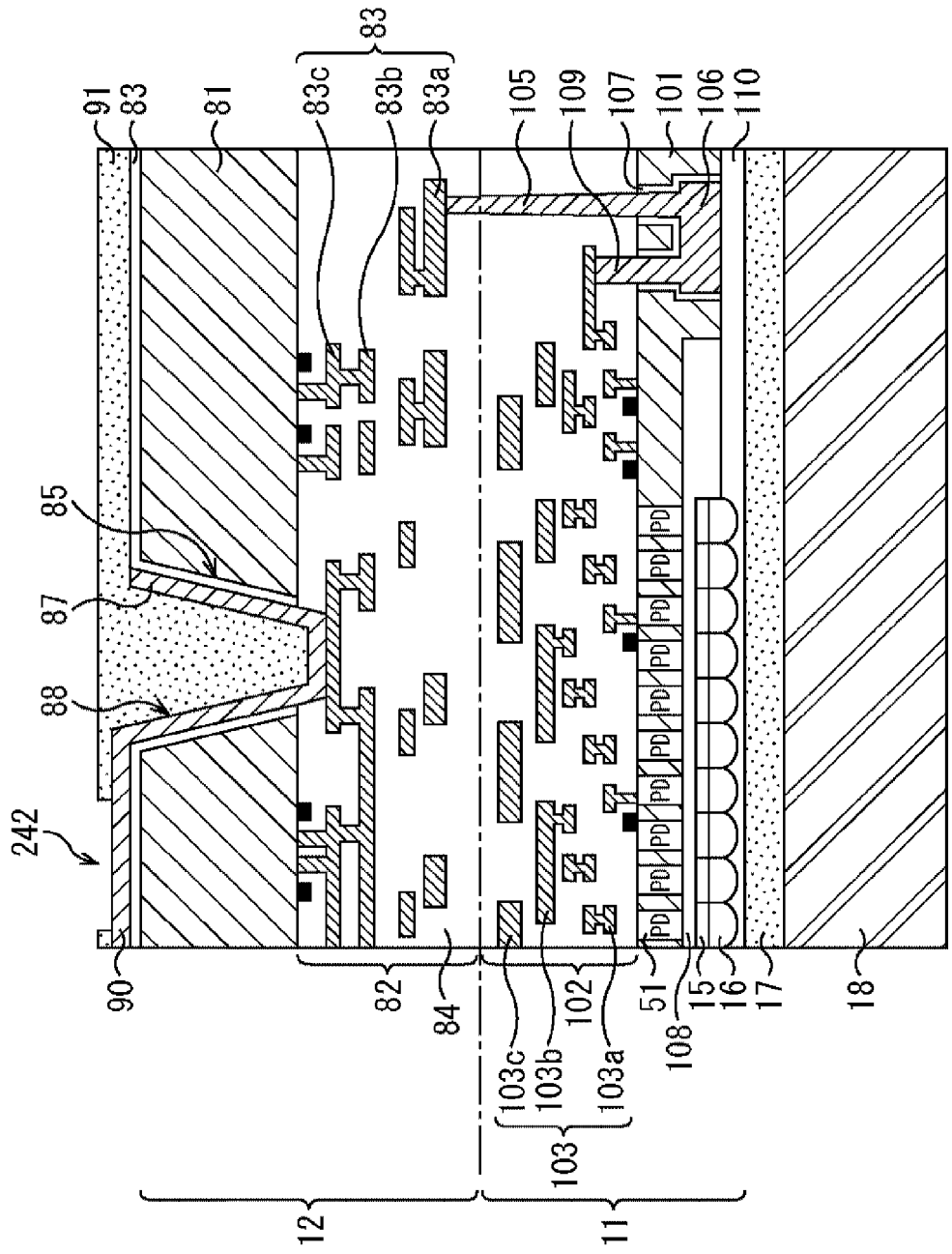
FIG. 37 is a diagram explaining a manufacturing method of a solid-state imaging apparatus having a twin contact structure.

Then, as illustrated in FIG. 37, after the solder mask 91 is formed to protect the rewiring 90, a solder mask opening portion 242 is formed by removing the solder mask 91 only in a region where the external terminal 14 is mounted.

Figure 38:
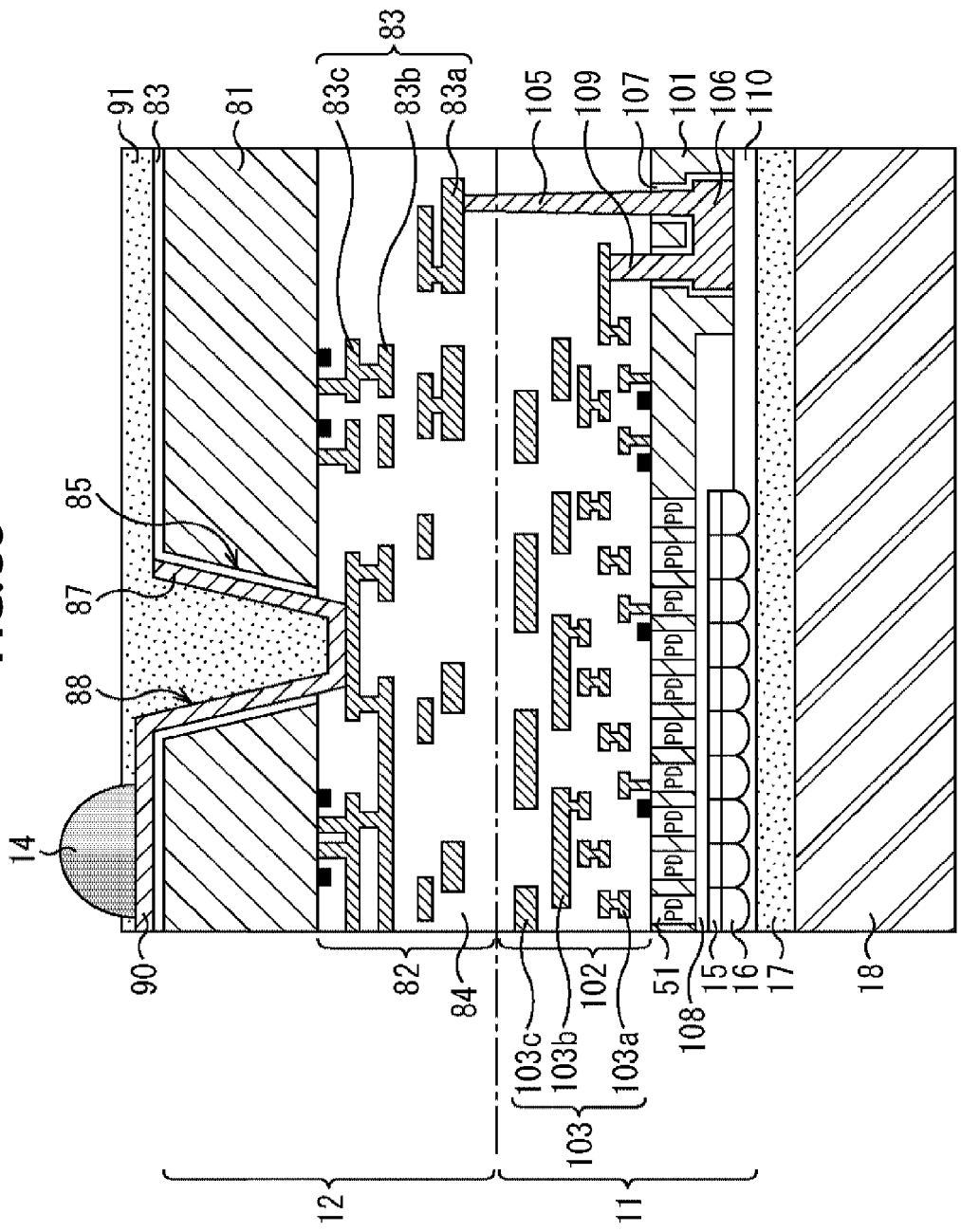
FIG. 38 is a diagram explaining a manufacturing method of a solid-state imaging apparatus having a twin contact structure.

Then, as illustrated in FIG. 38, the external terminal 14 is formed at the solder mask opening portion 242 using a solder ball mounting method.

As described above, according to the manufacturing method of the present disclosure, first, the upper structure 11 (first semiconductor substrate) in which the photodiode 51 which performs photoelectric conversion, the pixel transistor circuit, or the like, are formed, and the lower structure 12 (second semiconductor substrate) in which the input/output circuit unit 49 for outputting a pixel signal output from the pixel 31 to the outside the solid-state imaging apparatus 1 is formed below the pixel array unit 24 are pasted so that the wiring layers face each other. Then, the through hole via 88 which penetrates through the lower structure 12 is formed, and the external terminal 14 which electrically connects the input/output circuit unit 49 and the outside of the solid-state imaging apparatus 1 via the through hole via 88 is formed. By this means, it is possible to manufacture the solid-state imaging apparatus 1 illustrated in FIG. 5.

According to the manufacturing method of the present disclosure, because the through hole via 88 is formed using the glass protective substrate 18 as a support substrate, the through hole via 88 has a shape such that the through hole via 88 is engraved to the wiring layer 83 (circuit) side from the external terminal 14 side.

<Manufacturing Method in the Case of Cu—Cu Direct Bonding Structure>

A manufacturing method of the solid-state imaging apparatus 1 in the case where the lower structure 12 and the upper structure 11 are bonded with a Cu—Cu direct bonding structure will be described next with reference to FIG. 39 to FIG. 43.

First, as with the case of the manufacturing method in the case where the twin contact structure is employed as the upper and lower wiring connection structure, the lower structure 12 and the upper structure 11 in a wafer state are separately manufactured.

Figure 39:
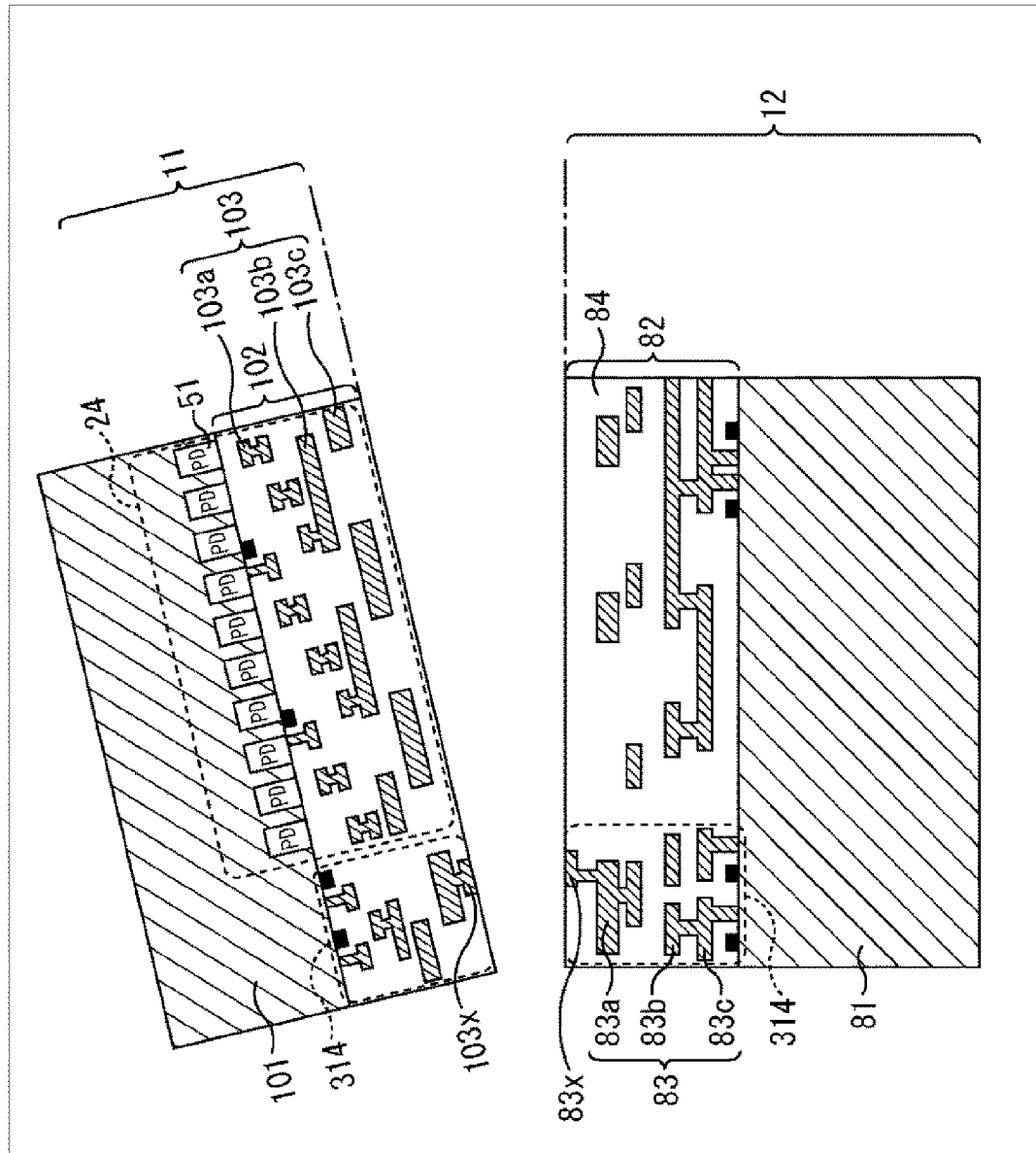
FIG. 39 is a diagram explaining a manufacturing method of the solid-state imaging apparatus in FIG. 5 having a Cu—Cu direct bonding structure.

However, as illustrated in FIG. 39, the manufacturing method is different from the manufacturing method in the case of the twin contact structure in that, in the upper and lower wiring connection structure 314 which becomes further outside of the pixel array unit 24, in the upper structure 11, a wiring layer 103x for directly connecting to a wiring layer 83x of the lower structure 12 is formed at a side further closer to the lower structure 12 than the wiring layer 103c which is the lowermost layer closest to the lower structure 12.

In a similar manner, in the upper and lower wiring connection region 314, also in the lower structure 12, the wiring layer 83x for directly connecting to the wiring layer 103x of the upper structure 11 is formed at a side further closer to the upper structure 11 than the wiring layer 83a which is the uppermost layer closest to the upper structure 11.

Figure 40:
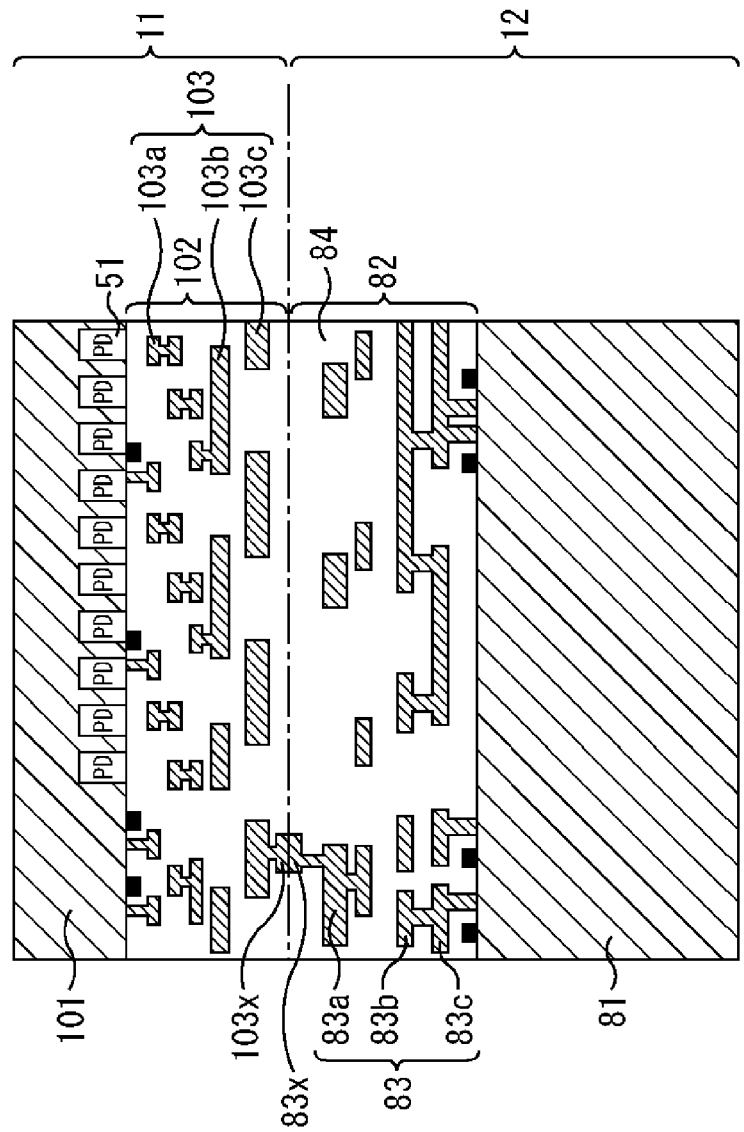
FIG. 40 is a diagram explaining a manufacturing method of the solid-state imaging apparatus in FIG. 5 having a Cu—Cu direct bonding structure.

Then, as illustrated in FIG. 40, after the multilayer wiring layer 82 side of the lower structure 12 and the multilayer wiring layer 102 side of the upper structure 11 are pasted so as to face each other, the semiconductor substrate 101 of the upper structure 11 is made thinner. By this pasting, the wiring layer 83x of the lower structure 12 and the wiring layer 103x of the upper structure 11 are connected through metal bonding (Cu—Cu bonding).

Figure 41:
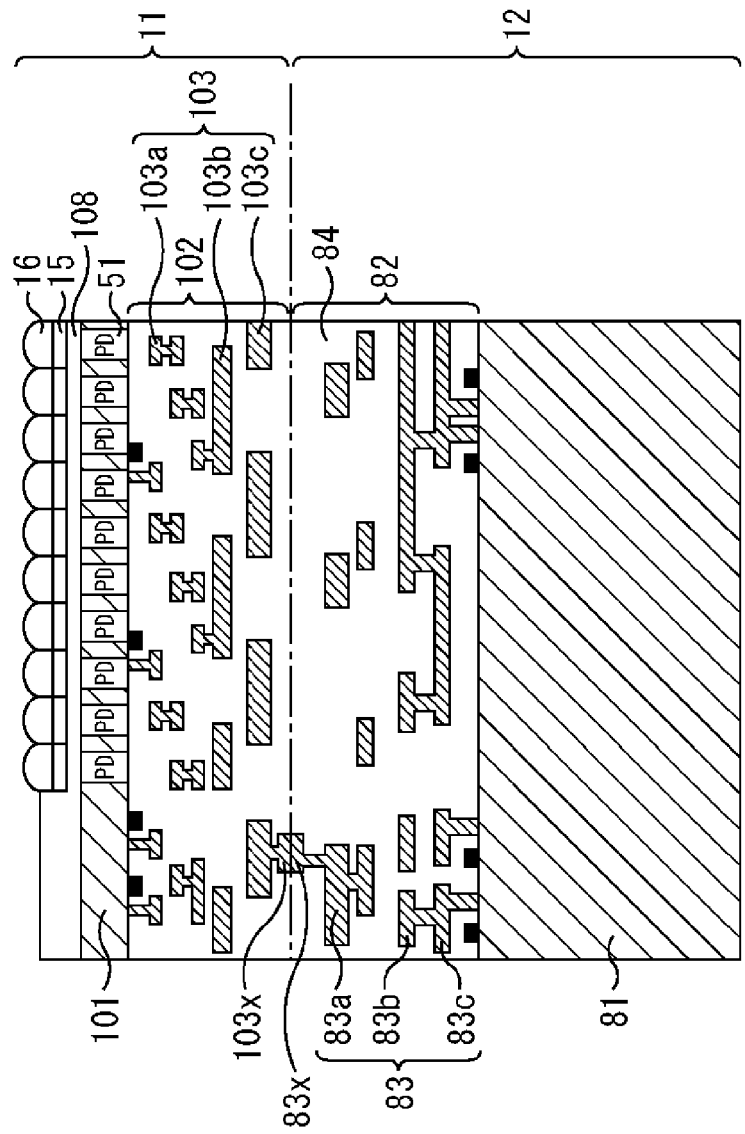
FIG. 41 is a diagram explaining a manufacturing method of the solid-state imaging apparatus in FIG. 5 having a Cu—Cu direct bonding structure.

Then, as illustrated in FIG. 41, the color filter 15 and the on-chip lens 16 are formed above the photodiode 51 of each pixel 31 via the flattening film 108.

Figure 42:
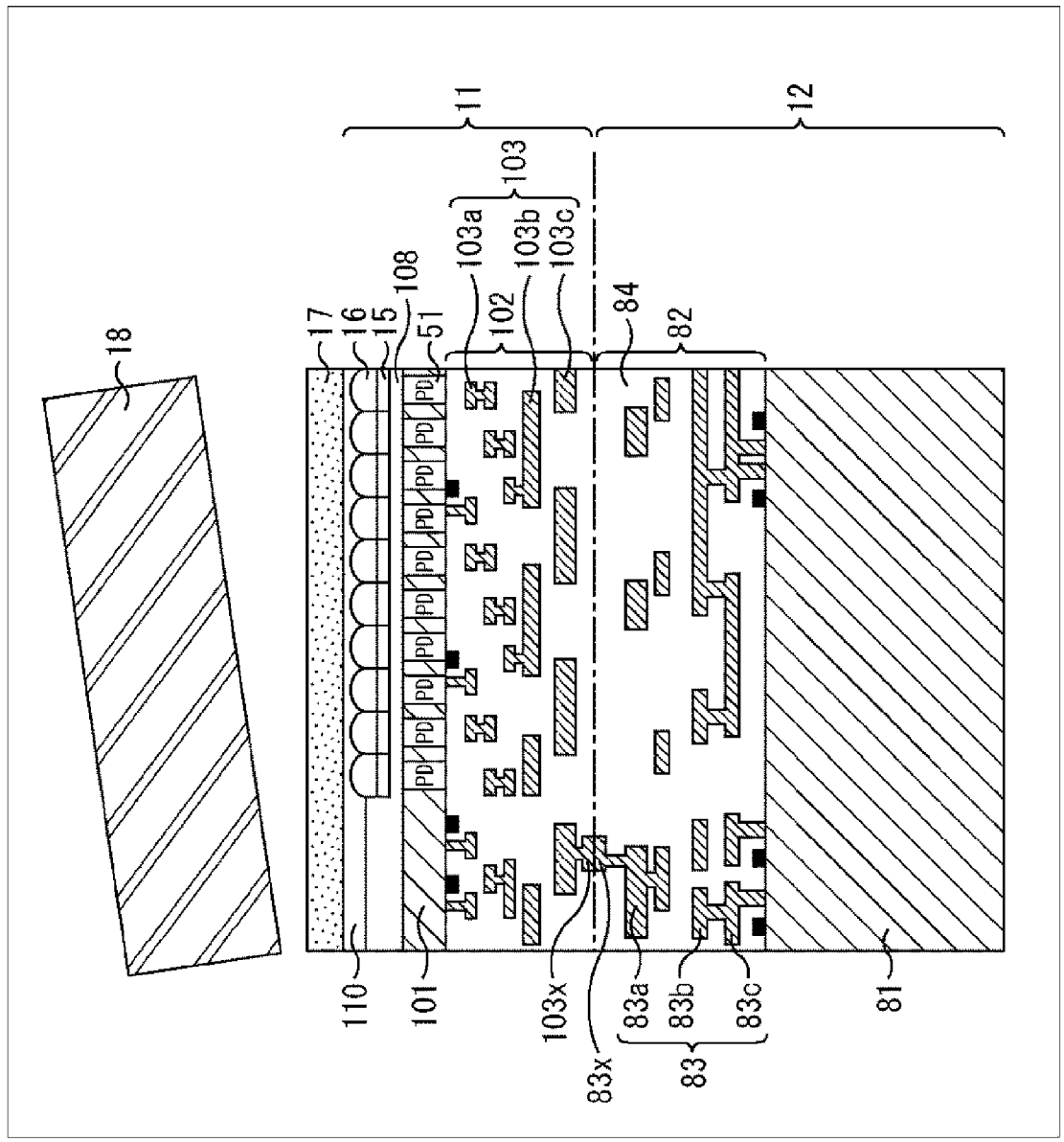
FIG. 42 is a diagram explaining a manufacturing method of the solid-state imaging apparatus in FIG. 5 having a Cu—Cu direct bonding structure.

Then, as illustrated in FIG. 42, the glass seal resin 17 is applied on the whole face where the on-chip lens 16 of the pasted lower structure 12 and upper structure 11 is formed, via the flattening film 10, so that the glass protective substrate 18 is connected with a cavity less structure.

Note that, while, in this example, in the lower structure 12, the wiring layer 83x for directly connecting to the wiring layer 103 of the upper structure 11 is formed separately from the wiring layers 83a to 83c which become part of the input/output circuit unit 49 and the row drive unit 22 or the column signal processing unit 25, and, in the upper structure 11, the wiring layer 103x for directly connecting to the wiring layer 83 of the lower structure 12 is formed separately from the wiring layers 103a to 103c which become a drive wiring, or the like, of the pixel transistor, of course, it is also possible to connect the wiring layer 83a which is the uppermost layer of the lower structure 12 and the wiring layer 103c which is the lowermost layer of the upper structure 11 through metal bonding (Cu—Cu bonding).

Figure 43:
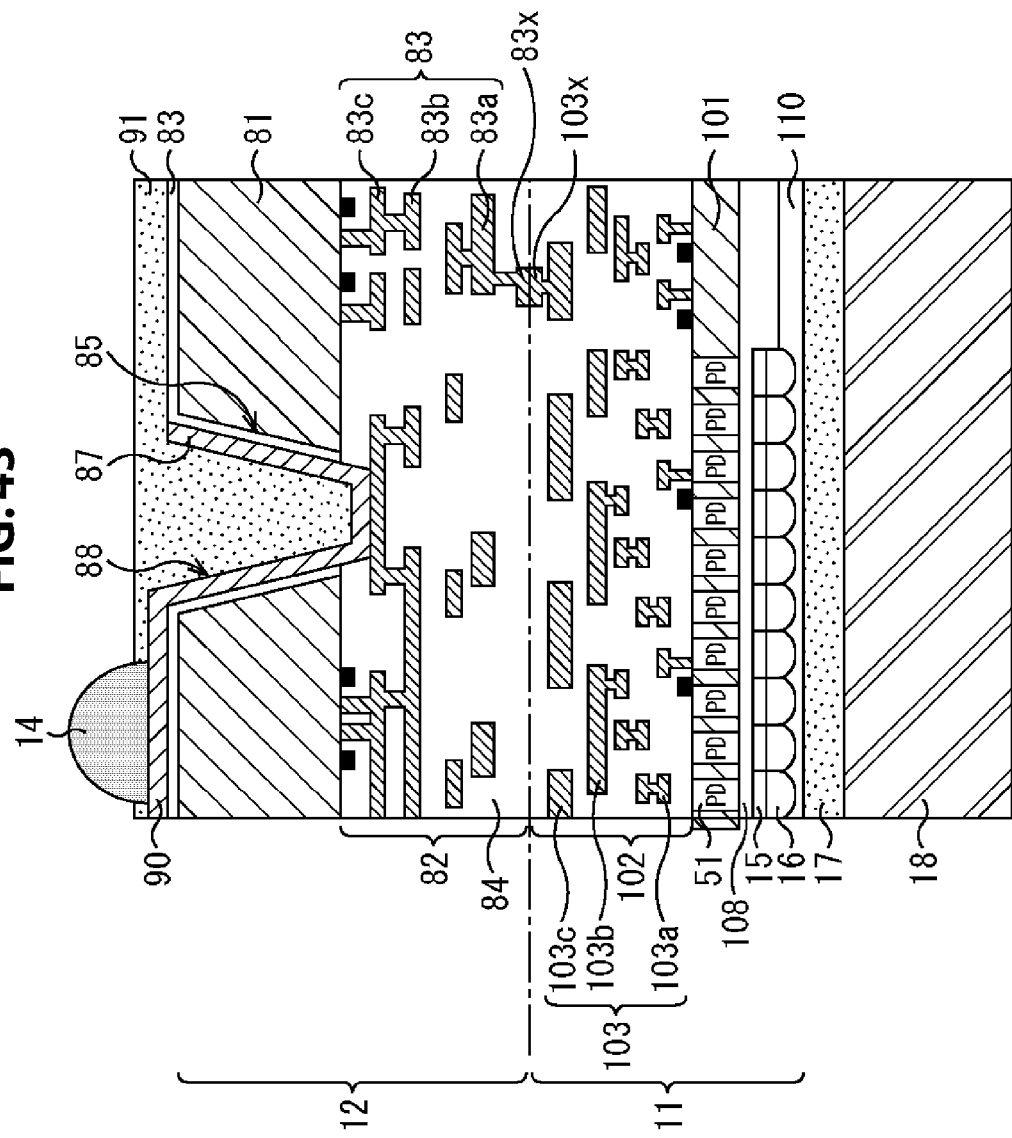
FIG. 43 is a diagram explaining a manufacturing method of the solid-state imaging apparatus in FIG. 5 having a Cu—Cu direct bonding structure.

Steps after the step illustrated in FIG. 42 are similar to the steps described with reference to FIG. 30 to FIG. 38 in the case where the twin contact structure is employed as the upper and lower wiring connection structure. The final state is as illustrated in FIG. 43.

12. Further Modified Examples

Further Modified Example 1

A further modified example of the solid-state imaging apparatus 1 will be described next with reference to FIG. 44.

Figure 44:
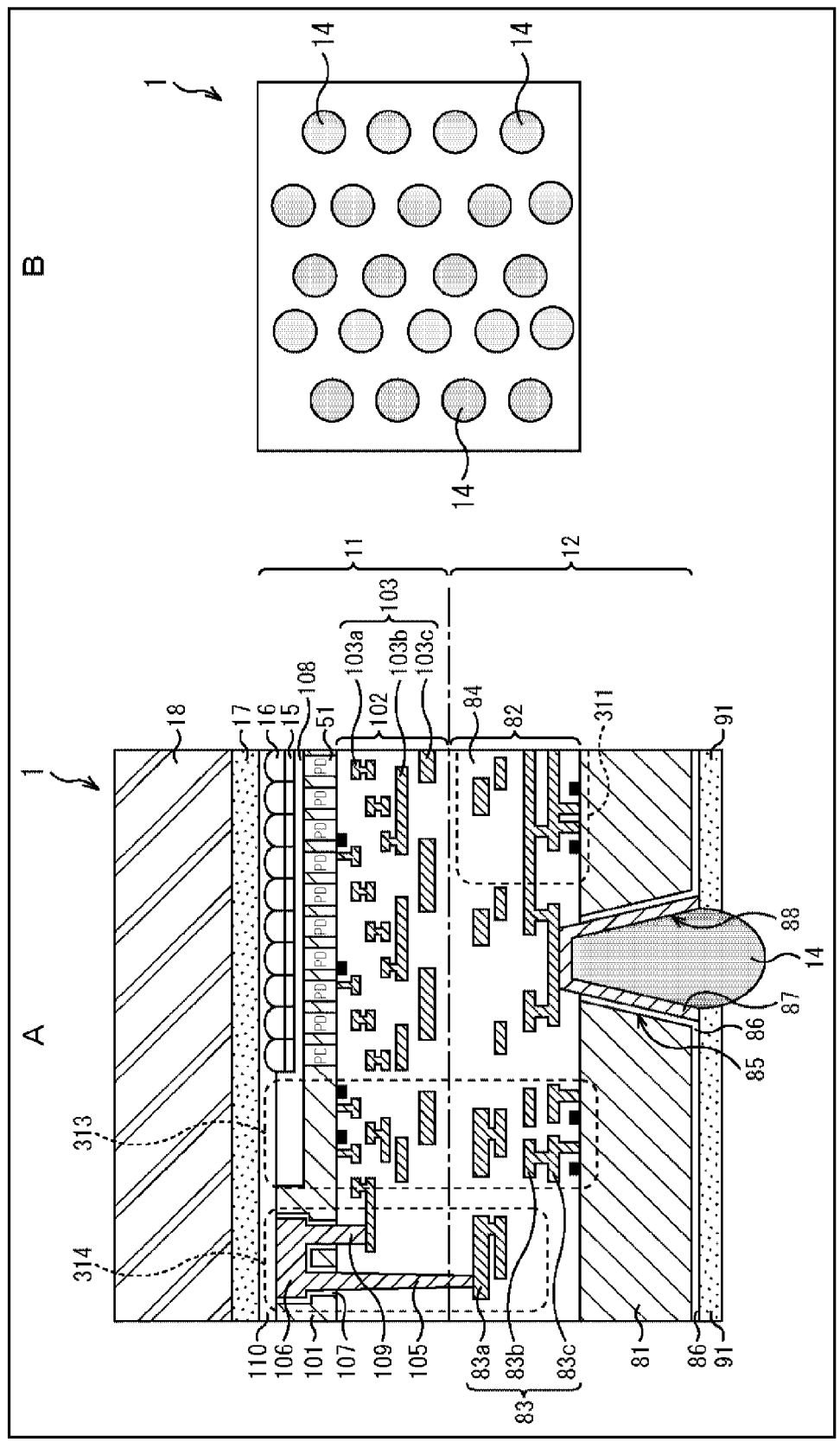
FIG. 44 is a diagram explaining further modified example 1 of the solid-state imaging apparatus.

A of FIG. 44 is a cross-sectional diagram of a part in the vicinity of a circumference of the solid-state imaging apparatus 1 according to further modified example 1, and B of FIG. 44 is a plan view of the external terminal 14 side of the solid-state imaging apparatus 1 according to further modified example 1.

In further modified example 1, as illustrated in A of FIG. 44, the external terminal 14 is formed immediately above the through hole via 88 so as to overlap with a position of the through hole via 88 in a planar position. By this means, as illustrated in B of FIG. 44, because it becomes not necessary to secure an area for forming the rewiring 90 at the back surface side of the solid-state imaging apparatus 1, it is possible to resolve deficiency of an area for forming the input/output unit 21.

Further Modified Example 2

A further modified example of the solid-state imaging apparatus 1 will be described next with reference to FIG. 45.

Figure 45:
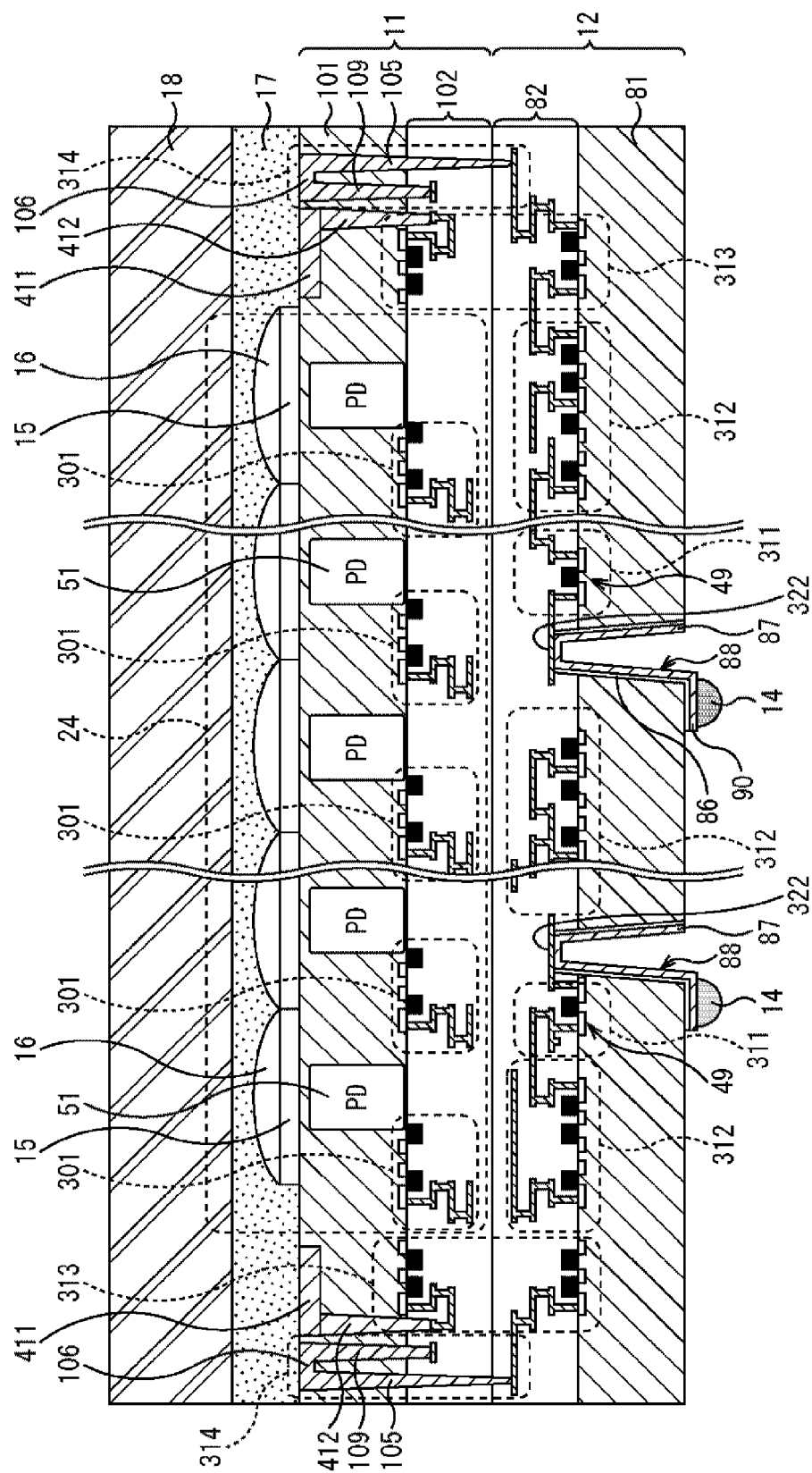
FIG. 45 is a diagram explaining further modified example 2 of the solid-state imaging apparatus.

FIG. 45 is a cross-sectional diagram of the solid-state imaging apparatus 1 according to further modified example 2.

In further modified example 2, the solid-state imaging apparatus 1 includes a conductive pad 411 for setting a needle for measurement for the purpose of measuring operation of the solid-state imaging apparatus 1 in a state before the solid-state imaging apparatus 1 is divided into pieces, in other words, in a state where a plurality of solid-state imaging apparatuses 1 are formed on a wafer, using, for example, typical semiconductor apparatus measuring machine which uses a set needle.

As illustrated in FIG. 45, the conductive pad 411 for measurement using a set needle is formed in a region outside the pixel array unit 24, for example, at an upper side of the pixel peripheral circuit region 313 in which the row drive unit 22, the column signal processing unit 25, or the like, are formed. The conductive pad 411 is connected to a predetermined wiring layer 103 of the upper structure 11 using the through silicon via 412.

It is preferable that the conductive pad 411 for measurement using a set needle is formed before the protective substrate 18 is disposed on a surface of the solid-state imaging apparatus 1. By this means, it is possible to measure operation of the solid-state imaging apparatus 1 before the protective substrate 18 is fixed and in a state where a plurality of solid-state imaging apparatuses 1 are formed on a wafer.

The conductive pad 411 for measurement using a set needle may be formed with part of the multilayer wiring layer 102 provided in the upper structure 11.

Further, the conductive pad 411 for measurement using a set needle may be formed at the upper side of a region for acquiring a reference level signal, in other words, a black level signal, which is typically called an optical black pixel region or simply an optical black region (not illustrated) provided at the solid-state imaging apparatus 1.

By forming the conductive pad 411 for measurement using a set needle at the solid-state imaging apparatus 1 before the protective substrate 18 of the solid-state imaging apparatus 1 is fixed, it is possible to measure the operation of the solid-state imaging apparatus 1 using a measurement apparatus of the semiconductor apparatus using a set needle before the protective substrate 18 is formed, in a state where a plurality of solid-state imaging apparatuses 1 are formed on a wafer.

Further Modified Example 3

A further modified example of the solid-state imaging apparatus 1 will be described next with reference to FIG. 46.

Figure 46:
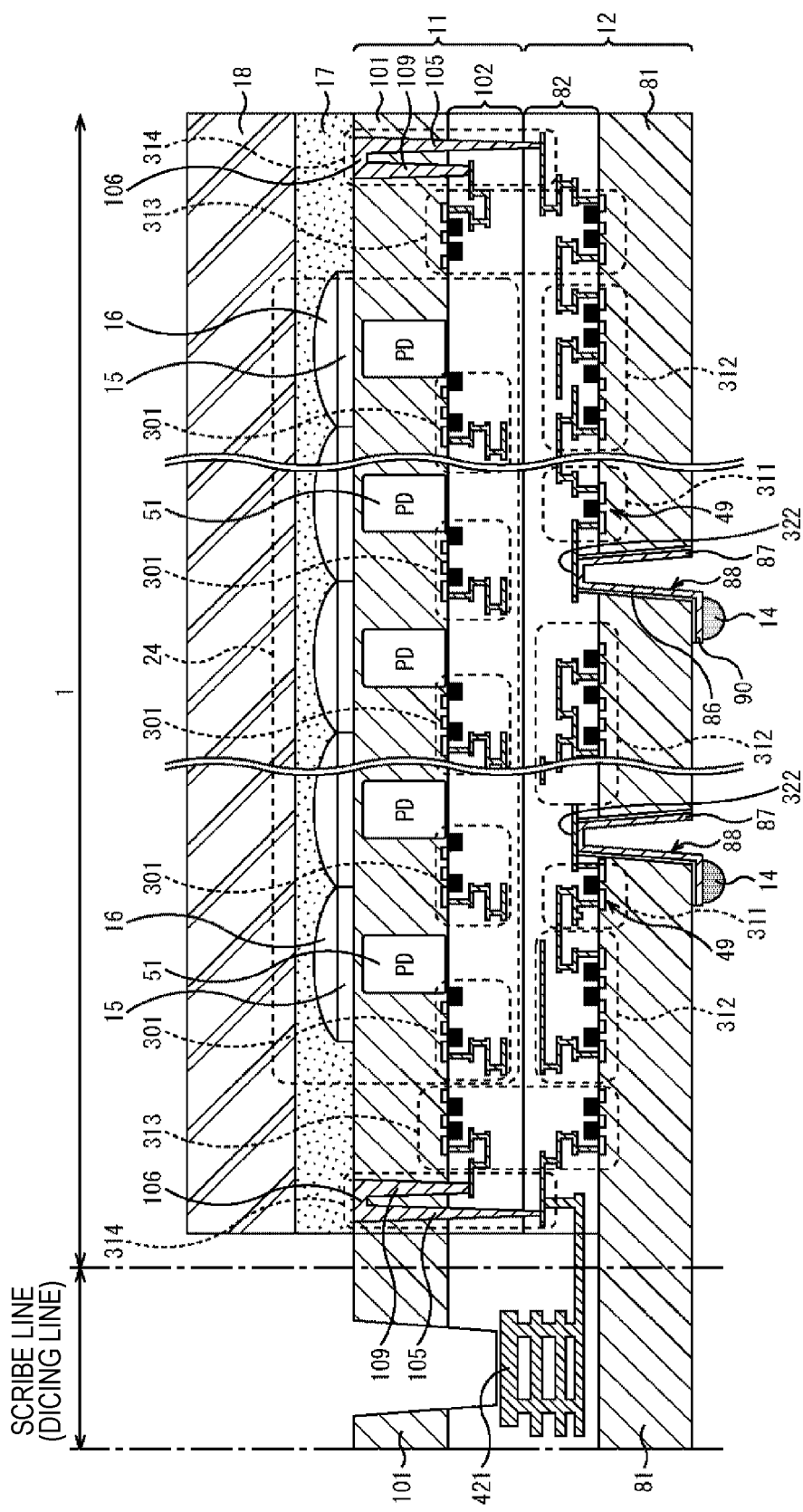
FIG. 46 is a diagram explaining further modified example 3 of the solid-state imaging apparatus.

FIG. 46 is a cross-sectional diagram of the solid-state imaging apparatus 1 according to further modified example 3.

The solid-state imaging apparatus 1 according to further modified example 3 also includes a conductive pad 421 for setting a needle for measurement for the purpose of measuring operation of the solid-state imaging apparatus 1 in a state before the solid-state imaging apparatus 1 is divided into pieces, in other words, in a state where a plurality of solid-state imaging apparatuses 1 are formed on a wafer, using, for example, typical semiconductor apparatus measuring machine which uses a set needle.

As illustrated in FIG. 46, the conductive pad 421 for measurement using a set needle is formed on a scribe line (dicing line) between the solid-state imaging apparatuses 1.

It is preferable that the conductive pad 421 for measurement using a set needle is formed before the protective substrate 18 is disposed on a surface of the solid-state imaging apparatus 1. By this means, it is possible to measure operation of the solid-state imaging apparatus 1 before the protective substrate 18 is fixed and in a state where a plurality of solid-state imaging apparatuses 1 are formed on a wafer.

The conductive pad 421 for measurement using a set needle may be formed with part of the multilayer wiring layer 102 provided in the upper structure 11 or may be formed with part of the multilayer wiring layer 82 provided in the lower structure 12, or may be formed with the same layer as part of the conductive layer used in the upper and lower wiring connection structure. The conductive pad 421 for measurement using a set needle may be connected to the inside of the solid-state imaging apparatus 1 via part of the multilayer wiring layer 102 provided in the upper structure 11 or may be connected to the inside of the solid-state imaging apparatus 1 via part of the multilayer wiring layer 82 provided in the lower structure 12.

By forming the conductive pad 421 for measurement using a set needle at the solid-state imaging apparatus 1 before the protective substrate 18 of the solid-state imaging apparatus 1 is fixed, it is possible to measure the operation of the solid-state imaging apparatus 1 using a measurement apparatus of the semiconductor apparatus using a set needle before the protective substrate 18 is formed, in a state where a plurality of solid-state imaging apparatuses 1 are formed on a wafer.

Further Modified Example 4

A further modified example of the solid-state imaging apparatus 1 will be described next with reference to FIG. 47.

Figure 47:
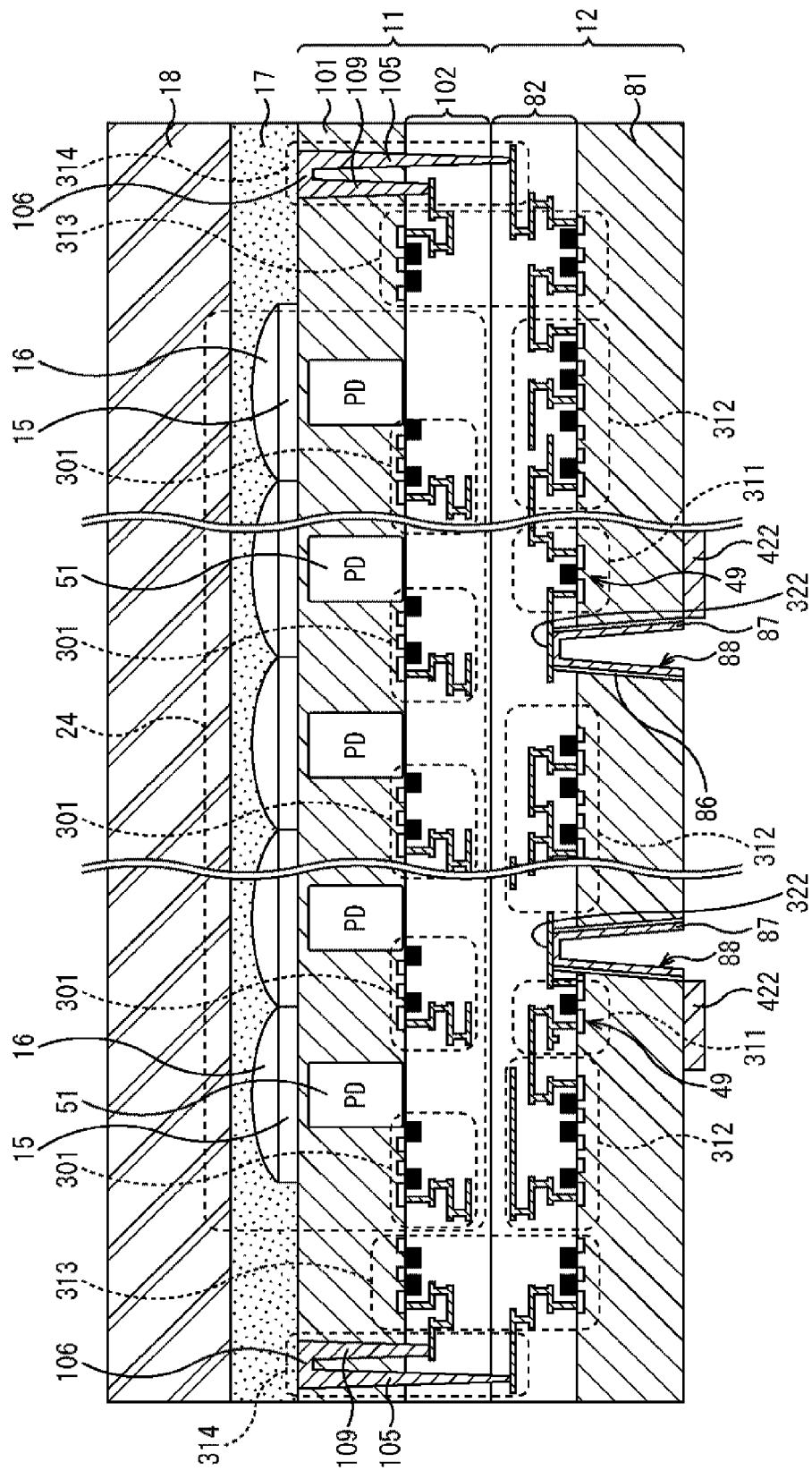
FIG. 47 is a diagram explaining further modified example 4 of the solid-state imaging apparatus.

FIG. 47 is a cross-sectional diagram of the solid-state imaging apparatus 1 according to further modified example 4.

The solid-state imaging apparatus 1 according to further modified example 3 also includes a conductive pad 421 for setting a needle for measurement for the purpose of measuring operation of the solid-state imaging apparatus 1 in a state where a plurality of solid-state imaging apparatuses 1 are formed on a wafer.

As illustrated in FIG. 47, the conductive pad 422 for measurement using a set needle is formed at the lower side of the lower structure 12 in a state where a plurality of solid-state imaging apparatuses 1 are formed on a wafer. The conductive pad 422 for measurement using a set needle may be formed with, for example, the rewiring 90 provided in the lower structure 12.

It becomes possible to measure operation of the solid-state imaging apparatus 1 by, in a state where a plurality of solid-state imaging apparatuses 1 are formed on a wafer, after disposing the protective substrate 18 on a surface of the solid-state imaging apparatus 1, inverting up and down of the wafer so that the protective substrate 18 is disposed at the lower side, and the conductive ad 422 for measurement using a set needle is disposed at the upper side. In this case, it is also possible to measure the operation of the solid-state imaging apparatus 1 using an apparatus which causes light to be incident from a lower side of the solid-state imaging apparatus 1.

13. Example of Three-Layer Laminate Structure

While, in the above-described embodiments, the laminate structure 13 of the solid-state imaging apparatus 1 includes two layers of the lower structure 12 and the upper structure 12, the laminate structure 13 may include three or more structures.

An example where the laminate structure 13 includes three layers by providing a third structure 511 between the lower structure 12 and the upper structure 11 will be described with reference to FIG. 48 and FIG. 49.

Figure 48:
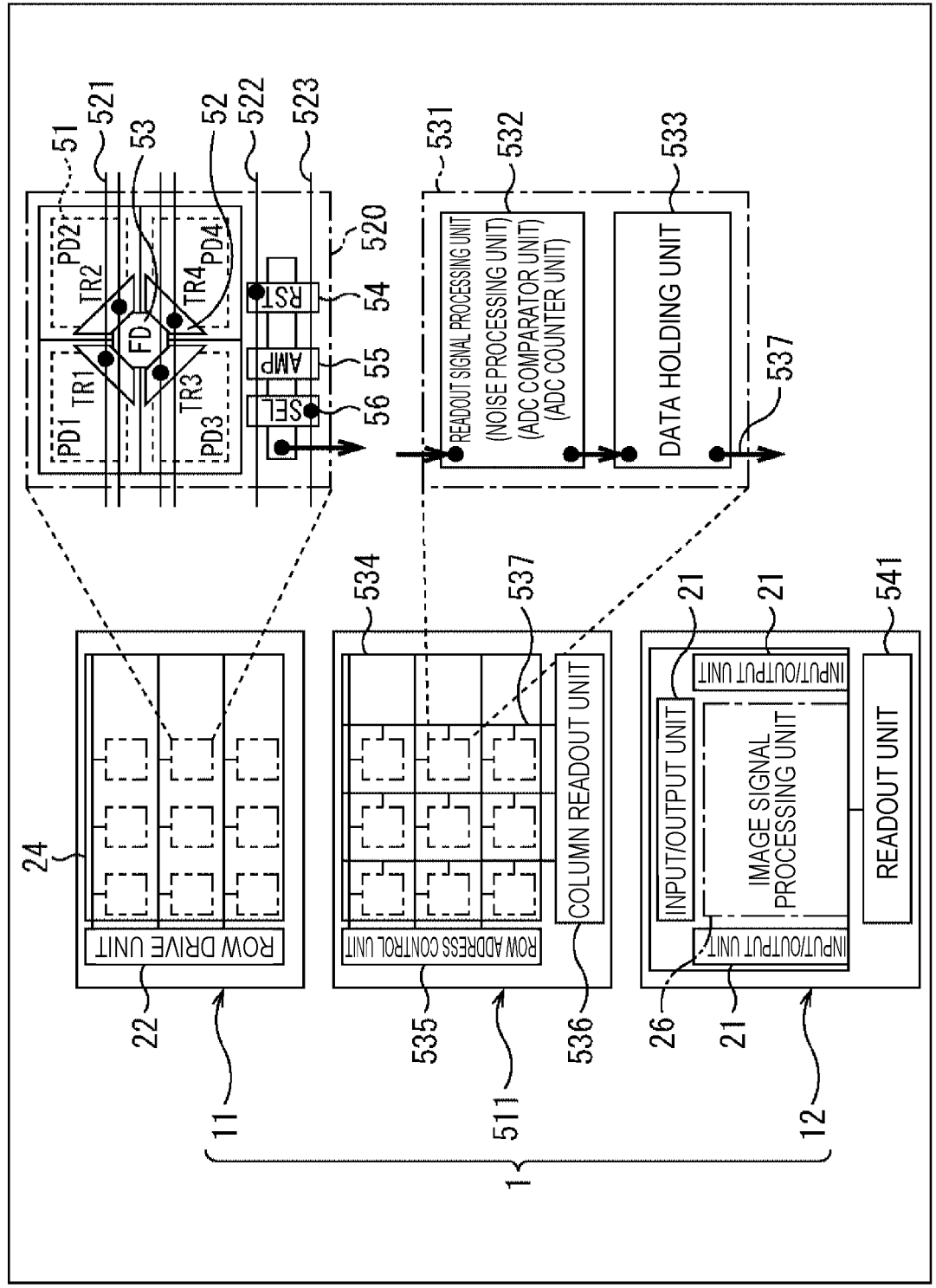
FIG. 48 is a diagram explaining an example where the solid-state imaging apparatus includes a three-layer laminate structure.

FIG. 48 illustrates a configuration in the case where the pixel array unit 24 has a pixel sharing structure.

The pixel sharing structure is a structure in which, while the photodiode (PD) 51 and the transfer transistor 52 are provided for each pixel, the FD 53, the amplifier transistor 55, the reset transistor 54 and the select transistor 56 are shared among a plurality of pixels.

FIG. 48 illustrates a structure in which the FD 53, the amplifier transistor 55, the reset transistor 54 and the select transistor 56 are shared among four pixels of two in a row direction and two in a column direction (2×2) as a sharing unit 520.

A transfer transistor drive signal line 521 extending in a row direction is connected to each of gate electrodes of the four transfer transistors 52. The four transfer transistor drive signal lines 521 respectively connected to the gate electrodes of the four transfer transistors 52 and extending in a row direction are arranged in a column direction in parallel to each other.

The FD 53 is connected to a gate electrode of the amplifier transistor 55 and a diffusion layer of the reset transistor 54 via a wiring which is not illustrated. One reset transistor drive signal line 522 extending in a row direction is connected to a gate electrode of the reset transistor 54.

One select transistor drive signal line 523 extending in a row direction is connected to a gate electrode of the select transistor 56. There is a case where the select transistor 56 is omitted.

In the system configuration example of the solid-state imaging apparatus 1 illustrated in FIG. 2, a plurality of pixels 31 are connected to the vertical signal line 33 extending in a column direction for each pixel. Each of the plurality of vertical signal lines 33 is connected to the column signal processing unit 25 disposed ahead of them, and noise processing and AD conversion processing are performed at the column signal processing unit 25.

On the other hand, the solid-state imaging apparatus 1 with the three-layer laminate structure 13 illustrated in FIG. 48 includes an area signal processing unit 531 in the third structure 511 between the lower structure 12 and the upper structure 11.

The area signal processing unit 531 includes a readout signal processing unit 532 having a noise processing unit and an ADC, and a data holding unit 533 which holds AD converted digital data.

For example, in the case where each of the pixels 31 of the sharing unit 520 outputs data expressed with 16 bits after AD conversion, the data holding unit 533 includes data holding means such as a latch and a shift register corresponding to 64 bits for holding these data.

The area signal processing unit 531 further includes an output signal wiring 537 for outputting the data held in the data holding unit 533 to the outside of the area signal processing unit 531. This output signal wiring may be, for example, a signal line of 64 bits which outputs the data of 64 bits held in the data holding unit 533 in parallel or may be a signal line of 16 bits for outputting data corresponding to four pixels held in the data holding unit 533 one pixel each time or may be a signal line of 8 bits which correspond to half of data of one pixel, or may be a signal line of 32 bits which correspond to data of two pixels. Alternatively, the output signal wiring may be a signal line of one bit which reads out the data held in the data holding unit 53 by one bit.

In the solid-state imaging apparatus 1 illustrated in FIG. 48, one sharing unit 520 of the upper structure 11 is connected to one area signal processing unit 531 of the third structure 511. In other words, the sharing unit 520 corresponds to the area signal processing unit 531 on a one-to-one basis. Therefore, as illustrated in FIG. 48, the third structure 511 includes an area signal processing unit array 534 in which a plurality of area signal processing units 531 are arranged in a row direction and in a column direction.

Further, the third structure 511 includes a row address control unit 535 which reads out the data in the data holding unit 533 provided at each of the plurality of area signal processing units 531 arranged in the row direction and in the column direction. The row address control unit 535 determines a readout position in the row direction in a similar manner to a typical semiconductor memory apparatus.

The area signal processing unit 531 arranged in the row direction of the area signal processing unit array 534 is connected to a control signal line extending in the row direction from the row address control unit 535, and operation of the area signal processing unit 531 is controlled by the row address control unit 535.

The area signal processing unit 531 arranged in the column direction of the area signal processing unit array 534 is connected to a column readout signal line 537 extending in the column direction, and the column readout signal line is connected to a column read out unit 536 disposed ahead of the area signal processing unit array 534.

The data held in the data holding unit 533 of each area signal processing unit 531 of the area signal processing unit array 534 may be read out such that the data of the data holding units 533 of all the area signal processing units 531 arranged in the row direction is read out to the column readout unit 536 at the same time or may be read out such that only data of specific area signal processing units 531 designated from the column readout unit 536 is read out.

A wiring for outputting the data read out from the area signal processing unit 531 to the outside of the third structure 511 is connected to the column readout unit 536.

The lower structure 12 includes a readout unit 541 to which a wiring from the column readout unit 536 of the third structure 511 is connected and which receives data output from the column readout unit 536.

Further, the lower structure 12 includes an image signal processing unit 26 for performing signal processing on the data received from the third structure 511.

Still further, the lower structure 12 includes an input/output unit 21 for outputting the data received from the third structure 511 via or without via the image signal processing unit 26. The input/output unit 21 may include an input/output circuit unit 42 for inputting, for example, a timing signal to be used in the pixel array unit 24 and characteristic data to be used in the image signal processing unit 26 from the outside of the solid-state imaging apparatus 1 to the inside of the apparatus, as well as the output circuit unit 47.

As illustrated in B in FIG. 49, each sharing unit 520 formed in the upper structure 11 is connected to the area signal processing unit 531 of the third structure 511 disposed immediately below the sharing unit 520. The wiring of the upper structure 11 and the wiring of the third structure 511 can be connected using, for example, the Cu-CU direct bonding structure illustrated in FIG. 8.

Further, as illustrated in B in FIG. 49, the column readout unit 536 outside the area signal processing unit array 534 formed in the third structure 511 is connected to the readout unit 541 of the lower structure 12 disposed immediately below the column readout unit 536. The wiring of the third structure 511 and the wiring of the lower structure 12 can be connected using, for example, the Cu—Cu direct bonding structure illustrated in FIG. 8 or the twin contact structure illustrated in FIG. 6.

Figure 49:
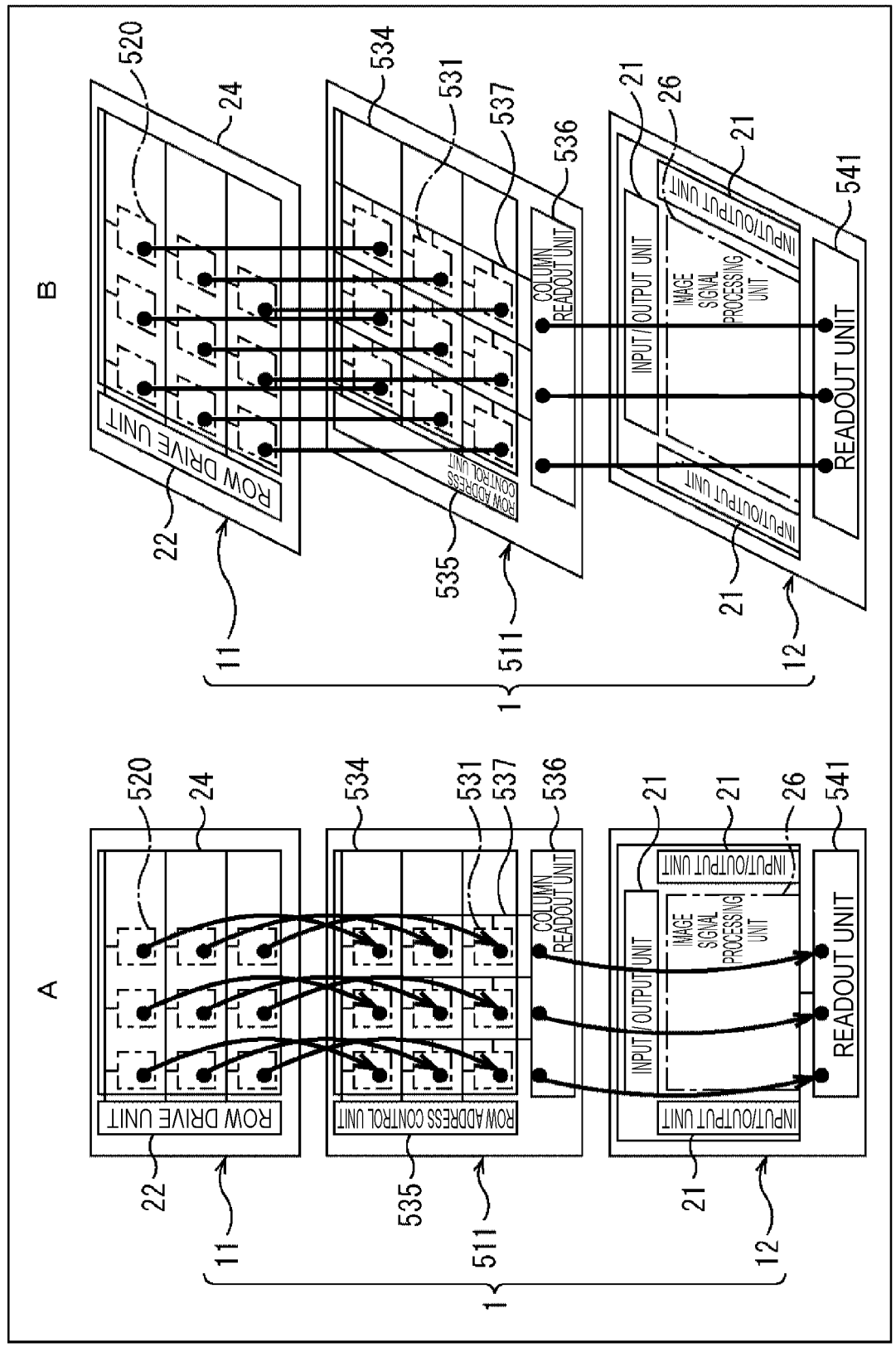
FIG. 49 is a diagram explaining an example where the solid-state imaging apparatus includes a three-layer laminate structure.

Therefore, as illustrated in A in FIG. 49, a pixel signal of each sharing unit 520 formed in the upper structure 11 is output to the corresponding area signal processing unit 531 of the third structure 511. The data held in the data holding unit 533 of the area signal processing unit 531 is output from the column readout unit 536 and supplied to the readout unit 541 of the lower structure 12. Then, in the image signal processing unit 26, various kinds of signal processing (for example, tone curve correction processing) is performed on the data, and the data is output from the input/output unit 21 to the outside of the apparatus.

Note that, in the solid-state imaging apparatus 1 formed with the three-layer laminate structure 13, the input/output unit 21 formed in the lower structure 12 may be disposed at the lower side of the row address control unit 535 of the third structure 511.

Further, in the solid-state imaging apparatus 1 formed with the three-layer laminate structure 13, the input/output unit 21 formed in the lower structure 12 may be disposed at the lower side of the area signal processing unit 531 of the third structure 511.

Still further, in the solid-state imaging apparatus 1 formed with the three-layer laminate structure 13, the input/output unit 21 formed in the lower structure 12 may be disposed at the lower side of the pixel array unit 24 of the upper structure 11.

14. Example of Application to Electronic Device

Application of the present technology is not limited to application to a solid-state imaging apparatus. That is, the present disclosure can be generally applied to an electronic device in which a solid-state imaging apparatus is used in an image capturing unit (a photoelectric converting unit), such as an imaging apparatus such as a digital still camera and a video camera, a mobile terminal apparatus having an imaging function, and a copier in which a solid-state imaging apparatus is used in an image reading unit. The solid-state imaging apparatus may be formed as one chip or may take a form of a module having an imaging function, in which an imaging unit and a signal processing unit or an optical system are collectively packaged.

Figure 50:
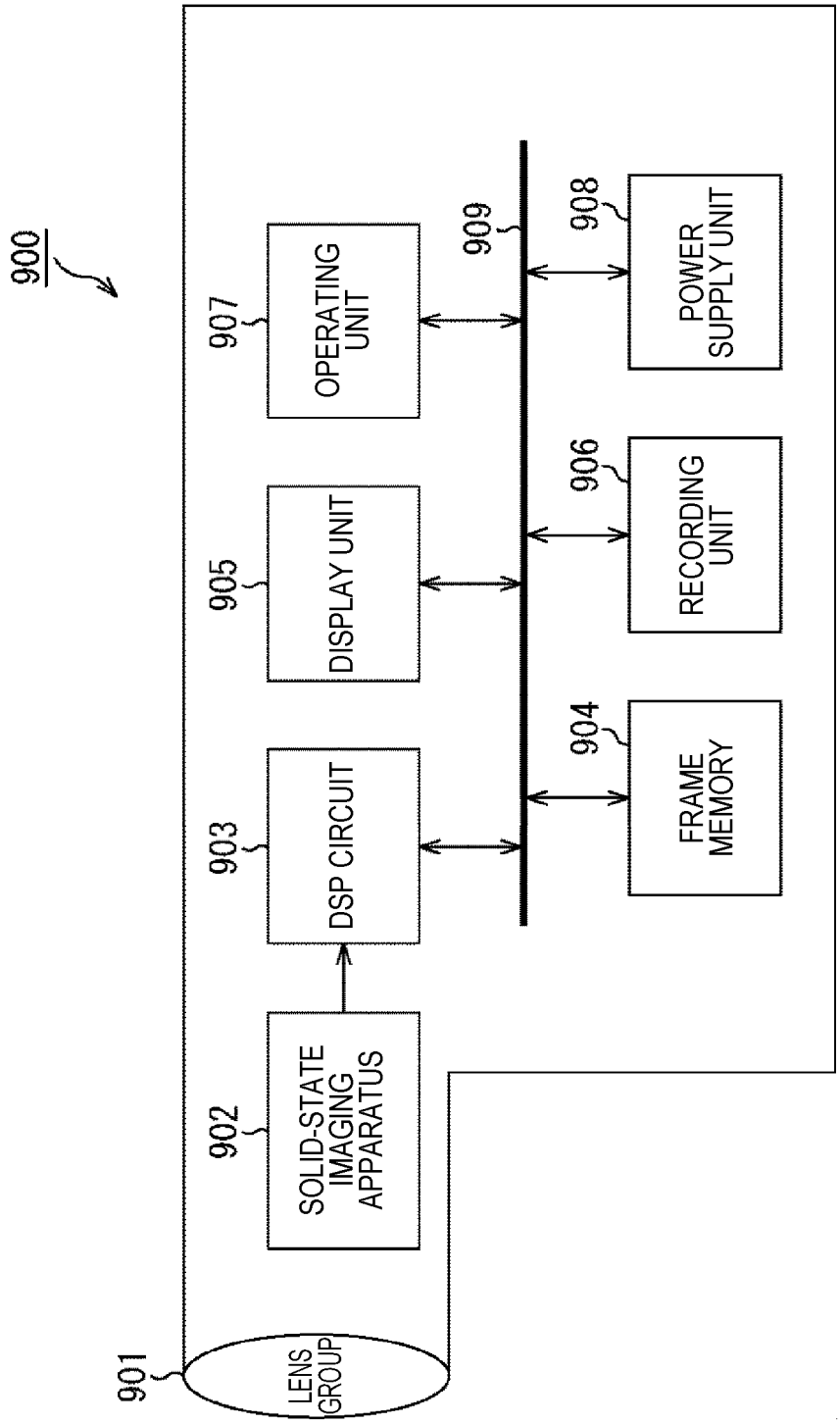
FIG. 50 is a block diagram illustrating a configuration example of an imaging apparatus as an electronic device to which the present technology is applied.

FIG. 50 is a block diagram illustrating a configuration example of an imaging apparatus as an electronic device to which the present technology is applied.

The imaging apparatus 900 in FIG. 50 includes an optical unit 901 formed with a lens group, a solid-state imaging apparatus (imaging device) 902 which employs a configuration of the solid state imaging apparatus 1 in FIG. 1 and a digital signal processor (DSP) circuit 903 which is a camera signal processing circuit. Further, the imaging apparatus 900 also includes a frame memory 904, a display unit 905, a recording unit 906, an operating unit 907 and a power supply unit 908. The DSP circuit 903, the frame memory 904, the display unit 905, the recording unit 906, the operating unit 907 and the power supply unit 908 are connected to each other via a bus line 909.

The optical unit 901 captures incident light (image light) from a subject and forms an image on an imaging face of the solid-state imaging apparatus 902. The solid-state imaging apparatus 902 converts a light amount of the incident light of the image formed on the imaging face by the optical unit 901 into an electrical signal in units of pixel and outputs the electrical signal as a pixel signal. As the solid-state imaging apparatus 902, it is possible to use the solid-state imaging apparatus 1 in FIG. 1, that is, a solid-state imaging apparatus in which a conductive pad for setting a needle for measurement is not provided at a circumferential portion for the purpose of measuring the operation of the laminate structure 13 and which is made smaller by disposing the input/output circuit unit 49 below a region of the pixel array unit 24 of the upper structure 11 or in a region below the pixel peripheral circuit region 313 of the upper structure 11.

The display unit 905, which is, for example, formed with a panel type display apparatus such as a liquid crystal panel and an organic electro luminescence (EL) panel, displays a moving image or a still image imaged at the solid-state imaging apparatus 902. The recording unit 906 records the moving image or the still image imaged at the solid-state imaging apparatus 902 in a recording medium such as a hard disk and a semiconductor memory.

The operating unit 907 issues an operation command relating to various functions of the imaging apparatus 900 under operation by a user. The power supply unit 908 supplies various kinds of power supplies which become operating power supplies of the DSP circuit 903, the frame memory 904, the display unit 905, the recording unit 906 and the operating unit 907 to these supply targets as appropriate.

As described above, by using the solid-state imaging apparatus 1 according to the above-described embodiment as the solid-state imaging apparatus 902, it is possible to make a package size of a semiconductor package smaller. Therefore, it is possible to make the apparatus smaller also in the imaging apparatus 900 such as a video camera, a digital still camera, further a camera module designed for mobile equipment such as a mobile phone.

15. Usage Example of Image Sensor

Figure 51:
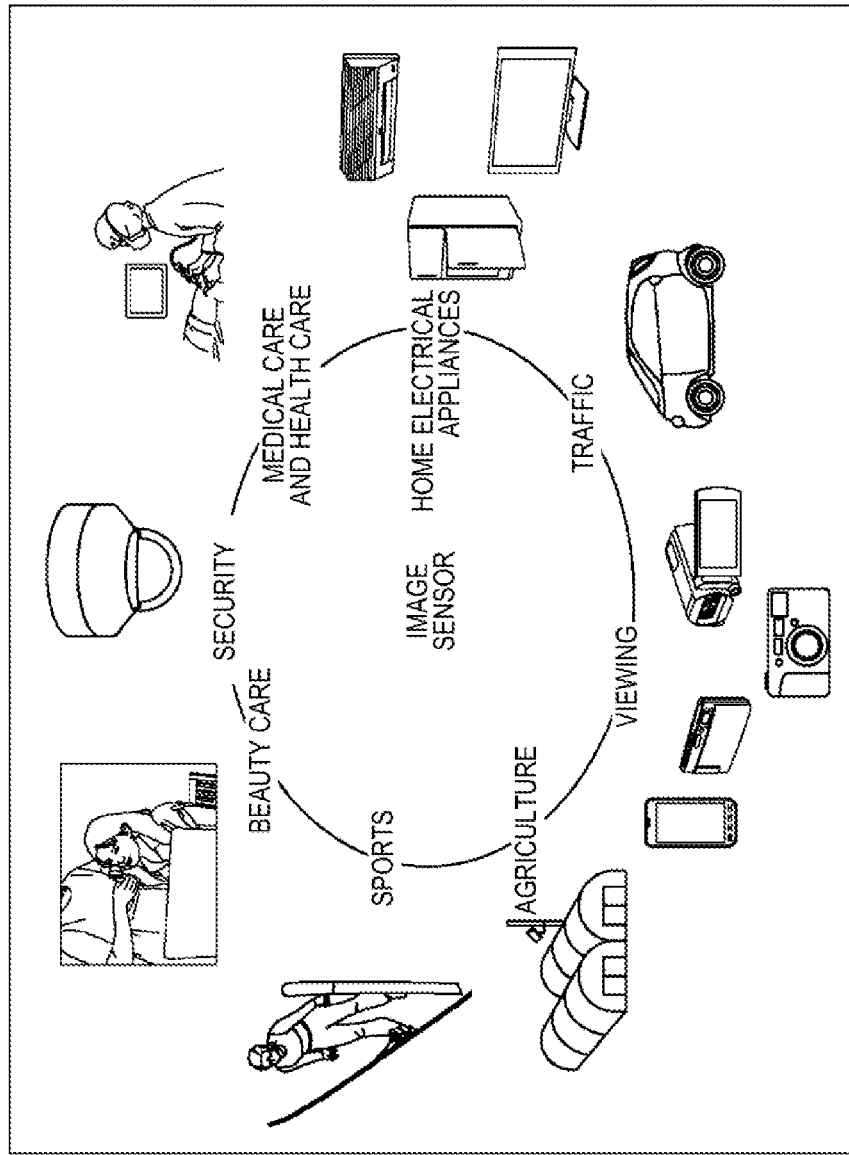
FIG. 51 is a diagram explaining a usage example of the solid-state imaging apparatus in FIG. 1.

FIG. 51 is a diagram illustrating a usage example of the above-described solid-state imaging apparatus 1.

A CMOS image sensor as the solid-state imaging apparatus 1 can be, for example, used in various cases in which light such as visible light, infrared light, ultraviolet light and X-ray is sensed as described below.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

The solid-state imaging apparatus 1 can be applied to both a device in which an electron is made a signal electric charge and a device in which a hole is made a signal electric charge.

Further, application of the present disclosure is not limited to application to a solid-state imaging apparatus which detects distribution of an incident light amount of visible light and images the distribution as an image, and the present disclosure can be generally applied to a solid-state imaging apparatus which images distribution of an incident amount of infrared light, X-ray, a particle, or the like, as an image, or, in a broad sense, a solid-state imaging apparatus (physical amount distribution detecting apparatus) such as a fingerprint detecting sensor, which detects distribution of other physical amounts such as a pressure and electrostatic capacity and images the distribution as an image.

Further, the present disclosure can be applied not only to a solid-state imaging apparatus, but can be generally applied to a semiconductor apparatus having other semiconductor integrated circuits.

The embodiments of the present disclosure are not limited to the above-described embodiments, and various changes can be made within a scope not deviating from the gist of the present disclosure.

For example, it is possible to employ an embodiment in which all or part of the above-described plurality of embodiments are combined.

Note that effects described in the present specification are merely examples, and the effects are not limited to the effects described in the present specification. There may be effects other than those described in the present specification.

Additionally, the present technology may also be configured as below.

(1)

A solid-state imaging apparatus including:
  a laminate of a first structure in which a pixel array unit in which pixels that perform photoelectric conversion are two-dimensionally arranged is formed, a glass substrate located above the first structure, and a second structure in which an input circuit unit configured to allow a predetermined signal to be input from an outside of an apparatus, an output circuit unit configured to output pixel signals output from the pixels to the outside of the apparatus, and a signal processing circuit are formed, the second structure being located below the first structure,
  in which an output unit and an input unit are disposed below the pixel array unit of the first structure, the output unit including the output circuit unit, a first through hole via which is connected to the output circuit unit and which penetrates through a semiconductor substrate constituting part of the second structure, and an external terminal for signal output which connects the output circuit unit to the outside of the apparatus via the first through hole via, the input unit including the input circuit unit, a second through hole via which is connected to the input circuit unit and which penetrates through the semiconductor substrate, and an external terminal for signal input which connects the input circuit unit to the outside of the apparatus via the second through hole via.

(2)

A solid-state imaging apparatus including:
  a laminate of a first structure in which a pixel array unit in which pixels that perform photoelectric conversion are two-dimensionally arranged is formed and a second structure in which an output circuit unit configured to output pixel signals output from the pixels to an outside of an apparatus is formed,
  in which the output circuit unit, a first through hole via which penetrates through a semiconductor substrate constituting part of the second structure, and an external terminal for signal output connected to the outside of the apparatus are disposed below the pixel array unit of the first structure, and the output circuit unit is connected to the external terminal for signal output via the first through hole via.

(3)

The solid-state imaging apparatus according to (2), in which, in the first structure, at least part of a drive unit configured to drive the pixels is formed around the pixel array unit as a pixel peripheral circuit region, and part of the plurality of output circuit units is also disposed below the pixel peripheral circuit region of the first structure, and connected to the external terminal for signal output via the first through hole via.

(4)

The solid-state imaging apparatus according to (2) or (3), in which the external terminal for signal output is a solder ball.

(5)

The solid-state imaging apparatus according to (4), in which the solder ball is formed in a planar position which overlaps with the first through hole via.

(6)

The solid-state imaging apparatus according to (4), the solder ball is electrically connected to the first through hole via via a rewiring.

(7)

The solid-state imaging apparatus according to (2) or (3), in which the external terminal for signal output is a rewiring.

(8)

The solid-state imaging apparatus according to any of (2) to (7), in which the output circuit unit is disposed to the external terminal for signal output on a one-to-one basis.

(9)

The solid-state imaging apparatus according to any of (2) to (7), in which the output circuit unit is disposed in a line.

(10)

The solid-state imaging apparatus according to any of (2) to (7), in which the output circuit unit is integrated and disposed in units of the plurality of external terminals for signal output.

(11)

The solid-state imaging apparatus according to any of (2) to (10), in which, in the second structure, an input circuit unit configured to allow a predetermined signal to be input from the outside of the apparatus is also formed, and the input circuit unit is disposed below the pixel array unit of the first structure, and connected to an external terminal for signal input connected to the outside of the apparatus via a second through hole via which penetrates through a semiconductor substrate constituting part of the second structure.

(12)

The solid-state imaging apparatus according to (11), in which, in the first structure, at least part of a drive unit configured to drive the pixels is formed around the pixel array unit as a pixel peripheral circuit region, and part of the plurality of input circuit units is also disposed below the pixel peripheral circuit region of the first structure and connected to the external terminal for signal input via the second through hole via.

(13)

The solid-state imaging apparatus according to any of (2) to (12), in which, in the second structure, a signal processing circuit region is also formed.

(14)

The solid-state imaging apparatus according to any of (2) to (13), in which the first structure and the second structure are electrically connected with a twin contact structure.

(15)

The solid-state imaging apparatus according to any of (2) to (13), in which the first structure and the second structure are electrically connected with a share contact structure.

(16)

The solid-state imaging apparatus according to any of (2) to (13), in which the first structure and the second structure are electrically connected through Cu—Cu bonding.

(17)

The solid-state imaging apparatus according to any of (2) to (16), in which a protective substrate configured to protect an on-chip lens is disposed on the on-chip lens within the pixel array unit of the first structure.

(18)

The solid-state imaging apparatus according to any of (2) to (17), in which the solid-state imaging apparatus includes a three-layer laminate structure including a third structure in which a data holding unit is formed in addition to the first structure and the second structure.

(19)

A manufacturing method of a solid-state imaging apparatus, the manufacturing method including:

pasting a first structure in which a pixel array unit in which pixels that perform photoelectric conversion are two-dimensionally arranged is formed and a second structure in which an output circuit unit configured to output pixel signals output from the pixels to an outside of an apparatus is formed below the pixel array unit, so that wiring layers face each other;

forming a through hole via which penetrates through a semiconductor substrate constituting part of the second structure; and forming an external terminal for signal output which is electrically connected to the output circuit unit via the through hole via and which is connected to the outside of the apparatus, at a position below the pixel array unit of the first structure.

(20)

An electronic device including:

a solid-state imaging apparatus including a laminate of a first structure in which a pixel array unit in which pixels that perform photoelectric conversion are two-dimensionally arranged is formed, and a second structure in which an output circuit unit configured to output pixel signals output from the pixels to an outside of an apparatus is formed, in which the output circuit unit, a through hole via which penetrates through a semiconductor substrate constituting part of the second structure, and an external terminal for signal output connected to the outside of the apparatus are disposed below the pixel array unit of the first structure, and

REFERENCE SIGNS LIST 1 solid-state imaging apparatus
11 first structure (upper structure)
12 second structure (lower structure)
13 laminate structure
14 external terminal (signal input/output terminal)
15 color filter
16 on-chip lens
17 glass seal resin
18 protective substrate
21 input/output unit
22 row drive unit
24 pixel array unit
25 column signal processing unit
26 image signal processing unit
31 pixel
41 input terminal
42 input circuit unit
47 output circuit unit
48 output terminal
49 input/output circuit unit
51 photodiode
81 semiconductor substrate
88 through hole electrode via
90 rewiring
101 semiconductor substrate
105 through chip via
106 connection wiring
109 through silicon via
311 input/output circuit region
312 signal processing circuit region
313 pixel peripheral circuit region
314 upper and lower substrate connection region
321 I/O circuit
511 third structure
351 memory substrate
352 memory circuit
400 imaging apparatus
402 solid-state imaging apparatus
531 area signal processing unit
533 data holding unit
900 imaging apparatus
902 solid-state imaging apparatus

The invention claimed is:

1. A solid-state imaging apparatus, comprising:
a first substrate including a pixel layer and a first wiring layer electrically connected to one another, the pixel layer including a pixel array unit with pixels for performing photoelectric conversion, wherein the first substrate includes a first bonding layer;
a second substrate including a second wiring layer including at least one output circuit to output pixel signals from the pixels and a second bonding layer; and
a first terminal to electrically connect the at least one output circuit to an external device,
wherein the first terminal is external to the second substrate and provided off-centered with respect to a central opening portion of a through hole via electrically connected to the at least one output circuit,
wherein the at least one output circuit is provided lateral to and nonoverlapping with the through hole via,
wherein the through hole via penetrates the second wiring layer and penetrates through a surface of the second substrate opposite to the second wiring layer,
wherein, in the first substrate, at least part of a drive unit to drive the pixels is formed around the pixel array unit as a pixel peripheral circuit region in a cross-sectional view, and
wherein the at least one output circuit is a plurality of output circuits.

2. The solid-state imaging apparatus according to claim 1, wherein each of the plurality of output circuits has a corresponding first terminal electrically connected thereto.

3. The solid-state imaging apparatus according to claim 1, wherein the at least one output circuit is disposed in a line.

4. The solid-state imaging apparatus according to claim 1, wherein the at least one output circuit is integrated with the first terminal for signal output.

5. The solid-state imaging apparatus according to claim 1, wherein the second wiring layer includes at least one input circuit to receive a predetermined signal from the external device, and
wherein the at least one input circuit is electrically connected to a second terminal.

6. The solid-state imaging apparatus according to claim 1, wherein part of a plurality of input circuits is disposed on a side of the pixel peripheral circuit region furthest from a light-incident side of the first substrate.

7. The solid-state imaging apparatus according to claim 1, wherein the second substrate includes a signal processing circuit region.

8. The solid-state imaging apparatus according to claim 1, wherein the at least one output circuit is provided for a group of first terminals.

9. The solid-state imaging apparatus according to claim 1, wherein the at least one output circuit is provided around one side of the second substrate.

10. The solid-state imaging apparatus according to claim 1, wherein the at least one output circuit is provided around more than one side of the second substrate.

11. An electronic device, comprising:
an optical system;
a solid-state imaging apparatus that receives light from the optical system, the solid-state imaging apparatus including:
a first substrate including a pixel layer and a first wiring layer electrically connected to one another, the pixel layer including a pixel array unit with pixels for performing photoelectric conversion, wherein the first substrate includes a first bonding layer;
a second substrate including a second wiring layer including at least one output circuit to output pixel signals from the pixels and a second bonding layer; and
a first terminal to electrically connect the at least one output circuit to an external device,
wherein the first terminal is external to the second substrate and provided off-centered with respect to a central opening portion of a through hole via electrically connected to the at least one output circuit,
wherein the at least one output circuit is provided lateral to and nonoverlapping with the through hole via,
wherein the through hole via penetrates the second wiring layer and penetrates through a surface of the second substrate opposite to the second wiring layer, the output circuit unit is connected to the external terminal for signal output via the through hole via.

wherein, in the first substrate, at least part of a drive unit to drive the pixels is formed around the pixel array unit as a pixel peripheral circuit region in a cross-sectional view, and wherein the at least one output circuit is a plurality of output circuits; and a digital signal processor that processes signals received from the solid-state imaging apparatus.

12. The electronic device according to claim 11, wherein each of the plurality of output circuits has a corresponding first terminal electrically connected thereto.

13. The electronic device according to claim 11, wherein the at least one output circuit is disposed in a line.

14. The electronic device according to claim 11, wherein the at least one output circuit is integrated with the first terminal for signal output.

15. The electronic device according to claim 11,
wherein the second wiring layer includes at least one input circuit to receive a predetermined signal from the external device, and wherein the at least one input circuit is electrically connected to a second terminal.

16. The electronic device according to claim 11, wherein part of a plurality of input circuits is disposed on a side of the pixel peripheral circuit region furthest from a light-incident side of the first substrate.

17. The electronic device according to claim 11, wherein the second substrate includes a signal processing circuit region.

18. The electronic device according to claim 11, wherein the at least one output circuit is provided for a group of first terminals.

19. The electronic device according to claim 11, wherein the at least one output circuit is provided around one side of the second substrate.

20. A manufacturing method of a solid-state imaging apparatus, the manufacturing method comprising:

bonding a first structure to a second structure, the first structure including a pixel array unit in which pixels that perform photoelectric conversion are two-dimensionally arranged, the second structure including an output circuit formed around the pixel array unit as a pixel peripheral circuit region in a cross-sectional view to output pixel signals from the pixels to an external device; and forming a terminal external to the second structure and provided off-centered with respect to a central opening portion of a through hole via that is electrically connected to the output circuit, the terminal being connectable to the external device and the output circuit is provided lateral to and nonoverlapping with the through hole via, wherein the through hole via penetrates a first surface and a second surface of the second structure.

* * * * *